US009612538B2

(12) United States Patent
Sato

(10) Patent No.: US 9,612,538 B2
(45) Date of Patent: Apr. 4, 2017

(54) EXPOSURE APPARATUS, EXPOSURE METHOD, AND DEVICE MANUFACTURING METHOD

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 158 days.

(21) Appl. No.: 14/518,395

(22) Filed: Oct. 20, 2014

(65) Prior Publication Data

US 2015/0036112 A1 Feb. 5, 2015

Related U.S. Application Data

(62) Division of application No. 12/644,703, filed on Dec. 22, 2009, now Pat. No. 8,896,806.

(Continued)

(51) Int. Cl.
*G03B 27/52* (2006.01)
*G03F 7/20* (2006.01)

(52) U.S. Cl.
CPC ...... *G03F 7/70341* (2013.01); *G03F 7/70916* (2013.01)

(58) Field of Classification Search
CPC .. G03F 7/70341; G03F 7/70716; G03F 7/707; G03F 7/70858; G03F 7/70925;

(Continued)

(56) References Cited

U.S. PATENT DOCUMENTS 6,208,407 B1 3/2001 Loopstra
6,262,796 B1 7/2001 Loopstra et al.
(Continued)

FOREIGN PATENT DOCUMENTS

EP 1 498 778 A1 1/2005
EP 1 528 433 A2 5/2005
(Continued)

OTHER PUBLICATIONS

May 1, 2016 Office Action issued in Korean Patent Application No. 10-2011-7017645.
(Continued)

*Primary Examiner* — Mesfin Asfaw
(74) *Attorney, Agent, or Firm* — Oliff PLC

(57) ABSTRACT

An exposure apparatus that exposes a substrate includes: an optical system that includes an emission surface from which an exposure light is emitted; a first surface that is disposed in at least a part of a surrounding of an optical path of the exposure light emitted from the emission surface; a second surface that is disposed in at least a part of a surrounding of the first surface and at a position lower than the first surface; a space portion into which a liquid can flow via a first aperture between the first surface and the second surface and which is opened to the atmosphere via a second aperture different from the first aperture; and a first recovery portion that recovers at least a part of the liquid flowing into the space portion. Here, the emission surface, the first surface, and the second surface are opposed to the surface of the substrate in at least a part of the exposure of the substrate, and the substrate is exposed with the exposure light from the emission surface via the liquid between the emission surface and the surface of the substrate.

43 Claims, 28 Drawing Sheets

Related U.S. Application Data

(60) Provisional application No. 61/193,836, filed on Dec. 29, 2008, provisional application No. 61/193,835, filed on Dec. 29, 2008, provisional application No. 61/193,834, filed on Dec. 29, 2008, provisional application No. 61/193,833, filed on Dec. 29, 2008.

(58) Field of Classification Search
CPC .... G03F 7/70325; G03F 7/70958; G03F 7/20; G03F 7/70416; G03F 7/70433; B29C 67/0055; B32B 2307/73; G03D 3/00; H01L 21/6715
See application file for complete search history.

(56) References Cited

U.S. PATENT DOCUMENTS

| | | | |
|---|---|---|---|
| 6,341,007 B1 | 1/2002 | Nishi et al. |
| 6,452,292 B1 | 9/2002 | Binnard |
| 6,611,316 B2 | 8/2003 | Sewell |
| 6,778,257 B2 | 8/2004 | Bleeker et al. |
| 6,897,963 B1 | 5/2005 | Taniguchi et al. |
| 7,023,610 B2 | 4/2006 | Ohtsuki et al. |
| 7,292,313 B2 | 11/2007 | Poon et al. |
| 7,508,490 B2 | 3/2009 | Nagasaka et al. |
| 2004/0207824 A1 | 10/2004 | Lof et al. |
| 2005/0018155 A1 | 1/2005 | Cox et al. |
| 2005/0263068 A1 | 12/2005 | Hoogendam et al. |
| 2006/0038968 A1 | 2/2006 | Kemper et al. |
| 2006/0158627 A1 | 7/2006 | Kemper et al. |
| 2006/0221315 A1 | 10/2006 | Beckers et al. |
| 2006/0250593 A1 | 11/2006 | Nishii |
| 2007/0081140 A1 | 4/2007 | Beckers et al. |
| 2007/0127006 A1 | 6/2007 | Shibazaki |
| 2007/0146663 A1 | 6/2007 | Nagasaka |
| 2007/0177125 A1 | 8/2007 | Shibazaki |
| 2007/0216889 A1 | 9/2007 | Nishii |
| 2007/0242243 A1 | 10/2007 | Kemper et al. |
| 2008/0013064 A1 | 1/2008 | Nishii |
| 2008/0018866 A1 | 1/2008 | Nagasaka et al. |
| 2008/0106707 A1 | 5/2008 | Kobayashi et al. |
| 2008/0174748 A1 | 7/2008 | Nagasaka |
| 2008/0212046 A1 | 9/2008 | Riepen et al. |
| 2008/0233512 A1 | 9/2008 | Nishii et al. |
| 2008/0284991 A1 | 11/2008 | Nishii |
| 2009/0122282 A1 | 5/2009 | Nishii |
| 2009/0280436 A1 | 11/2009 | Nishii |

FOREIGN PATENT DOCUMENTS

| | | |
|---|---|---|
| EP | 2 267 536 A1 | 12/2010 |
| EP | 2 267 537 A1 | 12/2010 |
| JP | A-2005-167211 | 6/2005 |
| JP | A-2007-184336 | 7/2007 |
| JP | A-2007-294947 | 11/2007 |
| JP | A-2008-182241 | 8/2008 |
| JP | A-2008-244477 | 10/2008 |
| KR | 10-2005-0040764 | 5/2005 |
| WO | WO 01/35168 A1 | 5/2001 |
| WO | WO 2004/019128 A2 | 3/2004 |

OTHER PUBLICATIONS

Dec. 21, 2012 Office Action issued in U.S. Appl. No. 12/644,703.
Oct. 25, 2013 Office Action issued in U.S. Appl. No. 12/644,703.
May 4, 2010 International Search Report issued in in International Application No. PCT/2009/071914.
May 4, 2010 Written Opinion of the International Searching Authority issued in International Application No. PCT/2009/071914.
Jun. 11, 2013 Office Action issued in Japanese Application No. 2011-527532 (with English translation).
Jul. 15, 2014 Office Action issued in Japanese Application No. 2013-230683 (with English translation).
May 23, 2014 Office Action issued in Taiwanese Application No. 098145223 (with English translation).

EXPOSURE APPARATUS, EXPOSURE METHOD, AND DEVICE MANUFACTURING METHOD

CROSS-REFERENCE TO RELATED APPLICATION

This application is a divisional application of non-provisional application Ser. No. 12/644,703 filed Dec. 22, 2009, which claims priority to and the benefit of U.S. provisional Application Nos. 61/193,833, 61/193,834, 61/193,835, and 61/193,836, filed Dec. 29, 2008, the contents of which are incorporated herein by reference.

BACKGROUND

Field of the Invention

The present invention relates to an exposure apparatus, an exposure method, and a device manufacturing method.

Description of Related Art

In the processes of manufacturing a micro device such as a semiconductor device and an electronic device, an immersion exposure apparatus exposing a substrate with an exposure light from a projection optical system via a liquid between the projection optical system and the substrate is known, examples of which are disclosed in U.S. Patent Application Publication Nos. 2006/0221315, 2007/0081140, and 2008/0174748.

SUMMARY

In an immersion exposure apparatus, a member coming in contact with a liquid may be contaminated. For example, when a foreign material is attached to the member, defects are caused in a pattern formed on the substrate, thereby causing an exposure failure. As a result, a defective device may be manufactured.

In the immersion exposure apparatus, for example, when the substrate is moved at a high speed, it may be difficult to hold the liquid between the projection optical system and the substrate. When the substrate is moved at a high speed, the liquid may leak or the liquid (such as a film or droplets) may remain on the substrate. As a result, defects may be caused in a pattern formed on the substrate, thereby causing an exposure failure or a defective device.

A purpose of some aspects of the invention is to provide an exposure apparatus and an exposure method which can suppress an exposure failure from occurring. Another purpose of some aspects of the invention is to provide a device manufacturing method which can suppress a defective device from being manufactured.

According to a first aspect of the invention, there is provided an exposure apparatus that exposes a substrate, including: an optical system that includes an emission surface emitting an exposure light; a first surface that is disposed in at least a part of a surrounding of an optical path of the exposure light emitted from the emission surface; a second surface that is disposed in at least a part of a surrounding of the first surface and at a position lower than the first surface; a space portion into which a liquid can flow via a first aperture between the first surface and the second surface and which is opened to the atmosphere via a second aperture different from the first aperture; and a first recovery portion that recovers at least a part of the liquid flowing into the space portion. Here, the emission surface, the first surface, and the second surface are opposed to the surface of the substrate in at least a part of the exposure of the substrate, and the substrate is exposed with the exposure light from the emission surface via the liquid between the emission surface and the surface of the substrate.

According to a second aspect of the invention, there is provided an exposure apparatus that exposes a substrate, including: an optical system that includes an emission surface from which an exposure light is emitted; a first surface that is disposed in at least a part of a surrounding of an optical path of the exposure light emitted from the emission surface; a second surface that is disposed in at least a part of a surrounding of the first surface; a space portion into which a liquid can flow via a first aperture between the first surface and the second surface and which is opened to the atmosphere via a second aperture different from the first aperture; a top end portion that defines a top end of the space portion; and a first recovery portion of which at least a part is disposed outside the top end portion in a radial direction about an optical axis of the optical system and which recovers at least a part of the liquid flowing into the space portion. Here, the emission surface, the first surface, and the second surface are opposed to the surface of the substrate in at least a part of the exposure of the substrate, and the substrate is exposed with the exposure light from the emission surface via the liquid between the emission surface and the surface of the substrate.

According to a third aspect of the invention, there is provided an exposure apparatus that exposes a substrate, including: an optical system that includes an emission surface from which an exposure light is emitted; a space portion into which a liquid can flow via a first aperture disposed in at least a part of a surrounding of an optical path of the exposure light and which is opened to the atmosphere via a second aperture different from the first aperture; and a first recovery portion that recovers the liquid from the space portion. Here, the first recovery portion includes a reservoir portion collecting the liquid from the space portion so as not to return to the space portion, at least a part of the liquid on the substrate is collected in the reservoir portion via the space portion from the first aperture in at least a part of the exposure of the substrate, and the substrate is exposed with the exposure light from the emission surface via the liquid between the emission surface and the surface of the substrate.

According to a fourth aspect of the invention, there is provided a device manufacturing method including: exposing a substrate using the exposure apparatus according to any one of the first to third aspects; and developing the exposed substrate.

According to a fifth aspect of the invention, there is provided an exposure method including: opposing a first surface disposed in at least a part of a surrounding of an optical path of an exposure light emitted from an emission surface of an optical system to a substrate with a first gap interposed therebetween and holding a liquid between the first surface and the substrate; opposing a second surface disposed in at least a part of a surrounding of the first surface to the substrate with a second gap smaller than the first gap; recovering at least a part of the liquid flowing into a space portion, which is opened to the atmosphere via a second aperture different from a first aperture, from the first aperture between the first surface and the second surface; and exposing the substrate with the exposure light from the emission surface via the liquid between the emission surface and the substrate.

According to a sixth aspect of the invention, there is provided an exposure method including: opposing a first surface disposed in at least a part of a surrounding of an optical path of an exposure light emitted from an emission surface of an optical system to a substrate with a first gap interposed therebetween and holding a liquid between the first surface and the substrate; opposing a second surface disposed in at least a part of a surrounding of the first surface to the substrate; recovering at least a part of the liquid flowing into a space portion, which is opened to the atmosphere via a second aperture different from a first aperture, from the first aperture between the first surface and the second surface outside a top end of the space portion in the radial direction about the optical axis of the optical system; and exposing the substrate with the exposure light from the emission surface via the liquid between the emission surface and the substrate.

According to a seventh aspect of the invention, there is provided an exposure method including: filling an optical path of an exposure light between an emission surface of an optical system and a substrate with a liquid; exposing the substrate with the exposure light from the emission surface via the liquid between the emission surface and the substrate; and recovering at least a part of the liquid on the substrate from a first aperture disposed in at least a part of a surrounding of the optical path via a space portion opened to the atmosphere via a second aperture different from the first aperture. Here, the recovering of at least a part of the liquid includes collecting the liquid from the space portion in a reservoir portion so that the recovered liquid does not return to the space portion.

According to an eighth aspect of the invention, there is provided a device manufacturing method including: exposing a substrate using the exposure method according to any one of the fifth to seventh aspects; and developing the exposed substrate.

According to a ninth aspect of the invention, there is provided an exposure apparatus that exposes a substrate, including: an optical system that includes an emission surface from which an exposure light is emitted; a first surface disposed in at least a part of a surrounding of an optical path of the exposure light emitted from the emission surface; a first recess portion that is disposed in at least a part of a surrounding of the first surface; and a first gas supply port that is disposed in the inner surface defining the first recess portion so as to supply a gas. Here, the surface of the substrate is opposed to the emission surface, the first surface, and the first recess portion in at least a part of the exposure of the substrate, and the substrate is exposed with the exposure light from the emission surface via the liquid between the emission surface and the surface of the substrate.

According to a tenth aspect of the invention, there is provided a device manufacturing method including: exposing a substrate using the exposure apparatus according to the first aspect; and developing the exposed substrate.

According to an eleventh aspect of the invention, there is provided an exposure method including: causing a substrate to move so that an emission surface of an optical system and a first surface disposed in at least a part of a surrounding of an optical path of an exposure light emitted from the emission surface of the optical system are opposed to the substrate; supplying a gas from a first gas supply port disposed in an inner surface defining a first recess portion disposed in at least a part of a surrounding of the first surface to increase a pressure of the first recess portion; and exposing the substrate with the exposure light from the emission surface via a liquid between the emission surface and the substrate.

According to a twelfth aspect of the invention, there is provided a device manufacturing method including: exposing a substrate using the exposure method according to the eleventh aspect; and developing the exposed substrate.

According to a thirteenth aspect of the invention, there is provided an exposure apparatus that exposes a substrate, including: an optical system that includes an emission surface emitting an exposure light; a first surface that is disposed in at least a part of a surrounding of an optical path of the exposure light emitted from the emission surface; a supply port which is disposed in at least a part of a surrounding of the first surface so as to face a space which the first surface faces and which supplies a liquid to the space so as to fill the optical path with the liquid; and a recovery portion that recovers at least a part of the liquid being supplied from the supply port and flowing via a first aperture into a space portion which a side surface of the optical system extending to the upside from the edge of the emission surface and/or in a radial direction about an optical axis of the optical system faces. Here, the surface of the substrate disposed below the emission surface is opposed to the emission surface and the first surface in at least a part of the exposure of the substrate, and the substrate is exposed with the exposure light from the emission surface via the liquid between the emission surface and the surface of the substrate.

According to a fourteenth aspect of the invention, there is provided a device manufacturing method including: exposing a substrate using the exposure apparatus according to the first aspect; and developing the exposed substrate.

According to a fifteenth aspect of the invention, there is provided an exposure method including: causing a substrate to move so that an emission surface of an optical system and a first surface disposed in at least a part of a surrounding of an optical path of an exposure light emitted from the emission surface of the optical system are opposed to the substrate; supplying a liquid to a space between the first surface and the substrate from a supply port disposed in at least a part of a surrounding of the first surface to face the space and filling the optical path between the emission surface and the substrate with the liquid; recovering at least a part of the liquid being supplied from the supply port and flowing into a space portion which a side surface of the optical system extending to the upside from the edge of the emission surface and/or in a radial direction about an optical axis of the optical system faces; and exposing the substrate with the exposure light from the emission surface via the liquid between the emission surface and the surface of the substrate.

According to a sixteenth aspect of the invention, there is provided a device manufacturing method including: exposing a substrate using the exposure method according to the fifteenth aspect; and developing the exposed substrate.

According to a seventeenth aspect of the invention, there is provided an exposure apparatus that exposes a substrate, including: an optical system that includes an emission surface from which an exposure light is emitted; a first surface that is disposed in at least a part of a surrounding of an optical path of the exposure light emitted from the emission surface; a second surface that is disposed in at least a part of a surrounding of the first surface; a first space portion which a side surface of the optical system extending to the upside from the edge of the emission surface and/or in a radial direction about the optical axis of the optical system faces; a second space portion into which a liquid can flow from a first aperture disposed between the first surface and the second surface and which is opened to the atmosphere via a second aperture different from the first aperture; and a recovery portion of which at least a part is disposed at a position opposed to the side surface of the optical system and which recovers at least a part of the liquid flowing into the second space portion from the first aperture via the second aperture. Here, the surface of the substrate is opposed to the emission surface, the first surface, and the second surface in at least a part of the exposure of the substrate, and the substrate is exposed with the exposure light from the emission surface via the liquid between the emission surface and the surface of the substrate.

According to an eighteenth aspect of the invention, there is provided an exposure apparatus that exposes a substrate, including: an optical system that includes an emission surface emitting an exposure light; a first surface that is disposed in at least a part of a surrounding of an optical path of the exposure light emitted from the emission surface; a second surface that is disposed in at least a part of a surrounding of the first surface; a first space portion which a side surface of the optical system extending to the upside from the edge of the emission surface and/or in a radial direction about an optical axis of the optical system faces and which is opened to the atmosphere; a second space portion into which a liquid can flow from a first aperture disposed between the first surface and the second surface; and a recovery portion that recovers at least a part of the liquid flowing into the second space portion from the first aperture via the second aperture facing the first space portion. Here, the surface of the substrate is opposed to the emission surface, the first surface, and the second surface in at least a part of the exposure of the substrate, and the substrate is exposed with the exposure light from the emission surface via the liquid between the emission surface and the surface of the substrate.

According to a nineteenth aspect of the invention, there is provided a device manufacturing method including: exposing a substrate using the exposure apparatus according to any one of the seventeenth aspect and the eighteenth aspect; and developing the exposed substrate.

According to a twentieth aspect of the invention, there is provided an exposure method including: causing a substrate to move so that an emission surface of an optical system and a first surface disposed in at least a part of a surrounding of an optical path of an exposure light emitted from the emission surface of the optical system are opposed to the substrate; exposing the substrate with the exposure light from the emission surface via a liquid between the emission surface and the surface of the substrate; and recovering at least a part of the liquid flowing into a space portion, which is opened to the atmosphere via a second aperture different from a first aperture, from the first aperture between the first surface and a second surface disposed in at least a part of a surrounding of the first surface via the second aperture by the use of a recovery portion which a side surface of the optical system extending to the upside from the edge of the emission surface and/or in a radial direction about an optical axis of the optical system faces.

According to a twenty-first aspect of the invention, there is provided an exposure method including: causing a substrate to move so that an emission surface of an optical system and a first surface disposed in at least a part of a surrounding of an optical path of an exposure light emitted from the emission surface of the optical system are opposed to the substrate; exposing the substrate with the exposure light from the emission surface via a liquid between the emission surface and the surface of the substrate; and recovering at least a part of the liquid flowing into a second space portion, which is opened to the atmosphere via a second aperture different from a first aperture, from the first aperture between the first surface and a second surface disposed in at least a part of a surrounding of the first surface via the second aperture facing a first space portion which a side surface of the optical system extending to the upside from the edge of the emission surface and/or in a radial direction about an optical axis of the optical system faces.

According to a twenty-second aspect of the invention, there is provided a device manufacturing method including: exposing a substrate using the exposure method according to any one of the twentieth aspect and the twenty-first aspect; and developing the exposed substrate.

According to the above-mentioned aspects of the invention, it is possible to suppress an exposure failure from occurring. According to the aspects of the invention, it is possible to suppress a defective device from being manufactured.

DESCRIPTION OF EMBODIMENTS

Hereinafter, embodiments of the invention will be described with reference to the accompanying drawings, but the invention is not limited to the embodiments. In the following description, an XYZ orthogonal coordinate system is established and positional relations of the elements are described on the basis of the XYZ orthogonal coordinate system. It is assumed that a predetermined direction in a horizontal plane is an X axis direction, a direction perpendicular to the X axis direction in the horizontal plane is a Y axis direction, and a direction (that is, a vertical direction) perpendicular to the X axis direction and the Y axis direction is a Z axis direction. It is also assumed that rotational (tilting) directions about the X, Y, and Z axes are $\theta X$, $\theta Y$, and $\theta Z$ directions, respectively.

First Embodiment

Figure 1:
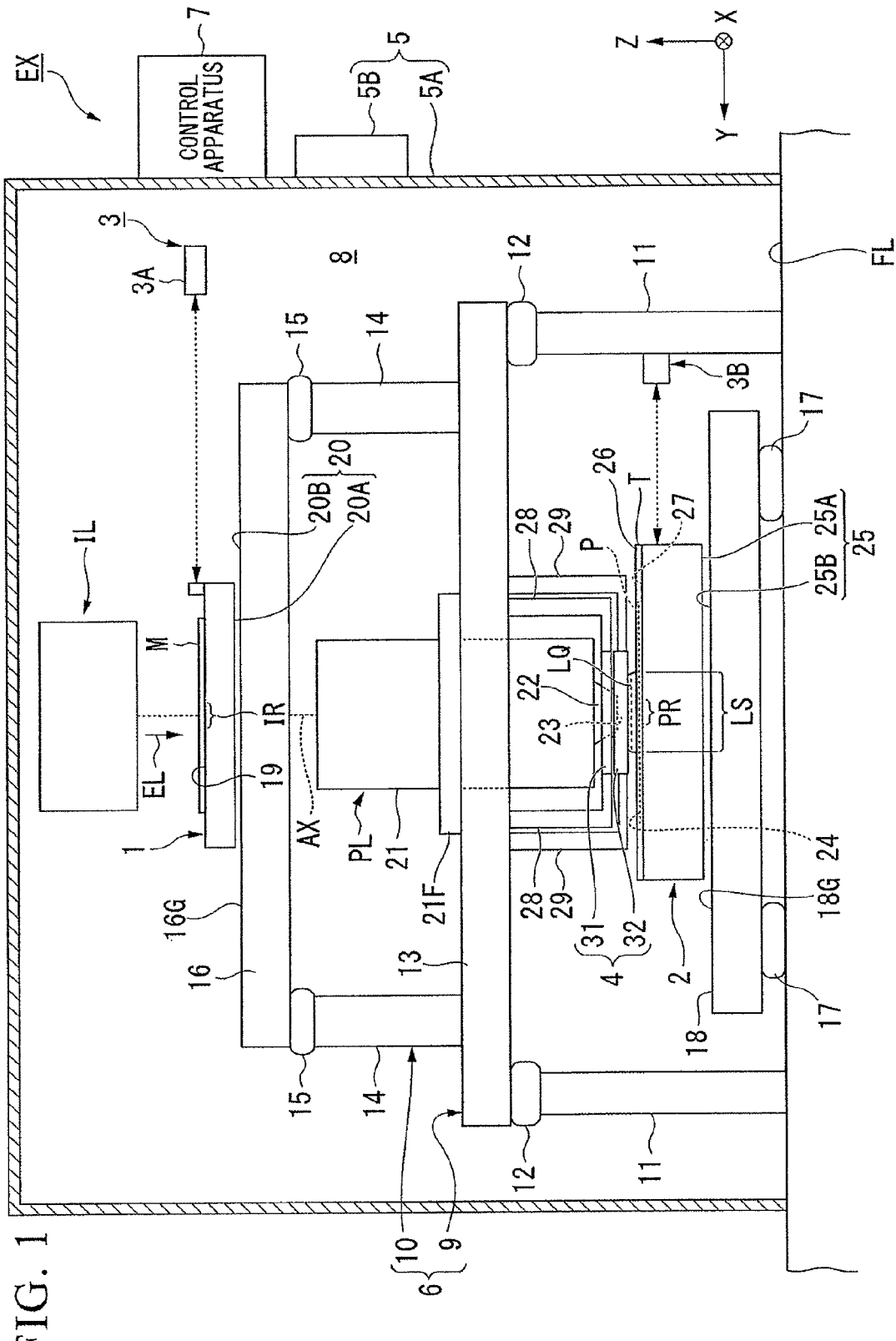
FIG. 1 is a diagram schematically illustrating a configuration of an exposure apparatus according to a first embodiment of the invention.

A first embodiment of the invention will be described. FIG. 1 is a diagram schematically illustrating a configuration of an exposure apparatus EX according to the first embodiment of the invention. The exposure apparatus EX according to this embodiment is an immersion exposure apparatus exposing a substrate P with an exposure light (exposure light beam) EL via a liquid LQ. In this embodiment, water (pure water) is used as the liquid LQ.

In FIG. 1, the exposure apparatus EX includes a mask stage 1 which can move with a mask M held thereon, a substrate stage 2 which can move with a substrate P held thereon, an interferometer system 3 optically measuring positions of the mask stage 1 and the substrate stage 2, an illumination system IL illuminating the mask M with an exposure light EL, a projection optical system PL projecting an image of a pattern of the mask M illuminated with the exposure light EL onto the substrate P, an immersion member 4 forming an immersion space LS so as to fill at least a part of an optical path of the exposure light EL with the liquid LQ, a chamber 5 receiving at least the projection optical system PL, a body 6 supporting at least the projection optical system PL, and a control apparatus 7 controlling the entire operations of the exposure apparatus EX.

The mask M includes a reticle in which a device pattern to be projected onto the substrate P is formed. The mask M employs a transmissive mask having a transparent plate such as a glass plate and a pattern formed on the transparent plate using a light-shielding material such as chromium. A reflective mask may be employed as the mask M.

The substrate P is a substrate used to manufacture a device. The substrate P includes a base member such as a semiconductor wafer and a multi-layered film formed on the base member. The multi-layered film is a film in which plural films including at least a photosensitive film are laminated. The photosensitive film is a film formed of a photosensitive material. The multi-layered film may include, for example, an antireflection film and a protective film (top-coated film) protecting the photosensitive film.

The chamber 5 includes a chamber member 5A forming an internal space 8 substantially closed and an environment controller 5B controlling environments (such as temperature, humidity, cleanness, and pressure) of the internal space 8. The body 6 is disposed in the internal space 8. The body 6 includes a first column 9 disposed on a support floor FL and a second column 10 disposed on the first column 9. The first column 9 includes a first support member 11 and a first plate 13 supported on the first support member 11 with an antivibration device 12 interposed therebetween. The second column 10 includes a second support member 14 disposed on the first plate 13 and a second plate 16 supported on the second support member 14 with an antivibration device 15 interposed therebetween. In this embodiment, a third plate 18 is disposed on the support floor FL with an antivibration device 17 interposed therebetween.

The illumination system IL illuminates a predetermined illuminating region IR with the exposure light EL. The illuminating region IR includes a position which can be illuminated with the exposure light EL emitted from the illumination system IL. The illumination system IL illuminates at least a part of the mask M disposed in the illuminating region IR with the exposure light EL with a uniform luminance distribution. A deep ultraviolet light beam (DUV light beam) such as bright rays (g ray, h-ray, i-ray) emitted from a mercury lamp and a KrF excimer laser beam (with a wavelength of 248 nm) and a vacuum ultraviolet light beam (VUV light beam) such as an ArF excimer laser beam (with a wavelength of 193 nm) and an $F_2$ laser beam (with a wavelength of 157 nm) are used as the exposure light EL emitted from the illumination system IL. In this embodiment, the ArF excimer laser beam which is an ultraviolet light beam (vacuum ultraviolet light beam) is used as the exposure light EL.

The mask stage 1 includes a mask holder 19 releasably holding the mask M and which can move on a guide surface 16G of the second plate 16 with the mask M held thereon. The mask stage 1 can move relative to the illumination region IR by activating a driving system 20 with the mask M held thereon. The driving system 20 includes a planar motor having a movable member 20A disposed on the mask stage 1 and a fixed member 20B disposed on the second plate 16. The planar motor allowing the mask stage 1 to move is disclosed, for example, in U.S. Pat. No. 6,452,292. The mask stage 1 can move in six directions of the X axis direction, the Y axis direction, the Z axis direction, the θX direction, the θY direction, and the θZ direction by the driving system 20.

The projection optical system PL illuminates a predetermined projection region PR with the exposure light EL. The projection optical system PL projects a pattern image of the mask M onto at least a part of the substrate P disposed in the projection region PR at a predetermined projection magnification. The projection optical system PL of this embodiment is a reduced-scale system of which the projection magnification is, for example, ¼, ⅕, or ⅛. The projection optical system PL may be one of an equal-scale system and an enlarging-scale system. In this embodiment, an optical axis AX of the projection optical system PL is parallel to the Z axis. The projection optical system PL may be one of a refraction system not including a reflecting optical element, a reflection system not including a refracting optical element, and a reflection and refraction system including a reflecting optical element and a refracting optical element. The projection optical system PL may form one of an inverted image and an erected image.

Plural optical elements of the projection optical system PL are held in a holding member (barrel) 21. The holding member 21 includes a flange 21F. The projection optical system PL is supported by the first plate 13 by the flange 21F. The antivibration device may be disposed between the first plate 13 and the holding member 21.

The projection optical system PL includes an emission surface 23 emitting the exposure light EL toward an image plane of the projection optical system PL. The emission surface 23 is disposed in a final optical element 22 closest to the image plane of the projection optical system PL out of plural optical elements of the projection optical system PL. The projection region PR includes a position which can be illuminated with the exposure light EL emitted from the emission surface 23. In this embodiment, the emission surface 23 is directed in the −Z direction and is parallel to the XY plane. The emission surface 23 directed in the −Z direction may be a convex surface or a recess surface.

In this embodiment, the optical axis (the optical axis in the vicinity of the image plane of the projection optical system PL) AX of the final optical element 22 is substantially parallel to the Z axis. The optical axis defined by an optical element adjacent to the final optical element 22 may be considered as the optical axis of the final optical element 22. In this embodiment, the image plane of the projection optical system PL is substantially parallel to the XY plane including the X axis and the Y axis. In this embodiment, the image plane is substantially horizontal. However, the image plane may not be parallel to the XY plane and may be a curved surface.

The substrate stage 2 includes a substrate holder 24 releasably holding the substrate P and can move on a guide surface 18G of the third plate 18. The substrate stage 2 can move relative to the projection region PR by activating a driving system 25 with the substrate P held thereon. The driving system 25 includes a planar motor having a movable member 25A disposed on the substrate stage 2 and a fixed member 25B disposed on the third plate 18. The planar motor allowing the substrate stage 2 to move is disclosed, for example, in U.S. Pat. No. 6,452,292. The substrate stage 2 can move in six directions of the X axis direction, the Y axis direction, the Z axis direction, the θX direction, the θY direction, and the θZ direction by the driving system 25.

The substrate stage 2 includes a surface 26 disposed around the substrate holder 24 and opposed to the emission surface 23. In this embodiment, the substrate stage 2 includes a plate member holder 27 disposed at least around the substrate holder 24 so as to releasably hold the bottom surface of a plate member T, an example of which is disclosed in US Patent Application Laid-Open Publication No. 2007/0177125. In this embodiment, the top surface 26 of the substrate stage 2 includes the top surface of the plate member T. The surface 26 is flat.

In this embodiment, the substrate holder 24 holds the substrate P so that the surface of the substrate P is substantially parallel to the XY plane. The plate member holder 27 holds the plate member T so that the surface 26 of the plate member T is substantially parallel to the XY plane.

The interferometer system 3 includes a first interferometer unit 3A optically measuring the position of the mask stage 1 (mask M) in the XY plane and a second interferometer unit 3B optical measuring the position of the substrate stage 2 (substrate P) in the XY plane. At the time of performing an exposure process on the substrate P or at the time of performing a predetermined measurement process, the control apparatus 7 activates the driving systems 20 and 25 on the basis of the measurement result of the interferometer system 3 and controls the positions of the mask stage 1 (mask M) and the substrate stage 2 (substrate P).

The immersion member 4 is disposed at least in a part of a surrounding of an optical path of the exposure light EL so that the optical path of the exposure light EL emitted from the emission surface 23 is filled with the liquid LQ. The immersion member 4 forms an immersion space LS so that the optical path of the exposure light EL between the emission surface 23 and an object disposed at a position opposed to the emission surface 23 is filled with the liquid LQ. The immersion space LS is a part (space, region) filled with the liquid LQ. In this embodiment, the object includes at least one of the substrate stage 2 (plate member T) and the substrate P held on the substrate stage 2. During the exposure of the substrate P, the immersion member 4 forms the immersion space LS so that the optical path of the exposure light EL between the final optical element 22 and the substrate P is filled with the liquid LQ.

In this embodiment, the immersion member 4 includes a first member 31 and a second member 32. The first member 31 and the second member 32 are disposed in the vicinity of the final optical element 22. In this embodiment, the first member 31 is supported by a first support mechanism 28. The second member 32 is supported by a second support mechanism 29. In this embodiment, the first and second support mechanisms 28 and 29 are supported by the first plate 13. In this embodiment, the first member 31 is suspended on the first plate 13 with the first support mechanism 28 interposed therebetween. The second member 32 is suspended on the first plate 13 with the second support mechanism 29 interposed therebetween.

The exposure apparatus EX according to this embodiment is a scanning exposure apparatus (so-called scanning stepper) projecting the pattern image of the mask M onto the substrate P while causing the mask M and the substrate P to synchronously move in a predetermined scanning direction. At the time of exposing the substrate P, the control apparatus 7 controls the mask stage 1 and the substrate stage 2 so that the mask M and the substrate P move in the predetermined scanning direction in the XY plane intersecting the optical axis AX (the optical path of the exposure light EL). In this embodiment, the scanning direction (synchronous moving direction) of the substrate P is the Y axis direction and the scanning direction (synchronous moving direction) of the mask M is the Y axis direction. The control apparatus 7 illuminates the substrate P with the exposure light EL through the projection optical system PL and the liquid LQ in the immersion space LS on the substrate P, while causing the substrate P to move in the Y axis direction relative to the projection region PR of the projection optical system PL and causing the mask M to move in the Y axis direction relative to the illumination region IR of the illumination system IL in synchronization with the movement of the substrate P in the Y axis direction. Accordingly, the pattern image of the mask M is projected onto the substrate P and the substrate P is exposed with the exposure light EL.

Figure 2:
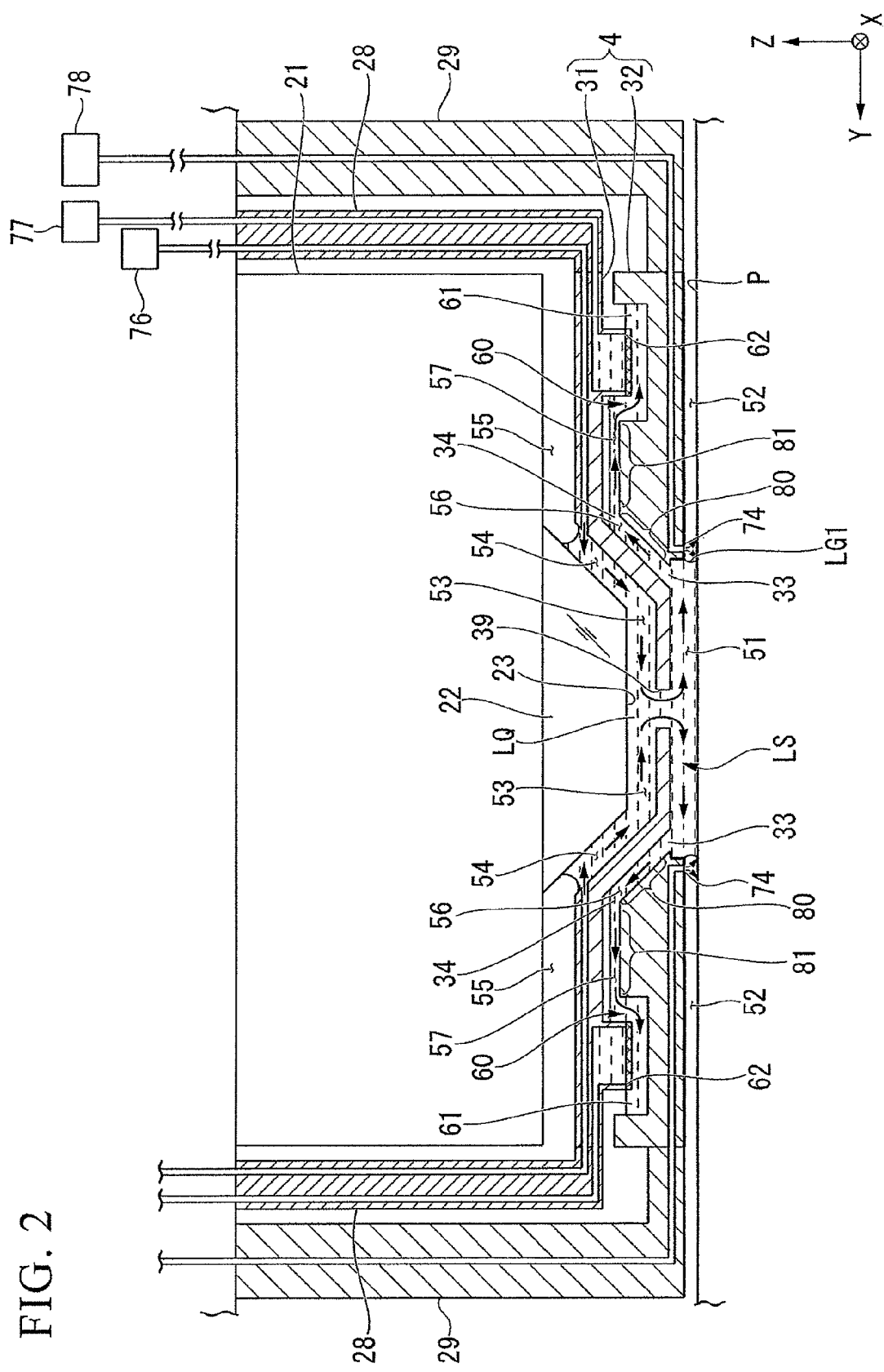
FIG. 2 is a partially enlarged view of the exposure apparatus according to the first embodiment of the invention.
Figure 3:
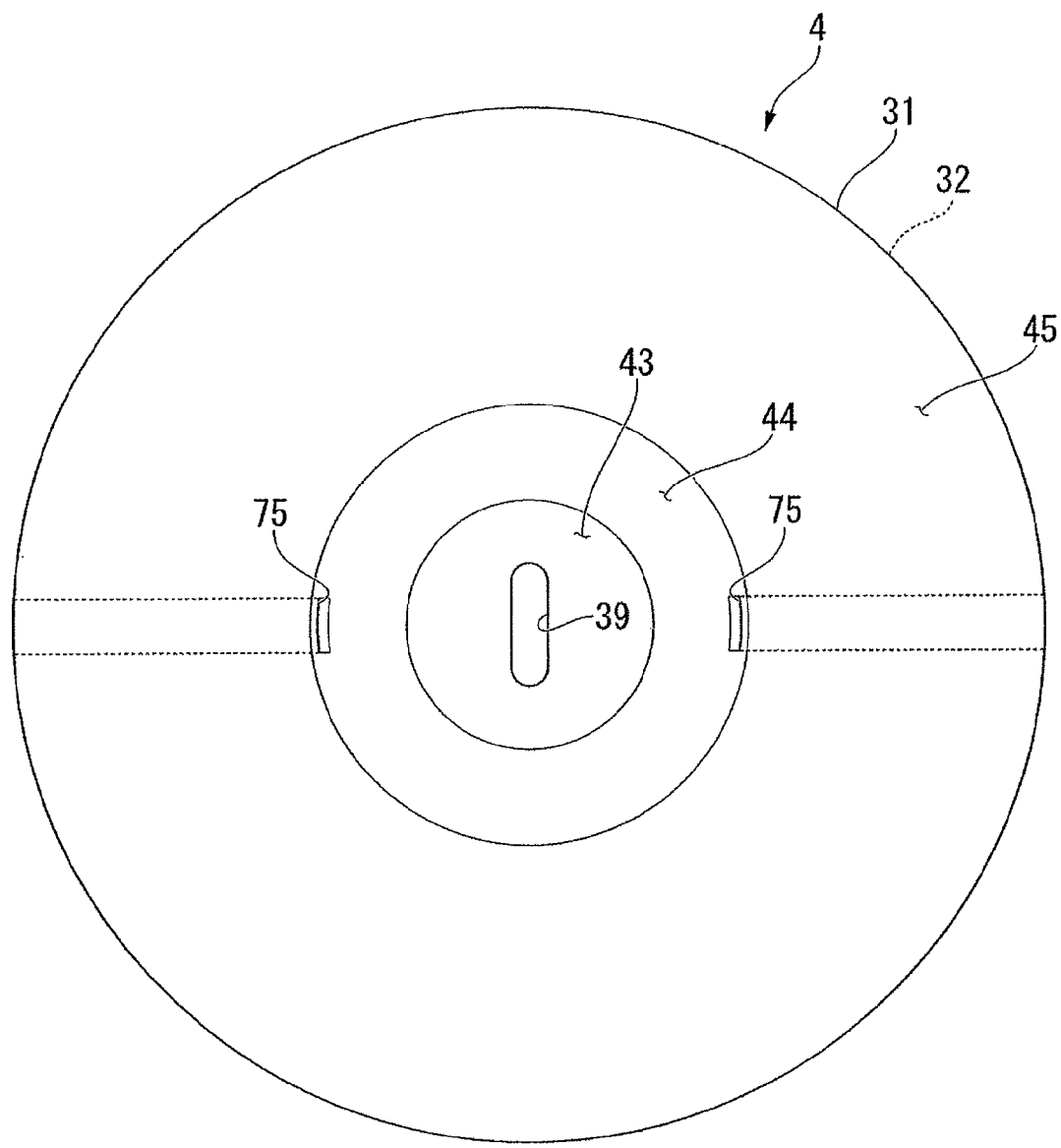
FIG. 3 is a top view of an immersion member according to the first embodiment as viewed from the upside.
Figure 4:
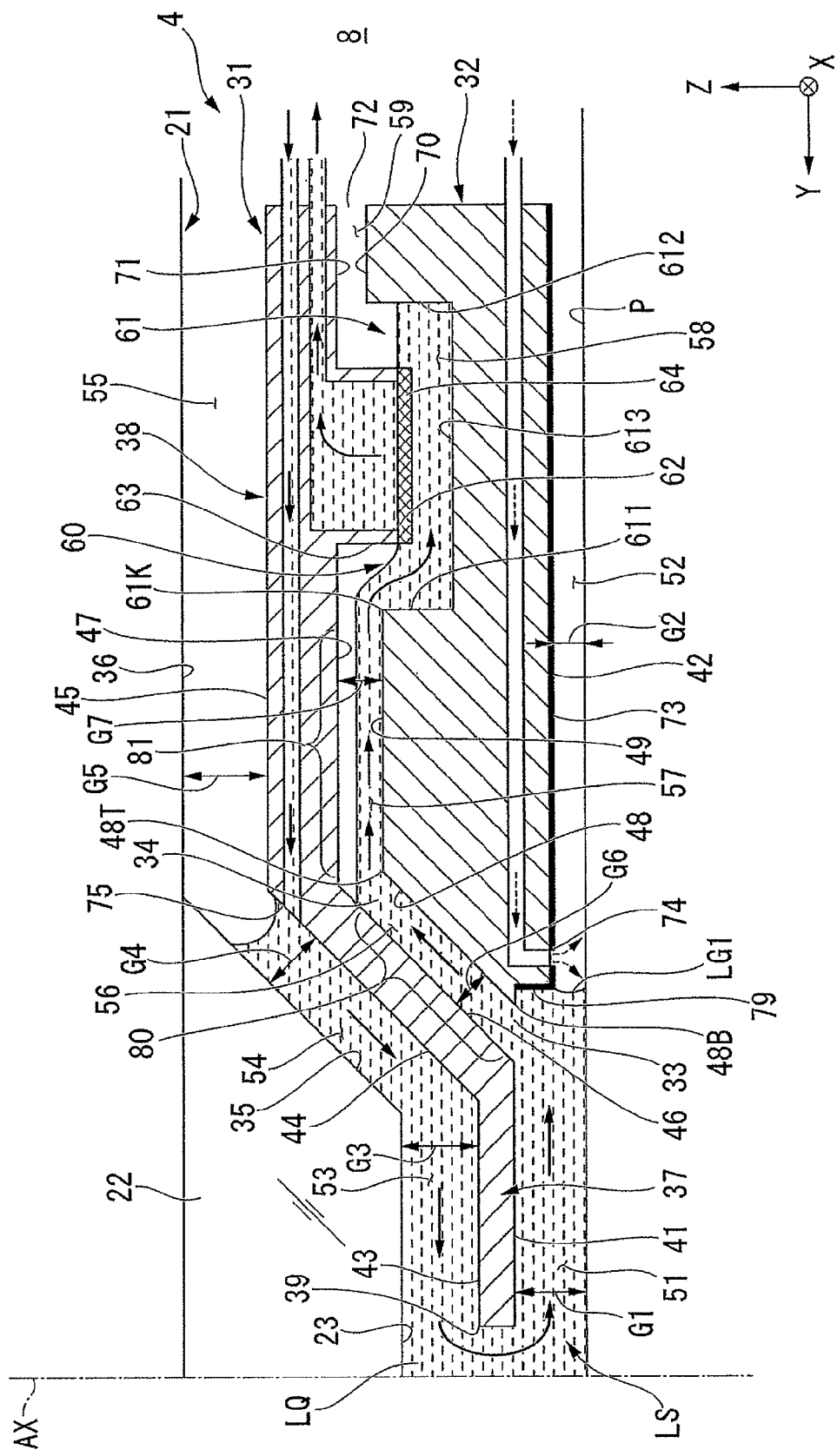
FIG. 4 is a diagram illustrating the vicinity of the immersion member according to the first embodiment of the invention.

FIG. 2 is a side sectional view of the vicinity of the immersion member 4, FIG. 3 is a top view of the immersion member 4, and FIG. 4 is a partially enlarged view of FIG. 2.

As shown in FIGS. 2, 3, and 4, in this embodiment, the first member 31 and the second member 32 are annular members. At least a part of the first member 31 is disposed in the vicinity of a partial optical path of the exposure light EL and the final optical element 22. At least a part of the second member 23 is disposed in the vicinity of the first member 31. As shown in FIG. 3, in this embodiment, the outer shapes of the first member 31 and the second member 32 in the XY plane are circular. The outer shapes of the first member 31 and the second member 32 may be other shapes (for example, rectangular).

The immersion member 4 includes a first surface 41 disposed in at least a part of a surrounding of the optical path of the exposure light EL emitted from the emission surface 23, a second surface 42 disposed lower than (in the −Z side of) the first surface 41 and in at least a part of a surrounding of the first surface 41, a space portion 80 into which the liquid LQ can flow through a first aperture 33 between the first surface 41 and the second surface 42 and which is opened to the atmosphere through a second aperture 34 different from the first aperture 33, and a first recovery portion 60 recovering at least a part of the liquid LQ flowing into the space portion 80. In this embodiment, the first surface 41 is disposed in the first member 31. The second surface 42 is disposed in the second member 32. The first surface 41 and the second surface 42 can be opposed to the surface (top surface) of the object disposed below the immersion member 4. In this embodiment, the outer shapes of the first surface 41 and the second surface 42 in the XY plane are circular. The inner edge of the second surface 42 in the XY plane has a circular shape.

In this embodiment, the first surface 41 and the second surface 42 cannot recover the liquid LQ. That is, in this embodiment, the first surface 41 and the second surface 42 are not provided with a liquid recovery port. In this embodiment, the first surface 41 and the second surface 42 are flat. A first space 51 between the first surface 41 and the surface (top surface) of the object can hold the liquid LQ. In this embodiment, the first surface 41 and the second surface 42 are parallel to the XY plane (horizontal plane), but at least a part of the first surface 41 and/or the second surface 42 may be tilted about the XY plane or at least one of the first surface 41 and the second surface 42 may not be parallel to each other. In this embodiment, the first surface 41 and the second surface 42 may include a curved surface.

In at least a part of the exposure of the substrate P, the emission surface 23, the first surface 41, and the second surface 42 are opposed to the surface of the substrate P. In at least a part of the exposure of the substrate P, the liquid LQ is filled in the space between the emission surface 23 and the surface of the substrate P. In at least a part of the exposure of the substrate P, the liquid LQ is held in the first space 51 between the first surface 41 and the surface of the substrate P. The substrate P is exposed with the exposure light EL from the emission surface 23 through the liquid LQ between the emission surface 23 and the surface of the substrate P.

In this embodiment, a part of the immersion space LS is formed by the liquid LQ held between the first surface 41 and the object. In this embodiment, the immersion space LS is formed so that a partial region of the surface of the substrate P including the projection region PR is covered with the liquid LQ when the substrate P is being illuminated with the exposure light EL. A gas-liquid interface (meniscus, edge) LG1 of the liquid LQ in the immersion space LS can be formed between at least one of the first surface 41 and the second surface 42 and the surface of the substrate P, but is preferably formed between the inner edge of the second surface 42 and the substrate P. The exposure apparatus EX according to this embodiment employs a local immersion method.

For the purpose of convenient explanation, it is assumed that the substrate P is disposed at a position opposed to the emission surface 23, the first surface 41, and the second surface 42 and the liquid LQ is held between the immersion member 4 and the substrate P to form the immersion space LS. As described above, the immersion space LS can be formed between the emission surface 23 and the immersion member 4 and another member (such as the plate member T of the substrate stage 2).

As described above, in this embodiment, the first surface 41 and the second surface 42 are substantially parallel to the XY plane. As shown in FIG. 4, the first surface 41 is opposed to the surface of the substrate P with a first gap G1 interposed therebetween and the second surface 42 is opposed thereto with a second gap G2 interposed therebetween. The second gap G2 is smaller than the first gap G1.

In this embodiment, the first member 31 includes a first surface 41 opposed to the surface of the substrate P, a third surface 43 opposed to at least a part of the emission surface 23 and directed in the opposite direction of the first surface 41, a fourth surface 44 disposed around the third surface 43 and opposed to the side surface 35 of the final optical element 22, and a fifth surface 45 disposed around the fourth surface 44 and opposed to the outer surface 36 of the holding member 21. The first member 31 includes a plate portion 37 of which at least a part is opposed to the emission surface 23 and a body portion 38 of which at least a part is disposed around the final optical element 22. The first surface 41 and the third surface 43 are disposed in the plate portion 37. The fourth surface 44 and the fifth surface 45 are disposed in the body portion 38. The plate portion 37 has an aperture 39 through which the exposure light EL emitted from the emission surface 23 can pass. During the exposure of the substrate P, the exposure light EL emitted from the emission surface 23 is applied to the surface of the substrate P via the aperture 39. As shown in FIG. 3, in this embodiment, the aperture 39 is longitudinal in the X axis direction intersecting the scanning direction (the Y axis direction) of the substrate P.

The third surface 43 is opposed to the emission surface 23 with a third gap G3 interposed therebetween. The fourth surface 44 is opposed to the side surface 35 with a fourth gap G4 interposed therebetween. The fifth surface 45 is opposed to the outer surface 36 with a fifth gap G5 interposed therebetween.

The side surface 35 of the final optical element 22 is a surface which is different from the emission surface 23 and through which the exposure light EL does not pass. The side surface 35 is disposed around the emission surface 23. The side surface 35 extends upward (in the +Z direction) from the edge of the emission surface 23. The side surface 35 extends in the radial direction (in the direction perpendicular to the optical axis AX) of the optical axis AX from the edge of the emission surface 23. That is, the side surface 35 is tilted to extend in the radial direction about the optical axis AX and to the upside.

In this embodiment, the third surface 43 and the emission surface 23 are substantially parallel to each other. The fourth surface 44 and the side surface 35 are substantially parallel to each other. The fifth surface 45 and the outer surface 36 are substantially parallel to each other. The third surface 43 and the emission surface 23 may not be parallel to each other. The fourth surface 44 and the side surface 35 may not be parallel to each other. The fifth surface 45 and the outer surface 36 may not be parallel to each other.

The space between the final optical element 22 and the holding member 21, and the first member 31 includes a third space 53 defined by the emission surface 23 and the third surface 43, a fourth space 54 defined by the side surface 35 and the fourth surface 44, and a fifth space 55 defined by the outer surface 36 and the fifth surface 45. The fourth space 54 is a space tilted to extend in the radial direction about the optical axis AX, in the direction getting apart from the image plane of the projection optical system PL, and in the +Z direction. The fifth space 55 is a space to extend in the radial direction about the optical axis AX (in the direction perpendicular to the optical axis AX).

In this embodiment, the fourth surface 44 is opposed to the side surface 35 of the final optical element 22, but at least a part of the fourth surface 44 may be opposed to the outer surface of the holding member 21. In this embodiment, the fifth surface 45 is opposed to the outer surface 36 of the holding member 21, but at least a part of the fifth surface 45 may be opposed to the bottom surface of the final optical element 22 when the bottom surface of the final optical element 22 is exposed from the vicinity of the side surface 35 of the final optical element 22.

The fourth space 54 may be parallel to the optical axis AX. The fifth space 55 may not be perpendicular to the optical axis AX.

The first member 31 includes a sixth surface 46 disposed around the first surface 41 and a seventh surface 47 disposed around the sixth surface 46. The sixth surface 46 and the seventh surface 47 are disposed in the body portion 38. In this embodiment, the fourth surface 44 and the sixth surface 46 are substantially parallel to each other. The fifth surface 45 and the seventh surface 47 are substantially parallel to each other. The fourth surface 44 and the sixth surface 46 may not be parallel to each other. The fifth surface 45 and the seventh surface 47 may not be parallel to each other.

In this embodiment, the second member 32 includes a second surface 42 opposed to the surface of the substrate P, an eighth surface 48 opposed to the sixth surface 46, and a ninth surface 49 opposed to the seventh surface 47.

The eighth surface 48 is opposed to the sixth surface 46 with a sixth gap G6 interposed therebetween. The ninth surface 49 is opposed to the seventh surface 47 with a seventh gap G7 interposed therebetween. In this embodiment, the eighth surface 48 and the sixth surface 46 are substantially parallel to each other. The ninth surface 49 and the seventh surface 47 are substantially parallel to each other. The eighth surface 48 and the sixth surface 46 may not be parallel to each other. The ninth surface 49 and the seventh surface 47 may not be parallel to each other.

The space between the first member 31 and the second member 32 includes a sixth space 56 defined by the sixth surface 46 and the eighth surface 48 and a seventh space 57 defined by the seventh surface 47 and the ninth surface 49. The sixth space 56 is a space tilted to extend in the direction (in the +Z direction) getting apart from the image plane of the projection optical system PL in the radial direction of the optical axis AX. The seventh space 57 is a space extending in the radial direction about the optical axis AX (in the direction perpendicular to the optical axis AX). The sixth space 56 may be parallel to the optical axis AX. The seventh space 57 may not be perpendicular to the optical axis AX.

In this embodiment, the space portion 80 includes the sixth space 56. The bottom end of the space portion 80 (the sixth space 56) make a fluidic communication with the first space 51 and the second space 52. The top end of the space portion 80 makes a fluidic communication with the seventh space 57. In this embodiment, a first aperture 33 is disposed at the bottom end of the space portion 80 and a second aperture 34 is disposed at the top end of the space portion 80. In this embodiment, the bottom end portion 48B of the eighth surface 48 defines the bottom end of the space portion 80. The top end portion 48T of the eighth surface 48 defines the top end of the space portion 80.

In at least a part of the exposure of the substrate P, the first aperture 33 is opposed to the surface of the substrate P. At least a part of the liquid LQ on the substrate P can be made to flow in the space portion 80 via the first aperture 33. In this embodiment, the first aperture 33 is substantially flush with the first surface 41. The first aperture 33 may not be directed to the downside (in the −Z direction). For example, the first aperture 33 may be disposed in a twelfth surface 79 to be described later. The first aperture 33 may be formed in an annular shape by an aperture or may be formed by plural apertures arranged in an annular shape with a predetermined gap. Similarly, the space portion 80 may be formed by plural space portions arranged in an annular shape with a predetermined gap around the optical axis AX.

The first recovery portion 60 recovers the liquid LQ from the space portion 80. The first recovery portion 60 recovers the liquid LQ overflowing from the space portion 80. At least a part of the first recovery portion 60 is disposed outside the top end portion 48T in the radial direction about the optical axis AX.

In this embodiment, the first recovery portion 60 includes a first recess portion 61 disposed to the upside (in the +Z direction) outside the space portion 80 in the radial direction about the optical axis AX. The first recess portion 61 includes an opening 61K directed to the upside. The first recovery portion 60 recovers the liquid LQ flowing into the first recess portion 61 via the opening 61K.

The first recess portion 61 is disposed outside the top end portion 48T in the radial direction about the optical axis AX. In this embodiment, the first recess portion 61 is disposed around the ninth surface 49. In the XY plane, the first recess portion 61 has an annular shape. The first recess portion 61 may be formed by plural recess portions arranged in an annular shape with a predetermined gap. In this embodiment, the second member 32 includes a tenth surface 70 disposed around the first recess portion 61. The tenth surface 70 is substantially parallel to the XY plane. In this embodiment, the tenth surface 70 is flush with the ninth surface 49. The tenth surface 70 may be disposed higher than the ninth surface 49 (in the +Z direction).

The first recess portion 61 includes a first inner surface 611 connected to the ninth surface 49, a second inner surface 612 connected to the tenth surface 70 and opposed to the first inner surface 611, and a bottom surface 613 disposed between the first inner surface 611 and the second inner surface 612. The bottom surface 613 is directed to the upside (in the +Z direction). The bottom surface 613 is disposed lower than the top end portion 48T (in the −Z direction). In this embodiment, the bottom surface 613 is substantially parallel to the XY plane. The bottom surface 613 may not be parallel to the XY plane. For example, the bottom surface 613 may be tilted about the XY plane. The bottom surface 613 may include a curved surface.

The first recovery portion 60 includes a liquid guide portion 81 guiding the liquid LQ from the space portion 80 to the first recess portion 61. In this embodiment, the liquid guide portion 81 includes the ninth surface 49. In this embodiment, the liquid guide portion 81 includes the seventh space 57. The liquid guide portion 81 extends in the radial direction about the optical axis AX from the top end portion 48T. In this embodiment, the liquid guide portion 81 is perpendicular to the optical axis AX (parallel to the XY plane), but may not be perpendicular to the optical axis AX. For example, the ninth surface 49 may be tilted to the downside from the top end portion 48T.

The first recess portion 61 is disposed outside the liquid guide portion 81 in the radial direction about the optical axis AX from the top end portion 48T. The liquid LQ overflowing from the top end of the space portion 80 is guided by the liquid guide portion 81 and flows in the first recess portion 61.

The first recess portion 61 can gather the liquid LQ from the space portion 80. The first recess portion 61 suppresses the liquid LQ from the space portion 80 from returning to the space portion 80, by collecting the flowing liquid LQ. That is, the first recess portion 61 at least serves as a part of a reservoir portion collecting the liquid LQ from the space portion 80 so as not to return to the space portion 80.

The first recovery portion 60 includes a recovery port 62 recovering the liquid LQ flowing in the first recess portion 61. The recovery port 62 recovers the liquid LQ collected by the first recess portion 61.

In this embodiment, the recovery port 62 is opposed to the bottom surface 613. In this embodiment, the recovery port 62 is disposed in the first recess portion 61. In other words, the recovery port 62 is disposed lower than the opening 61K of the first recess portion 61 (in the −Z direction).

In this embodiment, the recovery port 62 has an annular shape in the XY plane. The recovery port 62 may be divided and disposed at plural position around the optical axis AX.

In this embodiment, the recovery port 62 is disposed in the first member 31. The first member 31 includes a convex portion 63 disposed around the seventh surface 47 to protrude downward. The recovery port 62 is disposed at the bottom end of the convex portion 63.

A porous member 64 is disposed in the recovery port 62. The porous member 64 is a plate-like member including plural openings or pores. The porous member 64 may be a mesh filter which is a porous member having plural small pores formed in mesh shapes.

In the outer surface of the convex portion 63 including the bottom surface of the porous member 64 and the inner surface of the first recess portion 61 including the bottom surface 613, the first inner surface 611, and the second inner surface 612 are apart from each other. That is, an eighth space 58 is formed between the recess portion 63 and the first recess portion 61.

The first member 31 includes an eleventh surface 71 opposed to the tenth surface 70. A ninth space 59 between the tenth surface 70 and the eleventh surface 71 is opened to the atmosphere via the third aperture 72.

The space portion 80 is opened to the atmosphere via the second aperture 34. The second aperture 34 is connected to the third aperture 72 via the seventh space 57, the eighth space 58, and the ninth space 59. In this embodiment, the space portion 80 is opened to the atmosphere via the second aperture 34, the seventh, eighth, and ninth spaces 57, 58, and 59, and the third aperture 72. That is, the space portion 80 is opened to the space around the immersion member 4 via the second aperture 34 different from the first aperture 33. In other words, the space portion 80 is opened to the gas space coming in contact with the interface of the liquid LQ in the immersion space LS via the second aperture 34.

In this embodiment, the "atmosphere" is a gas surrounding the immersion member 4. In this embodiment, the gas surrounding the immersion member 4 is a gas in the inner space 8 formed by the chamber 5. In this embodiment, the chamber 5 fills the inner space 8 with a clean gas using the environment controller 5B. The chamber 5 adjusts the inner space 8 substantially to the atmospheric pressure using the environment controller 5B. The pressure of the inner space 8 may be set to be higher than the atmospheric pressure.

In this embodiment, the third space 53, the fourth space 54, and the fifth space 55 are also opened to the gas space (inner space 8) around the immersion member 4.

In this embodiment, the second surface 42 is lyophobic to the liquid LQ. In the second surface 42, a contact angle of the liquid LQ is equal to or greater than 90° and may be equal to or greater than 100°. In this embodiment, the second surface 42 is formed of a film 73 which is lyophobic to the liquid LQ. The film 73 is formed of, for example, a lyophobic material containing fluorine. Examples of the lyophobic material include PFA (Tetra Fluoro Ethylene-perfluoro alkylvinyl ether copolymer), PTFE (Poly Tetra Fluoro Ethylene), PEEK (PolyEtherEtherKetone), and Teflon (registered trademark).

In this embodiment, the second member 32 has a twelfth surface 79 connected to an inner edge of the second surface 42 and disposed to face the optical path of the exposure light EL. The twelfth surface 79 is also lyophobic to the liquid LQ. The twelfth surface 79 is also formed of the film 73. At least one of the second surface 42 and the twelfth surface may not be a surface of a lyophobic film. For example, the second member 32 may be formed of a lyophobic material.

In this embodiment, the immersion member 4 includes an gas supply port 74 disposed in at least a part of a surrounding of the first aperture 33. In this embodiment, the gas supply port 74 is disposed in the second surface 42. The gas supply port 74 supplies a gas to the surface of the object (substrate P) opposed to the second surface 42.

In this embodiment, the gas supply port 74 has an annular shape in the XY plane. The gas supply port 74 may be divided and arranged at plural positions around the optical axis AX.

In this embodiment, the immersion member 4 includes a supply port 75 supplying the liquid LQ to the optical path of the exposure light EL. The supply port 75 is disposed at a position opposed to a surface of the final optical element 22 through which the exposure light EL does not pass. In this embodiment, the supply port 75 is disposed at the position opposed to the side surface 35 of the final optical element 22. The supply port 75 may not be opposed to the surface of the final optical element 22. For example, the supply port 75 may be disposed in the first member 31 so as to face the third space 53 between the third surface 43 and the emission surface 23.

As shown in FIG. 3, in this embodiment, the supply ports 75 are disposed on the +Y side and −Y side about the optical axis AX, respectively. The supply ports 75 may be disposed on the +X side and −X side about the optical axis AX, respectively. The number of supply ports 75 may be equal to or greater than 3.

In this embodiment, the supply port 75 supplies the liquid LQ to the fourth space 54. The liquid LQ supplied to the fourth space 54 flows downward in the fourth space 54 and is supplied to the optical path of the exposure light EL emitted from the emission surface 23 via the third space 53. At least a part of the liquid LQ supplied from the supply port 75 to the third space 53 via the fourth space 54 is supplied to the first space 51 via the aperture 39.

As shown in FIG. 2, the supply port 75 is connected to a liquid supply device 76 via a supply flow channel. In this embodiment, the supply flow channel includes a flow channel formed in the first member 31 and a flow channel formed in the first support mechanism 28. The liquid supply device 76 can supply the clean liquid LQ adjusted in temperature to the supply port 75. A part of the supply flow channel may not be disposed in the first support mechanism 28 supporting the first member 31.

The recovery port 62 is connected to a liquid recovering device 77 via a recovery flow channel. In this embodiment, the recovery flow channel includes a flow channel formed in the first member 31 and a flow channel formed in the first support mechanism 28. The liquid recovering device 77 includes a vacuum system (such as a valve controlling a connection state between a vacuum source and the recovery port 62) and can suct and recover the liquid LQ from the recovery port 62. A part of the recovery flow channel may not be disposed in the first support mechanism 28 supporting the first member 31.

The gas supply port 74 is connected to a gas supply device 78 via a gas supply channel. In this embodiment, the gas supply channel includes a flow channel formed in the second member 32 and a flow channel formed in the second support mechanism 29. The gas supply device 78 can supply a clean gas adjusted in temperature and humidity to the gas supply port 74. The humidity of the gas supplied from the gas supply port 74 is preferably equal to or higher than the humidity of the gas supplied to the inner space 8 by the environment controller 5B. A part of the gas supply channel may not be disposed in the second support mechanism 29 supporting the second member 32.

The control apparatus 7 can control the liquid recovering device 77 to control a difference in pressure between at the bottom surface and at the top surface of the porous member 64 so that only the liquid LQ passes from the lower space (the eighth space 58) of the porous member 64 to the upper space (recovery flow channel). In this embodiment, the pressure of the eighth space 58 on the lower side is opened to the atmosphere and is controlled by the chamber 5. The control apparatus 7 controls the liquid recovering device 77 so that only the liquid LQ passes from the bottom surface of the porous member 64 to the top surface thereof and adjusts the pressure on the top surface side on the basis of the pressure on the bottom surface side. That is, the control apparatus 7 makes a control so as to recover only the liquid LQ from the eighth space 58 via the pores of the porous member 64 and so as for the gas not to pass through the pores of the porous member 64. The technique of adjusting the difference in pressure between at one side and at the other side of the porous member 64 so as to pass only the liquid LQ from one side of the porous member 64 to the other side is disclosed, for example, in the specification of U.S. Pat. No. 7,292,313.

A method of exposing the substrate P using the exposure apparatus EX having the above-mentioned configuration will be described now.

First, the control apparatus 7 opposes the first surface 41 and the second surface 42 to the surface of the substrate P (or the top surface 26 of the substrate stage 2). The first surface 41 and the surface of the substrate are opposed to each other with the first gap G1 interposed therebetween and the second surface 42 and the surface of the substrate P are opposed to each other with the second gap G2 interposed therebetween.

The control apparatus 7 sends out the liquid LQ from the liquid supply device 76 in the state where the first surface 41 and the second surface 42 are opposed to the surface of the substrate P. The control apparatus 7 activates the liquid recovering device 77. The control apparatus 7 activates the gas supply device 78.

The liquid LQ sent from the liquid supply device 76 is supplied to the fourth space 54 from the supply port 75. The liquid LQ supplied to the fourth space 54 flows downward in the fourth space 54 and is then supplied to the optical path of the exposure light EL emitted from the emission surface 23 via the third space 53. Accordingly, the optical path of the exposure light EL is filled with the liquid LQ.

At least a part of the liquid LQ supplied to the third space 53 from the supply port 75 via the fourth space 54 is supplied to the first space 51 via the aperture 39 and is held between the first surface 41 and the surface of the substrate P. In this embodiment, the immersion space LS is formed so that the space surrounded with the surface of the substrate P, the first surface 41, and the twelfth surface 79 is almost filled with the liquid LQ. The interface of the liquid LQ (the immersion space LS) is formed between the inner edge (the bottom end of the twelfth surface 79) of the second surface 42 and the surface of the substrate P.

At least a part of the liquid LQ supplied to the first space 51 from the aperture 39 flows into the space portion 80 via the first aperture 31.

In this embodiment, the liquid LQ supplied to the first space 51 via the aperture 39 is suppressed from flowing into the second space 52. That is, in this embodiment, the interface LG1 of the liquid LQ in the immersion space LS in the XY plane is suppressed from moving to the outside from the twelfth surface 79, thereby suppressing the extension of the immersion space LS.

In this embodiment, the first surface 41 is opposed to the surface of the substrate P with the first gap G1 interposed therebetween and the second surface 42 disposed around the first surface 41 is opposed to the surface of the substrate P with the second gap G2 interposed therebetween. The second gap G2 is smaller than the first gap G1 and is, for example, about in the range of 0.1 to 0.3 mm. Accordingly, the interface LG1 is suppressed from moving to the outside of the first aperture 33 in the radial direction about the optical axis AX. That is, since the second gap G2 is small, the position of the interface LG1 is held between the inner edge of the second surface 42 and the surface of the substrate P due to the surface tension of the liquid LQ, as shown in FIG. 4 and the like. Accordingly, the liquid LQ in the immersion space LS is suppressed from flowing into the second space 52.

In this embodiment, since the second surface 42 is lyophobic to the liquid LQ, the liquid LQ is more effectively suppressed from flowing into the second space 52. In this embodiment, since the twelfth surface 79 is disposed so as to extend upward from the inner edge of the second surface 42 and to face the optical path, the extension of the immersion space LS is suppressed. Since the twelfth surface 79 is lyophobic to the liquid LQ, the extension of the immersion space LS is also suppressed.

In this embodiment, the gas supply port 74 is disposed and the gas is supplied to the surface of the substrate P on the outside of the inner edge of the second surface 42 about the optical axis AX. Accordingly, the extension of the immersion space LS is suppressed by the force of the gas supplied from the gas supply port 74. That is, the gas supply port 74 forms a gas seal between the surface of the substrate P and the second surface 42. Accordingly, the leakage of the liquid LQ is suppressed and thus the movement of the interface LG1 is restricted.

In this embodiment, the outer shape of the first surface 41 and the inner edge of the second surface 42 are circular and the outer shape of the immersion space LS in the XY plane is almost circular. Accordingly, the binding force acting to the center from all the sides of the interface LG1 of the immersion space LS almost uniformly acts. Accordingly, the extension of the immersion space LS is effectively suppressed.

By supplying the liquid LQ from the supply port 75 in the state where the extension of the immersion space LS formed by the liquid LQ flowing into the first space 51 via the aperture 39 is suppressed, the liquid LQ flows into the space portion 80 opened to the atmosphere and the position of the surface of the liquid LQ in the space portion 80 moves in the +Z direction (rises). When the space portion 80 is filled with the liquid LQ, at least a part of the liquid LQ in the space portion 80 overflows from the top end (the top end portion 48T) of the space portion 80. The liquid LQ overflowing from the space portion 80 is recovered by the first recovery portion 60 disposed outside the top end of the space portion 80.

The liquid LQ overflowing from the space portion 80 is guided by the liquid guide portion 81 and then flows into the first recess portion 61. The liquid LQ flowing into the first recess portion 61 is collected in the first recess portion 61.

Figure 5A:
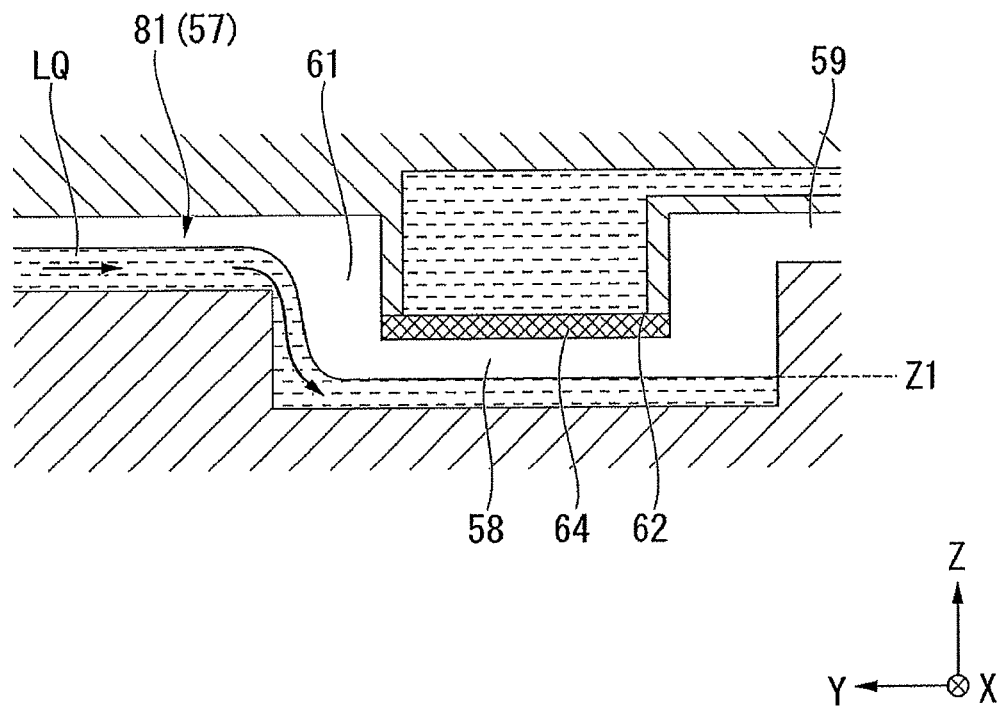
FIG. 5A is a diagram illustrating the vicinity of a first recovery portion according to the first embodiment of the invention.
Figure 5B:
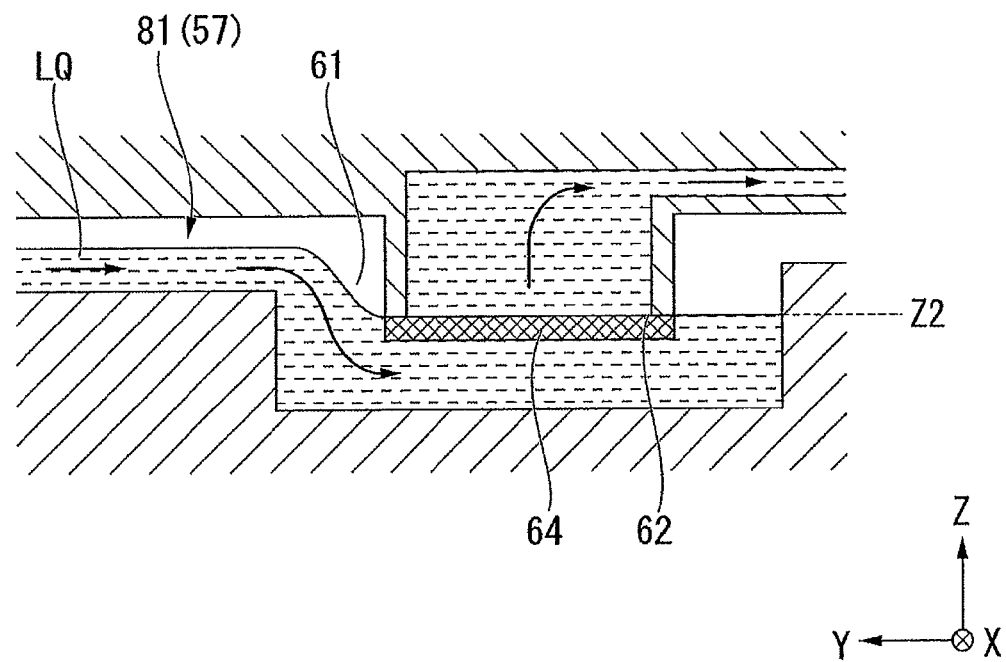
FIG. 5B is a diagram illustrating the vicinity of a first recovery portion according to the first embodiment of the invention.

FIG. 5(A) shows a state where the surface of the liquid LQ in the first recess portion 61 is located at a first position Z1 and FIG. 5(B) shows a state where the surface of the liquid LQ is located at a second position Z2. As shown in FIG. 5A, for example, in the state where the surface of the liquid LQ is located at the first position Z1 and the liquid LQ does not come in contact with the recovery port 62 (the porous member 64), the second aperture 34 is opened to the atmosphere via the seventh, eighth, and ninth spaces 57, 58, and 59 and the third aperture 72. Accordingly, the liquid LQ in the first space 51 smoothly flows into the space portion 80 via the first aperture 33. The liquid LQ flowing into the space portion 80 and overflowing from the space portion 80 smoothly flows into the first recess portion 61. The amount of the liquid LQ collected in the first recess portion 61 slowly increases.

As shown in FIG. 5(B), when the amount of the liquid LQ collected in the first recess portion 61 increases, the surface of the liquid LQ reaches the second position Z2, and the liquid LQ comes in contact with the recovery port 62 (the porous member 64), the liquid LQ collected in the first recess portion 61 is recovered from the recovery port 62 (the porous member 64). When the liquid LQ is recovered from the recovery port 62, the amount of the liquid LQ in the first recess portion 61 decreases and the position of the surface of the liquid LQ in the first recess portion 61 moves in the −Z direction (drops). When the liquid LQ flows into the first recess portion 61 from the space portion 80, the amount of the liquid LQ in the first recess portion 61 increases again, the liquid LQ comes in contact with the porous member 64, and the liquid LQ is recovered from the recovery port 62.

In this embodiment, since the difference in pressure between at the bottom surface side and at the top surface side of the porous member 64 is controlled so that only the liquid LQ passes from the bottom surface to the top surface of the porous member 64, the first recovery portion 60 can recover the liquid LQ while suppressing the vibration and the vaporization heat from being generated.

In this embodiment, since the first recovery portion 60 collects the liquid LQ on the substrate P recovered via the first aperture 33 and the space portion 80 into the first recess portion 61, it is possible to suppress the liquid LQ recovered via the space portion 80 from returning to the space portion 80. The first recovery portion 60 recovers the liquid LQ collected greater than a predetermined amount in the first recess portion 61 by the use of the recovery port 62. Accordingly, it is possible to satisfactorily suppress the liquid LQ recovered via the space portion 80 from returning to the space portion 80. Since the liquid LQ from the space portion 80 is collected in the first recess portion 61 so that the liquid LQ recovered via the space portion 80 does not return to the space portion 80, the liquid LQ coming into contact with the porous member 64 is suppressed from returning to the first space 51 and the optical path of the exposure light EL via the space portion 80.

A method of exposing the substrate P will be described now. As described above, the control apparatus 7 supplies the liquid LQ from the supply port 75 and holds the liquid LQ between the first surface 41 and the surface of the substrate P so as to fill the optical path of the exposure light EL with the liquid LQ, thereby forming the immersion space LS. At least a part of the liquid LQ on the substrate P flows into the space portion 80 via the first aperture 33. The first recovery portion 60 collects the liquid LQ from the space portion 80 in the first recess portion 61 and recovers the liquid LQ reaching a predetermined amount in the first recess portion 61 by the use of the recovery port 62. The control apparatus 7 performs a liquid recovering operation using the first recovery portion 60 along with a liquid supply operation using the supply port 75 and forms the immersion space LS so as to fill the optical path of the exposure light EL with the liquid LQ. The control apparatus 7 continuously supplies the gas from the gas supply port 74 to form the gas seal.

The control apparatus 7 collects at least a part of the liquid LQ on the substrate P into the first recess portion 61 via the space portion 80 from the first aperture 33 and starts the exposure of the substrate P while suppressing the liquid LQ recovered from the space portion 80 by the first recovery portion 60 from returning to the space portion 80 and restricting the extension of the immersion space LS using the second gap G2 or the like.

The control apparatus 7 controls the illumination system IL to emit the exposure light EL and illuminates the mask M with the exposure light EL. The exposure light EL from the mask M is emitted from the emission surface 23 of the projection optical system PL. The control apparatus 7 illuminates the substrate P with the exposure light EL from the emission surface 23 via the liquid LQ between the emission surface 23 and the substrate P. Accordingly, the pattern image of the mask M is projected to the substrate P and the substrate P is exposed with the exposure light EL. During the exposure of the substrate P, the liquid LQ supplied from the supply port 75 flows via the first aperture 33 and is recovered by the recovery portion 60 via the space portion 80.

As described above, in this embodiment, since the space portion 80 opened to the atmosphere is disposed and the liquid LQ flowing into the space portion 80 is recovered by the first recovery portion 60, it is possible to simplify the structure of the bottom surface of the immersion member 4 opposed to the surface of the substrate P. Accordingly, it is possible to suppress foreign materials from being attached to the bottom surface of the immersion member 4 coming in contact with the liquid LQ or to suppress the bottom surface from being contaminated.

For example, when the structure (shape) is complicated by disposing the recovery port recovering the liquid LQ in the bottom surface of the immersion member 4 opposed to the surface of the substrate P or disposing the porous member in the recovery port, foreign materials may be easily attached to the bottom surface. For example, when the porous member is disposed at a position opposed to the surface of the substrate P, the foreign materials (for example, the photosensitive film forming the surface of the substrate P or a part of an overcoat film) generated from the substrate P may be attached to the porous member. When the attached foreign materials are emitted to the optical path of the exposure light EL or are mixed into the liquid LQ in the immersion space LS during the exposure of the substrate P, the exposure failure such as a pattern defect caused in the substrate P may be caused. When the structure (shape) of the bottom surface is complicated, for example, when plural recess and convex portions exist, the foreign materials generated from the substrate P may be easily attached to the bottom surface.

According to this embodiment, the space portion 80 opened to the atmosphere is disposed, the liquid LQ flowing into the space portion 80 via the first aperture 33 is recovered by the first recovery portion 60 disposed at the position not opposed to the surface of the substrate P, and the bottom surface of the immersion member 4 opposed to the surface of the substrate P has a simple structure. Accordingly, it is possible to suppress the foreign materials from being attached to the bottom surface of the immersion member 4. Since the structure of the bottom surface of the immersion member 4 is simple, it is possible to smoothly and reliably clean the bottom surface of the immersion member 4 even when the foreign materials are attached to the bottom surface of the immersion member 4.

In this embodiment, the space portion 80 (the sixth space 56) and liquid guide portion 81 (the seventh space 57) forming the flow channel through which the liquid LQ flowing through the first aperture 33 flows are formed between the first member 31 and the second member 32 which can be separated. Accordingly, it is possible to smoothly and reliably clean the sixth surface 46 of the first member 31 and the eighth surface 48 of the second member 32 forming the space portion 80 and the seventh surface 47 of the first member 31 and the ninth surface 49 of the second member 32 forming the liquid guide portion 81.

In this embodiment, the first recovery portion 60 is constructed so that the liquid LQ recovered from the space portion 80 does not return to the space portion 80. That is, the liquid LQ from the space portion 80 is collected in the first recess portion 61. Accordingly, for example, when the porous member 64 of the first recovery portion 60 is contaminated, it is possible to suppress the liquid LQ coming into contact with the porous member 64 (the liquid LQ which might be contaminated) from returning (reversely flowing) to the first space 51 and the optical path of the exposure light EL via the space portion 80. Accordingly, it is possible to prevent the generation of the exposure failure.

When the porous member 64 is contaminated, it is possible to prevent the contamination of the liquid LQ coming in contact with the porous member 64 by replacing the contaminated porous member 64 with a new porous member 64.

The liquid guide portion 81 (the ninth surface 49) disposed between the top end portion 48T and the first recess portion 61 may not be disposed. That is, the first recess portion 61 may be disposed adjacent to the top end portion 48T.

Second Embodiment

A second embodiment of the invention will be described below. In the following description, the elements equal or equivalent to those of the above-mentioned embodiment are referenced by like reference numerals and signs, and are described in brief or are not repeatedly described.

Figure 6:
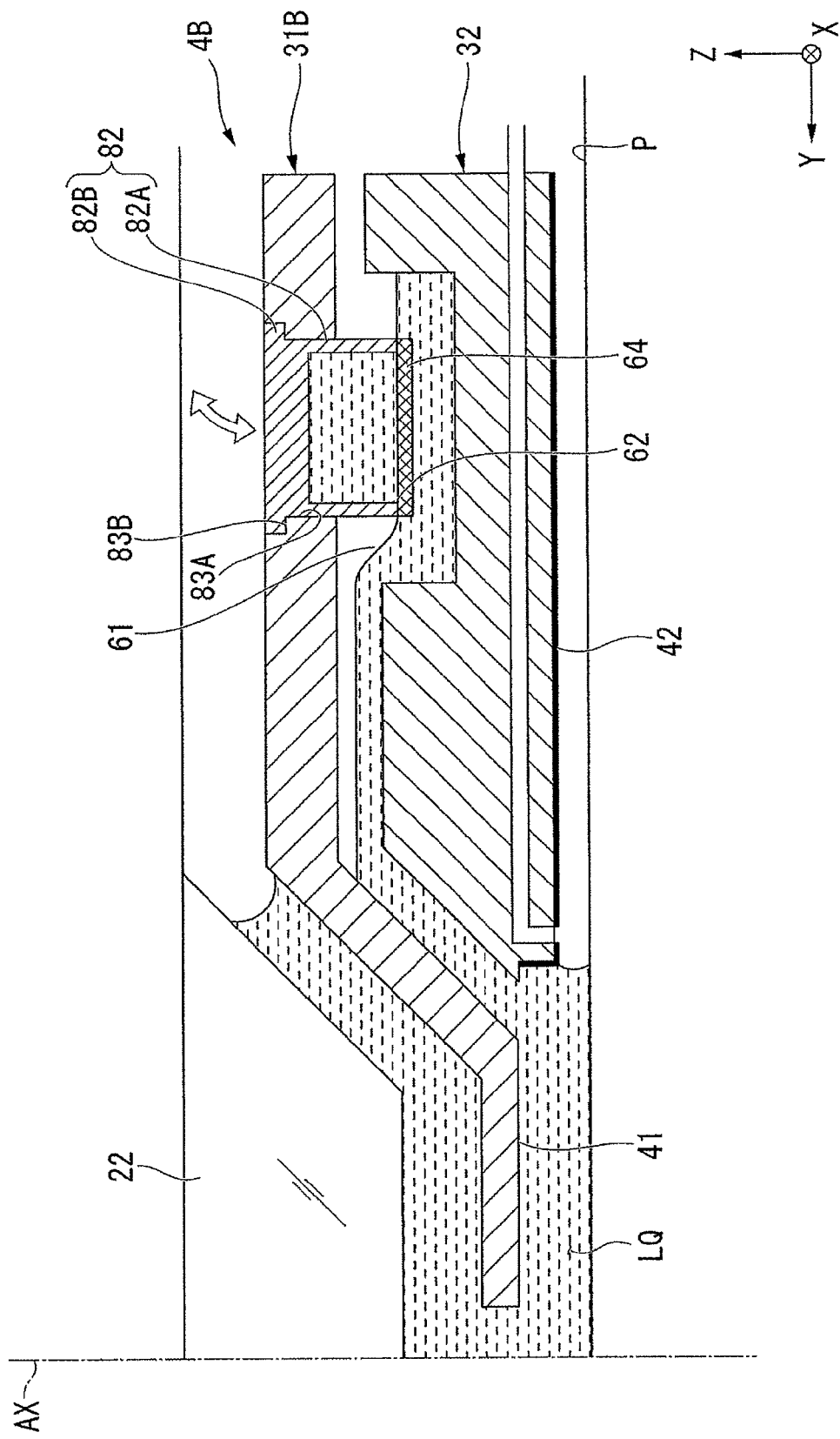
FIG. 6 is a diagram illustrating the vicinity of an immersion member according to a second embodiment of the invention.

FIG. 6 is a diagram illustrating an example of an immersion member 4B according to the second embodiment of the invention. In FIG. 6, the immersion member 4B includes a first member 31B having a first surface 41, a second member 32 having a second surface 42, and a third member 82 which is different from the first member 31B and the second member 32 and which includes a recovery port 62 and a porous member 64. The third member 82 can be detached from the first member 31B.

The third member 82 includes a body portion 82A and a flange portion 82B disposed at the top end of the body portion 82A. The body portion 82A can be disposed in an aperture 83A disposed in the first member 31B. The flange portion 82B is supported by a support surface 83B disposed in the first member 31B, whereby the position of the third member 82 relative to the first member 31B is fixed. In the state where the flange portion 82B is supported by the support surface 83B, the recovery port 62 disposed at the bottom end of the third member 82 and the porous member 64 disposed in the recovery port 62 are arranged inside the first recess portion 61.

For example, by pulling up the third member 82, the third member 82 can be detached from the first member 31B. By inserting the body portion 82A of the third member 82 into the aperture 83A from the upside of the aperture 83A and supporting the flange portion 82B on the support surface 83B, the third member 82 can be attached to the first member 31B. The third member 82 can be easily replaced. Accordingly, for example, when the porous member 64 is contaminated or at least a part of the third member 82 is contaminated, it is possible to easily replace the third member 82 with a new one and to easily attach the contaminated and cleaned third member 32 to the first member 31B again. Therefore, it is possible to suppress the liquid LQ coming in contact with the third member 82 (the porous member 64) from being contaminated.

The detachment of the third member 82 from the first member 31B and/or the attachment of the third member 82 to the first member 31B may be carried out in the state where the first member 31B is attached to the exposure apparatus EX (in the state where the first member is supported by the first support mechanism 28) or may be carried out in the state where the first member 31B is detached from the exposure apparatus EX (in the state where the first member is released from the first support mechanism 28).

Third Embodiment

A third embodiment of the invention will be described below. In the following description, the elements equal or equivalent to those of the above-mentioned embodiment are referenced by like reference numerals and signs, and are described in brief or are not repeatedly described.

Figure 7:
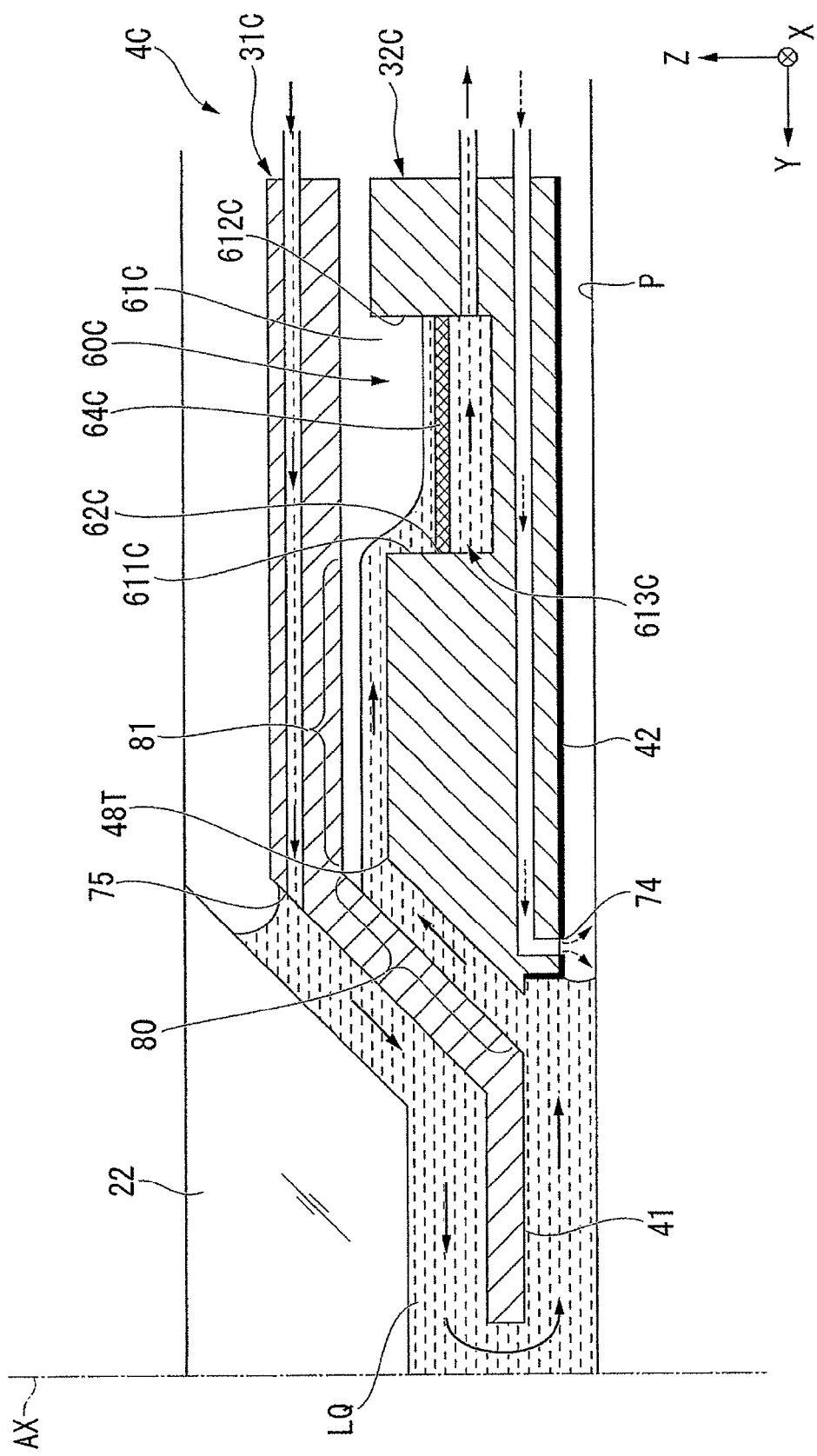
FIG. 7 is a diagram illustrating the vicinity of an immersion member according to a third embodiment of the invention.

FIG. 7 is a diagram illustrating an example of an immersion member 4C according to the third embodiment of the invention. In FIG. 7, the immersion member 4C includes a first member 31C having the first surface 41 and a second member 32C having the second surface 42. A first recovery portion 60C includes a first recess portion 61C disposed in the second member 32C and a recovery port 62C recovering the liquid LQ flowing into the first recess portion 61C. This embodiment is different from the first and second embodiments, in that the recovery port 62C is disposed in the first recess portion 61C but the second member 32C includes the recovery port 62C and a part of a recovery flow channel. In this embodiment, the recovery port 62C is disposed in the bottom 613C of the first recess portion 61C. That is, the bottom 613C of the first recess portion 61 includes at least a part of the recovery port 62C.

In this embodiment, a porous member 64C is disposed in the recovery port 62C. The surface of the porous member 64C is disposed lower than the top end portion 48T (in the −Z direction).

In this embodiment, the liquid LQ can be reliably recovered by the first recovery portion 60C.

Instead of the recovery port 62C or in addition to the recovery port 62C, a recovery port recovering the liquid LQ may be disposed in at least one of a first inner surface 611C and a second inner surface 612C of the first recess portion 61C.

Similarly to the second embodiment, the recovery port 62C (the porous member 64C) may be held by a member other than the first member and the second member, thereby facilitating the attachment and detachment (replacement).

In addition to the recovery port 62 of the first and second embodiments, the recovery port 62C according to this embodiment may be further disposed.

Fourth Embodiment

A fourth embodiment of the invention will be described below. The fourth embodiment is a modified example of the first embodiment. In the following description, the elements equal or equivalent to those of the above-mentioned embodiment are referenced by like reference numerals and signs, and are described in brief or are not repeatedly described.

Figure 8:
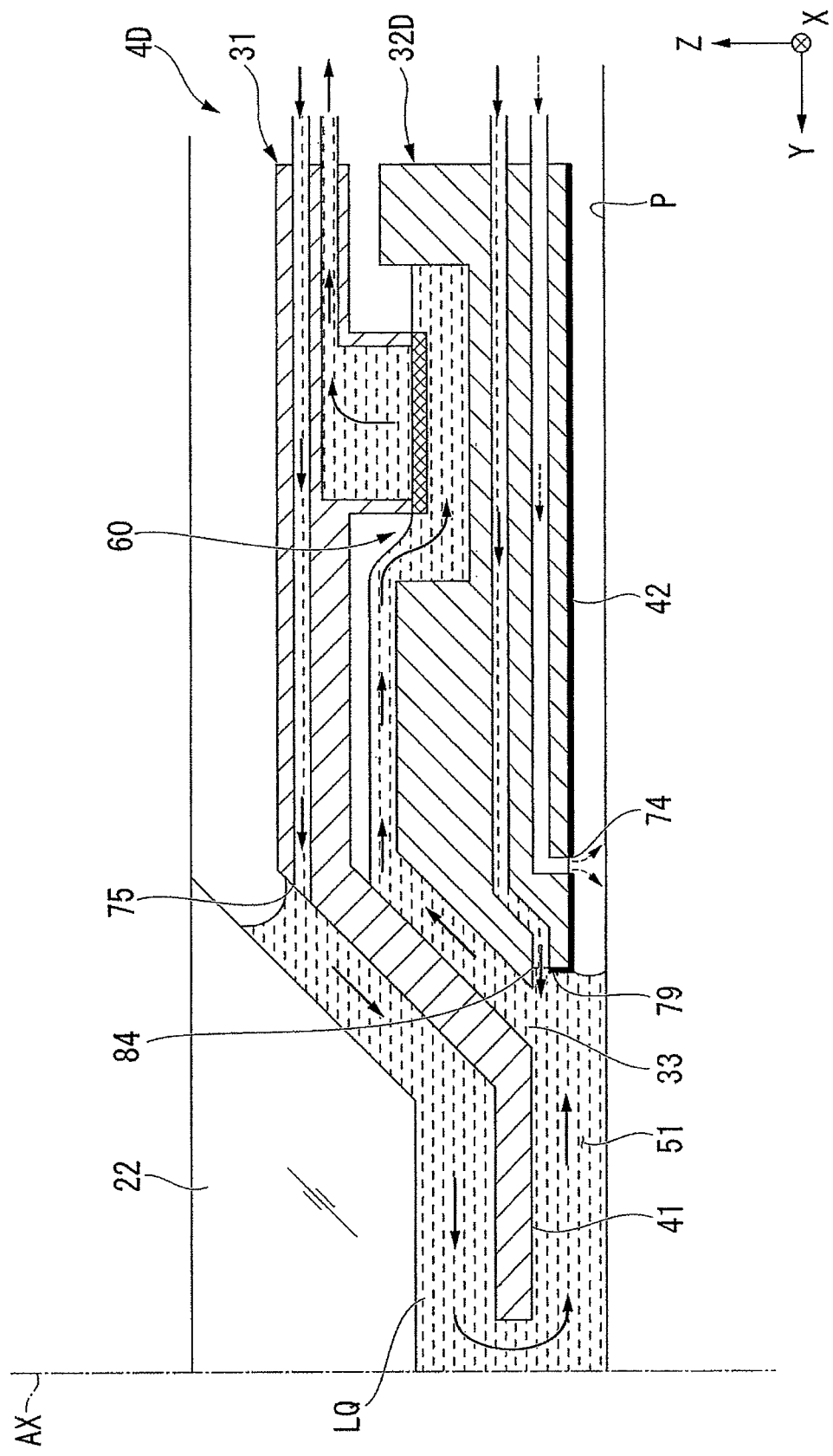
FIG. 8 is a diagram illustrating the vicinity of an immersion member according to a fourth embodiment of the invention.

FIG. 8 is a diagram illustrating an example of an immersion member 4D according to the fourth embodiment of the invention. In FIG. 8, the immersion member 4D includes a first member 31 having the first surface 41 and a second member 32D having the second surface 42. In this embodiment, the immersion member 4D includes a supply port 84 disposed at a position facing the first space 51 which the first surface 41 faces outside the first aperture 33 in the radial direction about the optical axis AX. The supply port 84 supplies the liquid LQ to the optical path of the exposure light EL. In this embodiment, the supply port 84 is disposed in the second member 32D. In this embodiment, the supply port 84 is disposed in the twelfth surface 79 extending to the upside (in the +Z direction) from the inner edge of the second surface 42.

In this embodiment, it is possible to form the immersion space LS reliably.

In this embodiment, the supply port 75 and the supply port 84 are both formed, but the supply port 75 may not be disposed.

In the second embodiment and the third embodiment, a supply port supplying the liquid LQ may be disposed in the second member having the second surface 42, similarly to this embodiment.

Fifth Embodiment

A fifth embodiment of the invention will be described below. The fifth embodiment is a modified example of the first embodiment. In the following description, the elements equal or equivalent to those of the above-mentioned embodiment are referenced by like reference numerals and signs, and are described in brief or are not repeatedly described.

Figure 9:
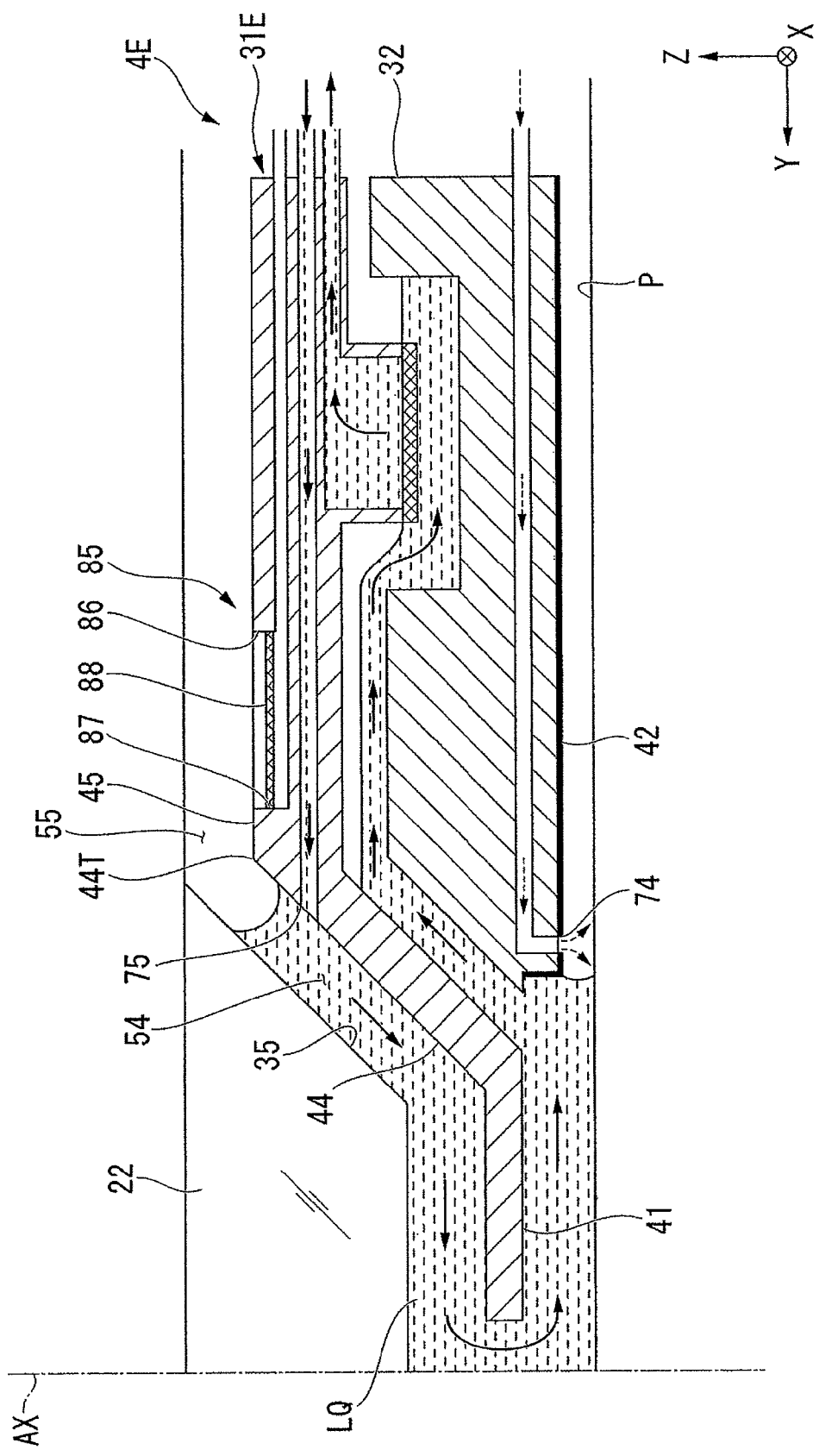
FIG. 9 is a diagram illustrating the vicinity of an immersion member according to a fifth embodiment of the invention.

FIG. 9 is a diagram illustrating an example of an immersion member 4E according to the fifth embodiment of the invention. In FIG. 9, the immersion member 4E includes a first member 31E having the first surface 41 and a second member 32 having the second surface 42. In this embodiment, the immersion member 4E includes a second recovery portion 85 recovering the liquid LQ overflowing from the fourth space 54 which the side surface 35 of the final optical element 22 faces. The second recovery portion 85 includes a second recess portion 86 disposed in the fifth surface 45 of the first member 31E and a recovery port 87 disposed inside the second recess portion 86. A porous member 88 is disposed in the recovery port 87. The second recovery portion 85 recovers the liquid LQ overflowing from the top end portion 44T defining the top end of the fourth space 54. A part of the fifth surface 45 between the top end portion 44T and the second recess portion 86 serves as a liquid guide portion guiding the liquid LQ overflowing from the top end portion 44T to the second recess portion 86. A part of the fifth surface 45 may not be formed between the top end portion 44T and the second recess portion 86. The second recovery portion 85 may not include the second recess portion 86. That is, the top end of the recovery port 87 (the top surface of the porous member 88) may be flush with the fifth surface 45.

According to this embodiment, the liquid LQ overflowing from the fourth space 54 is suppressed from leaking to the outside of the first member 31E in the radial direction about the optical axis AX. Accordingly, it is possible to suppress the occurrence of the exposure failure.

In the second to fourth embodiments, the second recovery portion recovering the liquid LQ overflowing from the fourth space 54 may be disposed in the first member, similarly to this embodiment.

Sixth Embodiment

A sixth embodiment of the invention will be described below. In the following description, the elements equal or equivalent to those of the above-mentioned embodiment are referenced by like reference numerals and signs, and are described in brief or are not repeatedly described.

Figure 10:
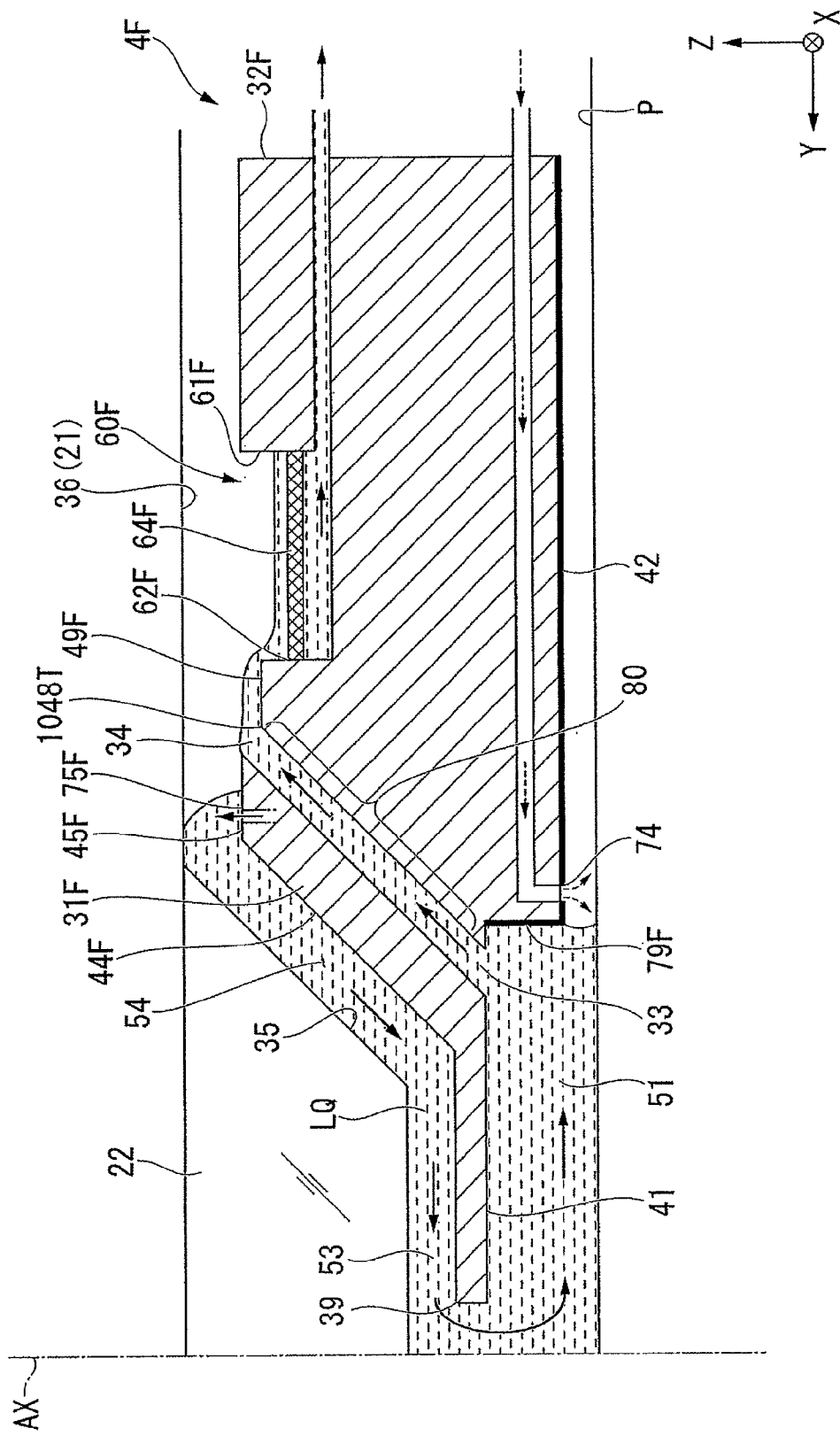
FIG. 10 is a diagram illustrating the vicinity of an immersion member according to a sixth embodiment of the invention.

FIG. 10 is a diagram illustrating an example of an immersion member 4F according to the sixth embodiment of the invention. In FIG. 10, the immersion member 4F includes a first member 31F having the first surface 41 and a second member 32F having the second surface 42.

In this embodiment, the second aperture 34 is disposed at a position facing the outer surface 36 of the holding member 21. The space which the outer surface 36 of the holding member 21 faces is opened to the atmosphere (the inner space 8) of the immersion member 4F and the space portion 80 is opened to the atmosphere around the immersion member 4F via the second aperture 34. The fourth space 54 which the side surface 35 faces is opened to the atmosphere around the immersion member 4F.

In this embodiment, a first recovery portion 60F recovering the liquid LQ from the space portion 80 includes a ninth surface 49F extending in the radial direction about the optical axis AX from a top end portion 1048T defining the top end of the space portion 80, a first recess portion 61F disposed outside the ninth surface 49F in the radial direction about the optical axis AX, a recovery port 62F disposed inside the first recess portion 61F, and a porous member 64F disposed in the recovery port 62F. In this embodiment, the ninth surface 49F is disposed at a position lower than the fifth surface 45F of the first member 31F and opposed to the outer surface 36. The first recess portion 61F is disposed lower than the ninth surface 49F.

In this embodiment, a supply port 75F is disposed in the fifth surface 45F of the first member 31F opposed to the outer surface 36. The liquid LQ supplied from the supply port 75F flows in the fourth space 54 and is then supplied to the first space 51 via the third space 53 and the aperture 39. At least a part of the liquid LQ in the first space 51 flows into the space portion 80 via the first aperture 33. The liquid LQ overflowing from the space portion 80 is recovered by the first recovery portion 60F.

In this embodiment, it is possible to reliably form the immersion space LS while recovering the liquid LQ from the space portion 80 so that the liquid LQ from the space portion 80 does not return to the optical path of the exposure light EL via the spaces 53 and 54.

Even when the liquid LQ overflows from the fourth space 54, the liquid LQ can be recovered by the first recovery portion 60F.

A supply port of the liquid LQ may be disposed in the fourth surface 44F of the first member 31F. The supply port disposed in the fourth surface 44F may be opposed to the side surface 35 or may not be opposed to the side surface 35.

The ninth surface 49F of the second member 32F may be disposed at the same height as (being flush with) the fifth surface 45F of the first member 31F.

As described in the second embodiment, the recovery port 62F (the porous member 64F) may be held by a member other than the first member 31F and the second member 32F, thereby facilitating the attachment and detachment (replacement) thereof.

As described in the fourth embodiment, instead of the supply port 75F or in addition to the supply port 75F, the supply port of the liquid LQ may be disposed in the twelfth surface 79F of the second member 32F.

A recovery portion recovering the liquid LQ overflowing from the fourth space 54 may be disposed in the fifth surface 45F of the first member 31F. In this way, by disposing the recovery portion of the liquid LQ in the fifth surface 45F, it is possible to recover the liquid LQ flowing from the space portion 80 to the fourth space 54.

Seventh Embodiment

A seventh embodiment of the invention will be described below. In the following description, the elements equal or equivalent to those of the above-mentioned embodiment are referenced by like reference numerals and signs, and are described in brief or are not repeatedly described.

Figure 11:
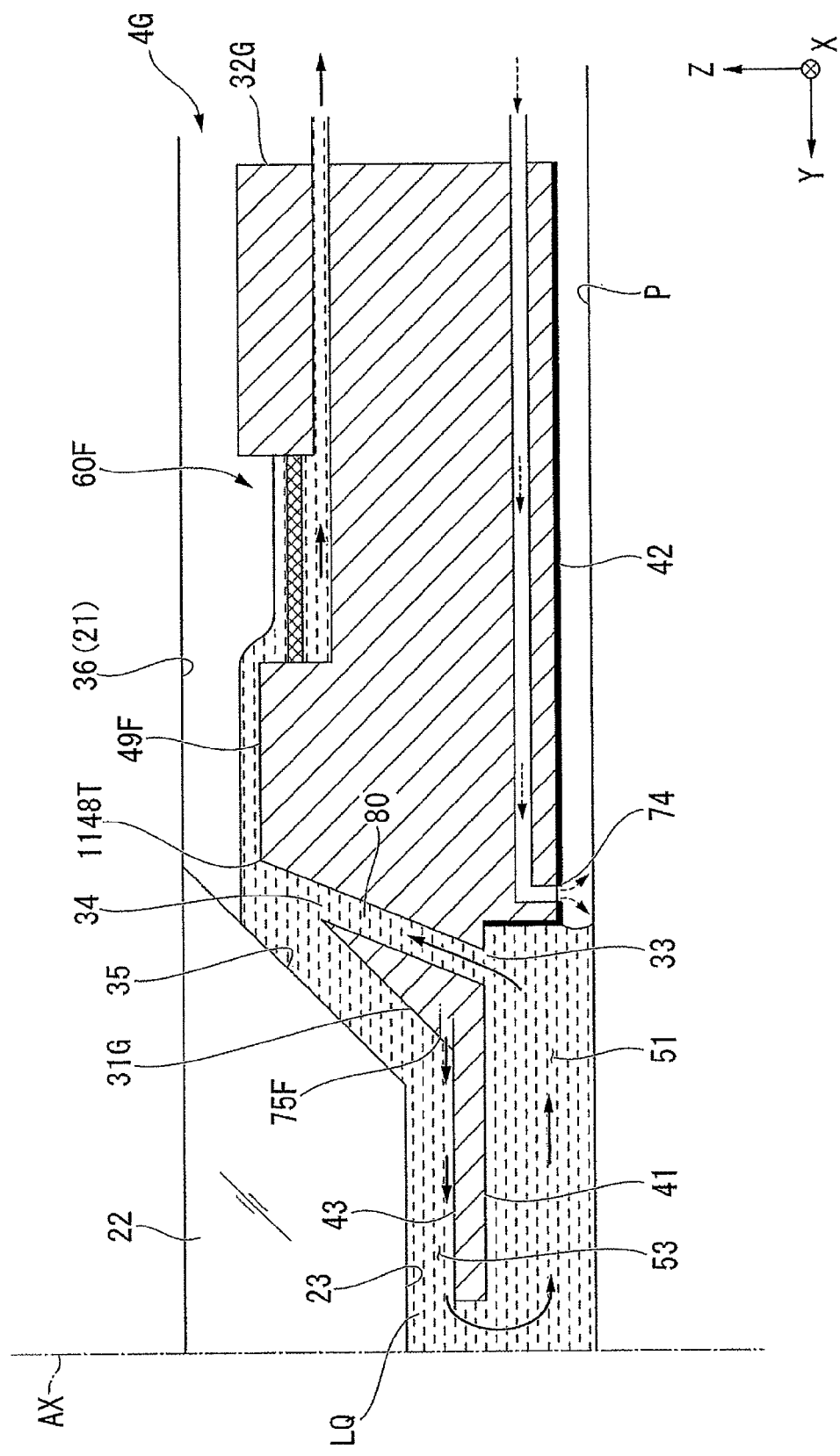
FIG. 11 is a diagram illustrating the vicinity of an immersion member according to a seventh embodiment of the invention.

FIG. 11 is a diagram illustrating an example of an immersion member 4G according to the seventh embodiment of the invention. In FIG. 11, the immersion member 4G includes a first member 31G having the first surface 41 and a second member 32G having the second surface 42.

The immersion member 4G according to this embodiment is a modified example of the immersion member 4F according to the sixth embodiment. Accordingly, the explanation described in the sixth embodiment is not repeated. As shown in FIG. 11, the seventh embodiment is different from the sixth embodiment, in that the second aperture 34 is disposed to face the side surface 35 and the supply port 75F supplying the liquid LQ faces to the third space 53 between the emission surface 23 and the third surface 43.

In this embodiment, the liquid LQ overflowing from the space portion 80 (the top end portion 1148T) is recovered by the first recovery portion 60F via the ninth surface 49F.

In this embodiment, it is possible to form the immersion space LS reliably.

Eighth Embodiment

An eighth embodiment of the invention will be described below. This embodiment is a modified example of the first embodiment. In the following description, the elements equal or equivalent to those of the above-mentioned embodiment are referenced by like reference numerals and signs, and are described in brief or are not repeatedly described.

Figure 12:
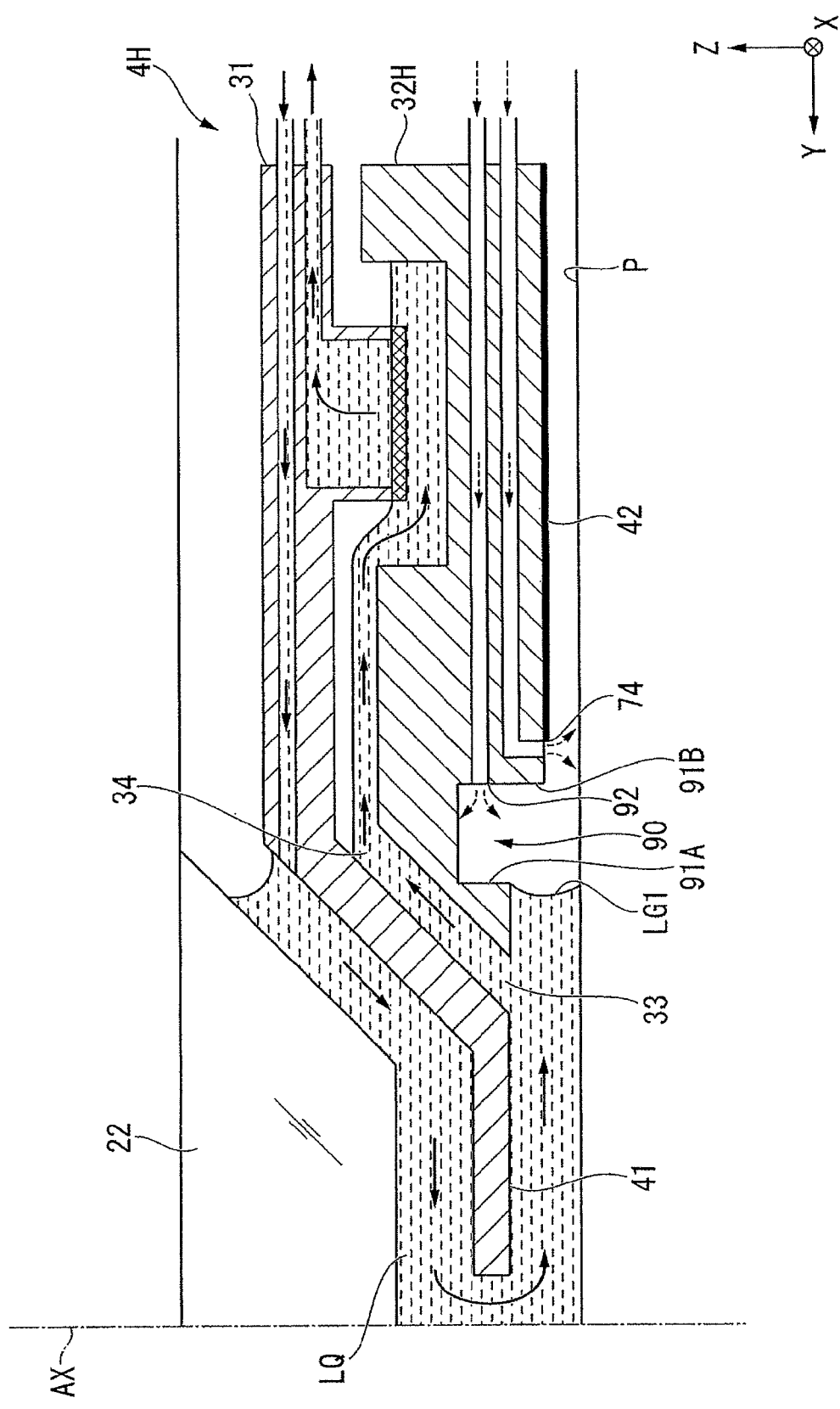
FIG. 12 is a diagram illustrating the vicinity of an immersion member according to an eighth embodiment of the invention.

FIG. 12 is a diagram illustrating an example of an immersion member 4H according to the eighth embodiment of the invention. In FIG. 12, the immersion member 4H includes a first member 31 having the first surface 41 and a second member 32H having the second surface 42.

In this embodiment, the immersion member 4H includes a second recess portion 90 disposed between the first aperture 33 and the second surface 42. In at least a part of the exposure of the substrate P, the second recess portion 90 is opposed to the surface of the substrate P.

The immersion member 4H includes a gas supply port 92 which is disposed in the inner surface defining the second recess portion 90 and which supplies a gas to the second recess portion 90 to enhance the pressure of the second recess portion 90. In this embodiment, the inner surface of the second recess portion 90 includes an inner surface 91A close to the optical axis AX and an inner surface 91B disposed outside the inner surface 91A about the optical axis AX. The gas supply port 92 is disposed in the inner surface 91B.

Since the second recess portion 90 having a high pressure is disposed outside the first aperture 33 in the radial direction about the optical axis AX, it is possible to suppress the extension of the immersion space LS. That is, the gas-liquid interface LG1 of the immersion space LS is formed between the bottom end of the inner surface 91A and the surface of the substrate P by the high-pressure space formed in the second recess portion 90, thereby suppressing the movement of the interface LG1 to the outside. Accordingly, it is possible to suppress the leakage of the liquid LQ.

In the second to seventh embodiments, the second recess portion 90 (high-pressure space) may be disposed between the first aperture 33 and the second surface 42, similarly to this embodiment.

Ninth Embodiment

A ninth embodiment of the invention will be described below. In the following description, the elements equal or equivalent to those of the above-mentioned embodiment are referenced by like reference numerals and signs, and are described in brief or are not repeatedly described.

Figure 13:
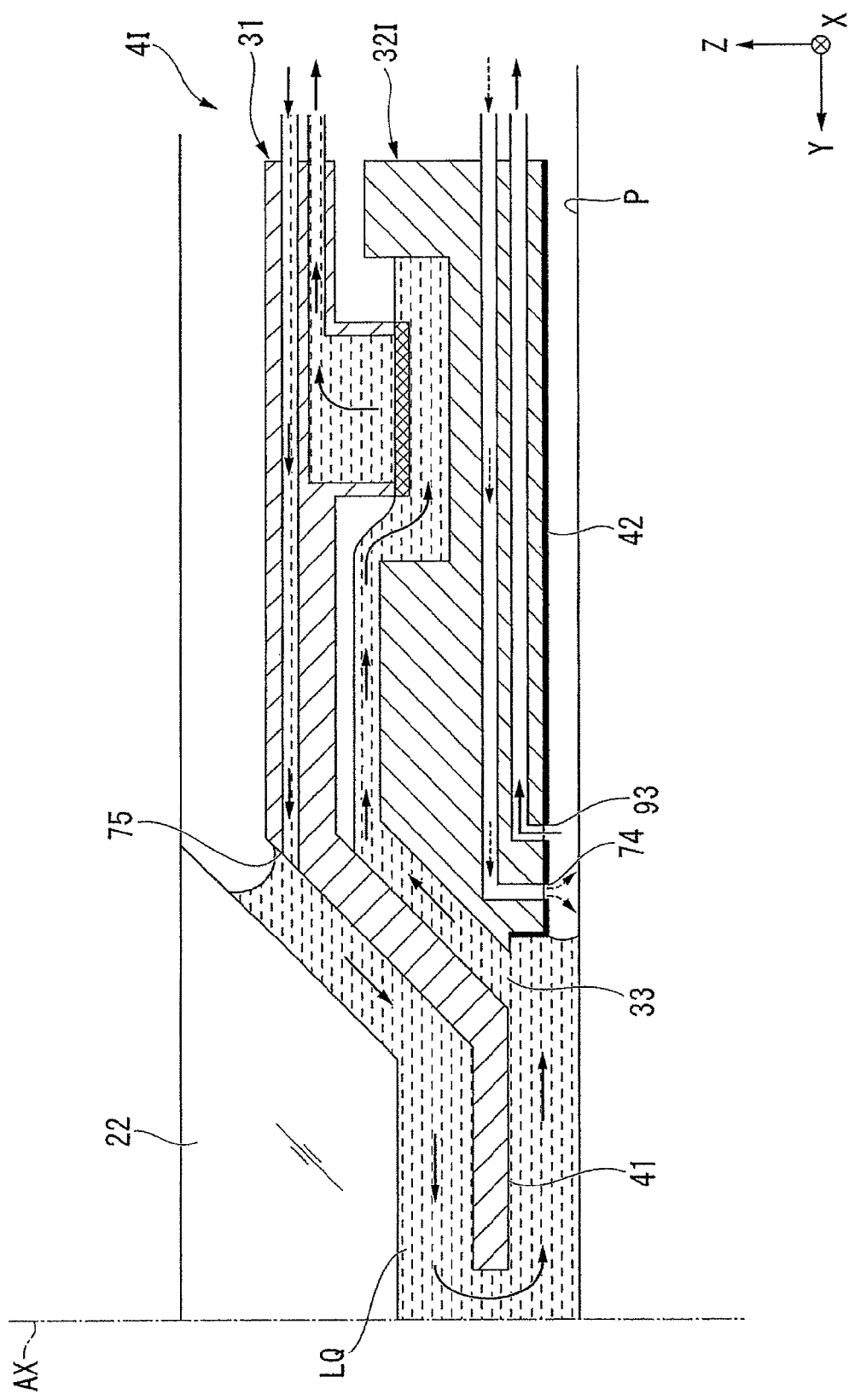
FIG. 13 is a diagram illustrating the vicinity of an immersion member according to a ninth embodiment of the invention.

FIG. 13 is a diagram illustrating an example of an immersion member 4I according to the ninth embodiment of the invention. In FIG. 13, the immersion member 4I includes a first member 31 having the first surface 41 and a second member 32I having the second surface 42.

The immersion member 4I includes a suction port 93 which is disposed outside the gas supply port 74 in the radial direction about the optical axis AX and which can suck at least one of the liquid LQ and the gas. The suction port 93 can connect a suction flow channel to a suction device including a vacuum system. The control apparatus 7 performs a suction operation using the suction port 93 in at least a part of the exposure of the substrate P.

Since the suction port 93 is disposed, it is possible to suck and recover the liquid LQ by the use of the suction port 93 even when the liquid LQ of the immersion space LS flows into the second space 52. Accordingly, it is possible to suppress the liquid LQ from flowing out of the second member 32I or to suppress the liquid LQ from remaining on the substrate P. The suction port 93 may be not used during the exposure of the substrate P and the suction port 93 may be used only when all the liquid LQ is recovered from the first space 51 below the first surface 41.

In the first to ninth embodiments, the porous member is disposed in the recovery port 62 and the like of the first recovery portion and the recovery port 87 of the second recovery portion and only the liquid LQ passes from one side to the other side of the porous member, but the recovery port may recover the liquid LQ along with the gas. The porous member may not be disposed in the recovery port.

In the above-mentioned embodiments, the first member 31 having the first surface 41 and the second member 32 having the second surface 42 may be relatively movable in the direction parallel to the optical axis AX and/or perpendicular to the optical axis AX. That is, at least one of the first member 31 and the second member 32 may be movably supported. For example, an actuator may be disposed in the second support mechanism 29 and the position of the second member 32 may be made to move with the driving force of the actuator. The second gap G2 can be adjusted by shifting the position of the second member 32 in the Z direction.

In the above-mentioned embodiments, the gas supply port 74 may not be provided.

In the above-mentioned embodiments, for example, when the movement of the interface LG1 of the liquid LQ can be suppressed by the gas from the gas supply port 74, the second surface 42 may not be disposed lower than the first surface 41.

In the above-mentioned embodiments, at least a part of the second surface 42 may not be lyophobic to the liquid LQ.

In the above-mentioned embodiments, when the space portion 80 can be opened to the atmosphere around the immersion member 4 via the second aperture 34 different from the first aperture 33, the first surface 41, the second surface 42, the space portion 80, and the like may be formed in a single member.

In the above-mentioned embodiments, the first surface 41 may not be disposed between the emission surface 23 and the substrate P. In this case, the first surface 41 may be flush with the emission surface 23 or may be disposed higher than the emission surface 23.

In the above-mentioned embodiments, the surface of the final optical element 22 through which the exposure light EL does not pass may not have the surface (side surface 35) extending upward (in the +Z direction) from the edge of the emission surface 23. For example, the surface of the final optical element 22 through which the exposure light EL does not pass may extend to be substantially parallel to the emission surface 23 (to be perpendicular to the optical axis AX).

Tenth Embodiment

Figure 14:
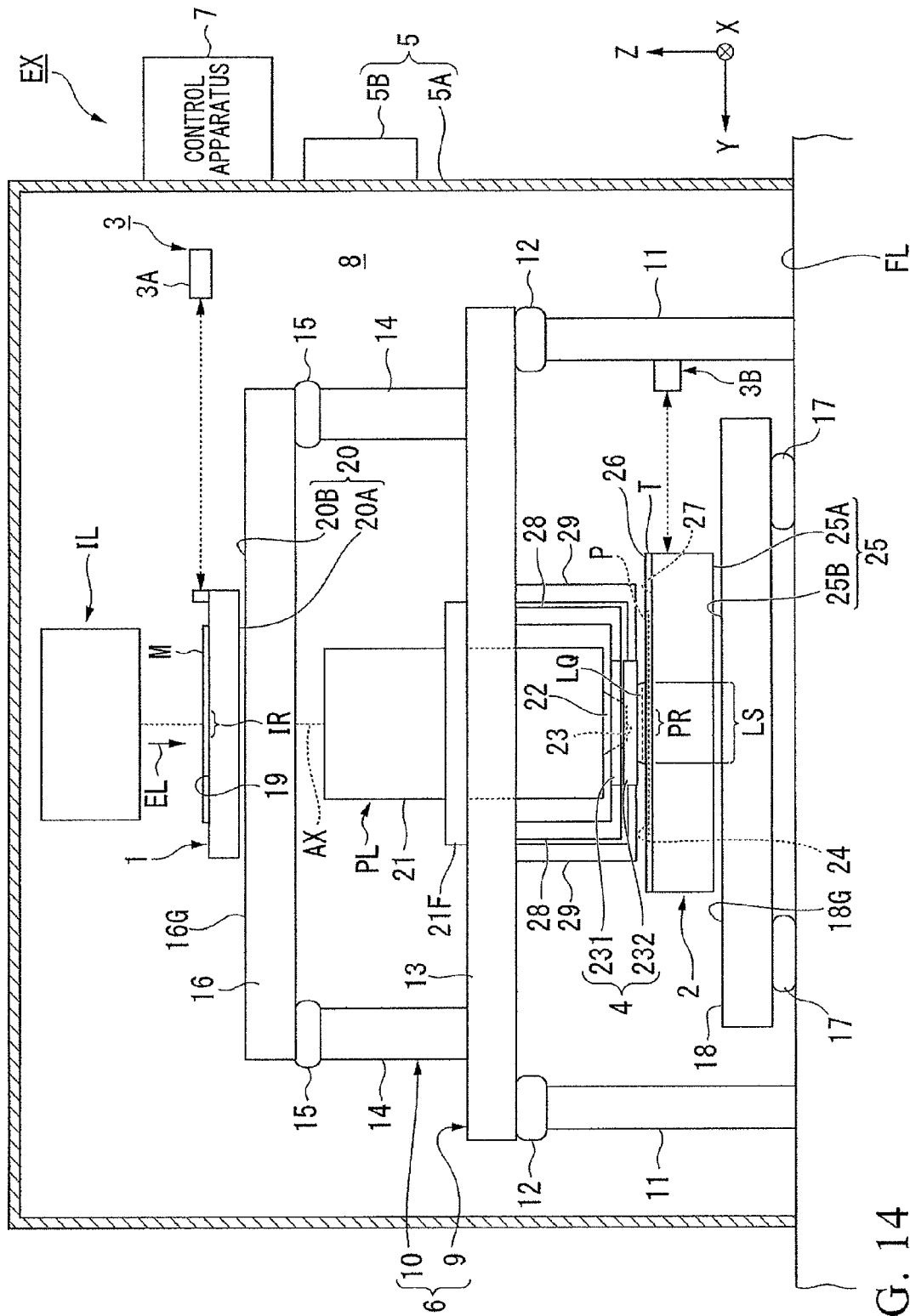
FIG. 14 is a diagram schematically illustrating a configuration of an exposure apparatus according to a tenth embodiment of the invention.

A tenth embodiment of the invention will be described below. FIG. 14 is a diagram schematically illustrating the configuration of an exposure apparatus EX according to the tenth embodiment of the invention. In the following description, the elements equal or equivalent to those of the above-mentioned embodiment are referenced by like reference numerals and signs, and are described in brief or are not repeatedly described.

As shown in FIG. 14, in this embodiment, the immersion member 4 includes a first member 231 and a second member 232. The first member 231 and the second member 232 are disposed in the vicinity of the final optical element 22. In this embodiment, the first member 231 is supported by a first support mechanism 28. The second member 232 is supported by a second support mechanism 29. In this embodiment, of the first and second support mechanisms 28 and 29 are supported by the first plate 13. In this embodiment, the first member 231 is suspended on the first plate 13 with the first support mechanism 28 interposed therebetween. The second member 232 is suspended on the first plate 13 with the second support mechanism 29 interposed therebetween.

Figure 15:
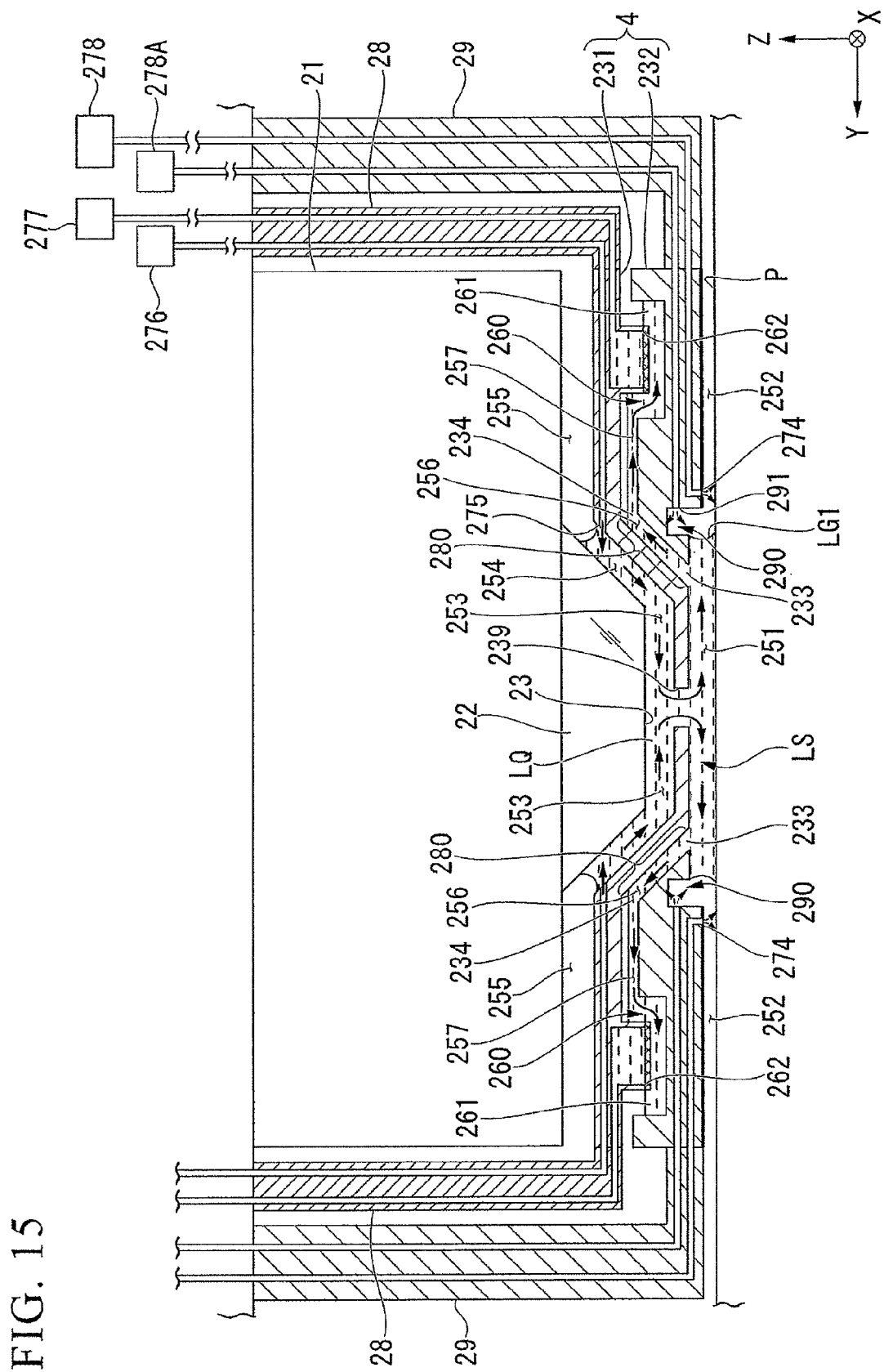
FIG. 15 is a partially enlarged view of the exposure apparatus according to the tenth embodiment of the invention.
Figure 16:
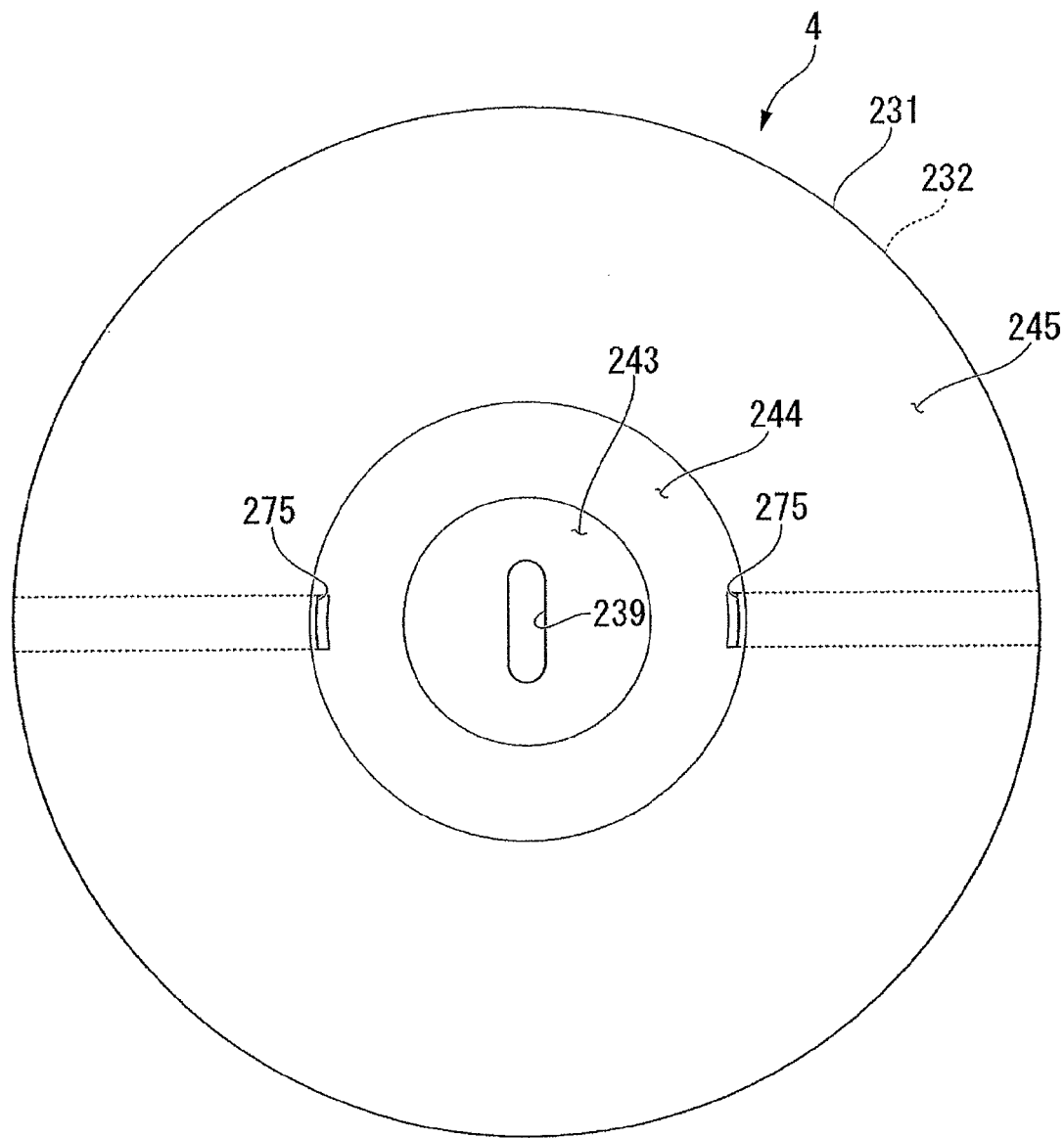
FIG. 16 is a top view of an immersion member according to the tenth embodiment as viewed from the upside.
Figure 17:
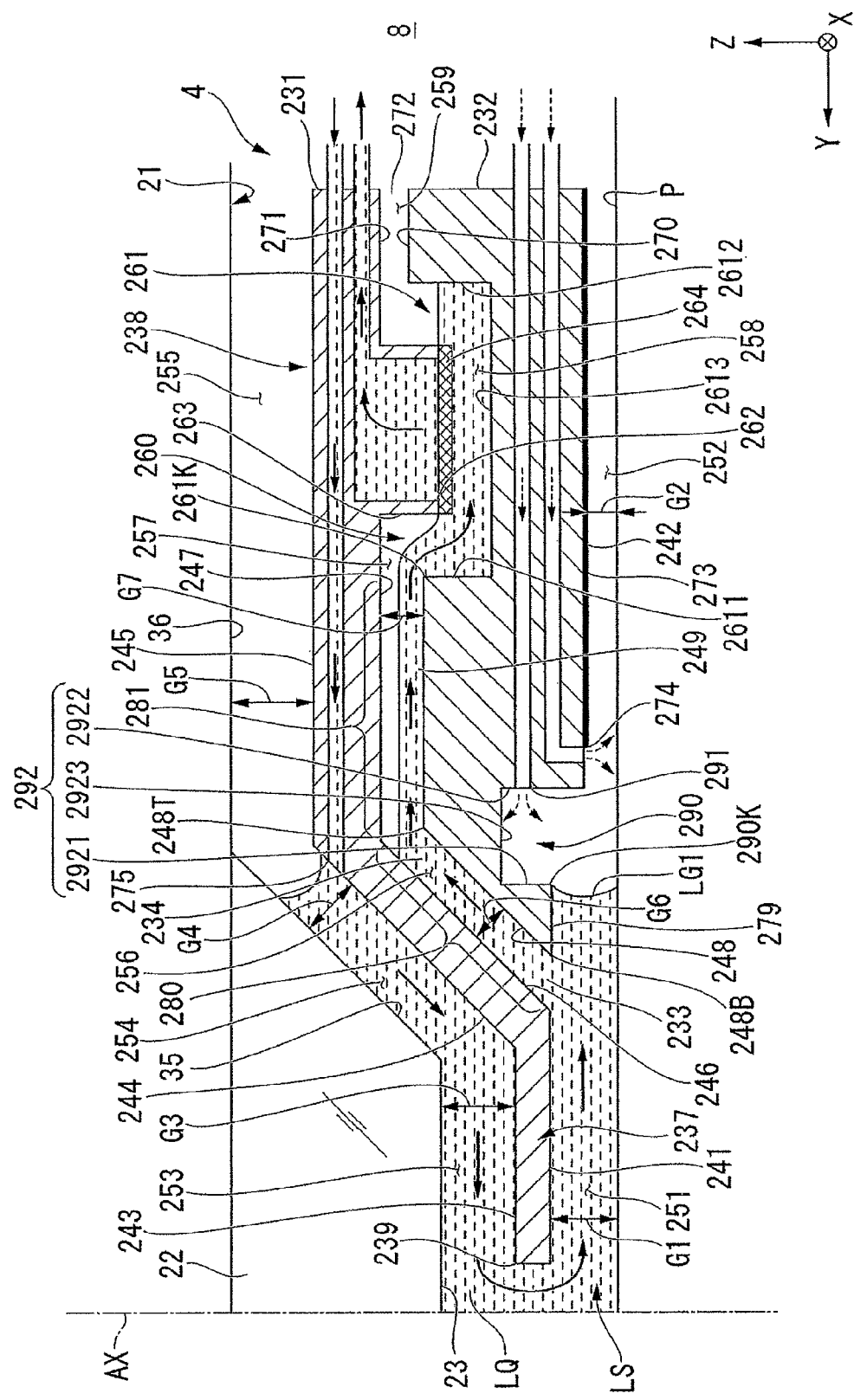
FIG. 17 is a diagram illustrating the vicinity of the immersion member according to the tenth embodiment of the invention.

FIG. 15 is a side sectional view of the vicinity of the immersion member 4, FIG. 16 is a top view of the immersion member 4, and FIG. 17 is a partially enlarged view of FIG. 15.

As shown in FIGS. 15, 16, and 17, in this embodiment, the first member 231 and the second member 232 are annular members. At least a part of the first member 231 is disposed in the vicinity of a partial optical path of the exposure light EL and the final optical element 22. At least a part of the second member 232 is disposed in the vicinity of the first member 231. As shown in FIG. 16, in this embodiment, the outer shapes of the first member 231 and the second member 232 in the XY plane are circular. The outer shapes of the first member 231 and the second member 232 may be other shapes (for example, rectangular).

The immersion member 4 includes a first surface 241 disposed in at least a part of a surrounding of the optical path of the exposure light EL emitted from the emission surface 23, a first recess portion 290 disposed in at least a part of a surrounding of the first surface 241, and a first gas supply port 291 which is disposed in an inner surface 292 defining the first recess portion 290 and which supplies a gas to enhance the pressure of the first recess portion 290.

In this embodiment, the immersion member 4 includes a second surface 242 disposed around the first recess portion 290 to face the same side as the first surface 241. The first surface 241 and the second surface 242 are directed in the −Z direction so as to be opposed to the surface of the substrate P. In this embodiment, the second surface 242 is disposed lower than the first surface 241 (in the Z direction).

In this embodiment, the outer shapes of the first surface 241 and the second surface 242 in the XY plane are circular. The inner edge of the second surface 242 in the XY plane is also circular. The shape of the first recess portion 290 in the XY plane is annular. Plural recess portions may be arranged around the first surface 241 with a predetermined gap as the first recess portion 290.

The immersion member 4 includes a space portion 280 into which the liquid LQ can flow from a first aperture 233 between the first surface 241 and the first recess portion 290 and which is opened to the atmosphere via a second aperture 234 different from the first aperture 233 and a recovery portion 260 recovering at least a part of the liquid LQ flowing into the space portion 280.

In this embodiment, the first surface 241 is disposed in the first member 231. The first recess portion 290 is disposed in the second member 232. The second surface 242 is disposed in the second member 232. The first surface 241, the first recess portion 290, and the second surface 242 can be opposed to the surface (top surface) of an object disposed below the immersion member 4.

In this embodiment, the first surface 241 and the second surface 242 cannot recover the liquid LQ. That is, in this embodiment, the first surface 241 and the second surface 242 are not provided with a liquid recovery port. The inner surface 292 cannot recover the liquid LQ. In this embodiment, the first surface 241 and the second surface 242 are flat. A first space 251 between the first surface 241 and the surface (top surface) of the object can hold the liquid LQ. In this embodiment, the first surface 241 and the second surface 242 are parallel to the XY plane (horizontal plane), but at least a part of the first surface 241 and/or the second surface 242 may be tilted about the XY plane or at least one of the first surface 241 and the second surface 242 may not be parallel to each other. In this embodiment, the first surface 241 and the second surface 242 may include a curved surface.

In at least a part of the exposure of the substrate P, the emission surface 23, the first surface 241, the first recess portion 290, and the second surface 242 are opposed to the surface of the substrate P. In at least a part of the exposure of the substrate P, the liquid LQ is filled in the space between the emission surface 23 and the surface of the substrate P. In at least a part of the exposure of the substrate P, the liquid LQ is held in the first space 251 between the first surface 241 and the surface of the substrate P. The substrate P is exposed with the exposure light EL from the emission surface 23 through the liquid LQ between the emission surface 23 and the surface of the substrate P.

In this embodiment, a part of the immersion space LS is formed by the liquid LQ held between the first surface 241 and the object. In this embodiment, the immersion space LS is formed so that a partial region of the surface of the substrate P including the projection region PR is covered with the liquid LQ when the substrate P is being illuminated with the exposure light EL. A gas-liquid interface (meniscus, edge) LG1 of the liquid LQ in the immersion space LS can be formed between the bottom surface of the immersion member 4 opposed to the surface of the substrate P and the surface of the substrate P, but is preferably formed between a twelfth surface 279 to be described later and the substrate P. The exposure apparatus EX according to this embodiment employs a local immersion method.

For the purpose of convenient explanation, it is assumed that the substrate P is disposed at a position opposed to the emission surface 23, the first surface 241, the first recess portion 290, and the second surface 242 and the liquid LQ is held between the immersion member 4 and the substrate P to form the immersion space LS. As described above, the immersion space LS can be formed between the emission surface 23 and the immersion member 4 and another member (such as the plate member T of the substrate stage 2).

As described above, in this embodiment, the first surface 241 and the second surface 242 are substantially parallel to the XY plane. As shown in FIG. 17, the first surface 241 is opposed to the surface of the substrate P with a first gap G1 interposed therebetween and the second surface 242 is opposed thereto with a second gap G2 interposed therebetween. The second gap G2 is smaller than the first gap G1.

In this embodiment, the first member 231 includes a first surface 241 opposed to the surface of the substrate P, a third surface 243 opposed to at least a part of the emission surface 23 and directed in the opposite direction of the first surface 241, a fourth surface 244 disposed around the third surface 243 and opposed to the side surface 35 of the final optical element 22, and a fifth surface 245 disposed around the fourth surface 244 and opposed to the outer surface 36 of the holding member 21. The first member 231 includes a plate portion 237 of which at least a part is opposed to the emission surface 23 and a body portion 238 of which at least a part is disposed around the final optical element 22. The first surface 241 and the third surface 243 are disposed in the plate portion 237. The plate portion 237 has an aperture 239 through which the exposure light EL emitted from the emission surface 23 can pass. During the exposure of the substrate P, the exposure light EL emitted from the emission surface 23 is applied to the surface of the substrate P via the aperture 239. As shown in FIG. 16, in this embodiment, the aperture 239 is longitudinal in the X axis direction intersecting the scanning direction (the Y axis direction) of the substrate P.

The third surface 243 is opposed to the emission surface 23 with a third gap G3 interposed therebetween. The fourth surface 244 is opposed to the side surface 35 with a fourth gap G4 interposed therebetween. The fifth surface 245 is opposed to the outer surface 36 with a fifth gap G5 interposed therebetween.

The side surface 35 of the final optical element 22 is a surface which is different from the emission surface 23 and through which the exposure light EL does not pass. The side surface 35 is disposed around the emission surface 23. The side surface 35 extends to the upside (in the +Z direction) from the edge of the emission surface 23. The side surface 35 extends in the radial direction (in the direction perpendicular to the optical axis AX) of the optical axis AX from the edge of the emission surface 23. That is, the side surface 35 is tilted to extend in the radial direction about the optical axis AX and to the upside.

The holding member 21 holds the final optical element 22. The outer surface 36 of the holding member 21 is disposed around the side surface 35. The outer surface 36 extends in the radial direction about the optical axis AX.

In this embodiment, the third surface 243 and the emission surface 23 are substantially parallel to each other. The fourth surface 244 and the side surface 35 are substantially parallel to each other. The fifth surface 245 and the outer surface 36 are substantially parallel to each other. The third surface 243 and the emission surface 23 may not be parallel to each other. The fourth surface 244 and the side surface 35 may not be parallel to each other. The fifth surface 245 and the outer surface 36 may not be parallel to each other.

The space between the final optical element 22 and the holding member 21, and the first member 231 includes a third space 253 defined by the emission surface 23 and the third surface 243, a fourth space 254 defined by the side surface 35 and the fourth surface 244, and a fifth space 255 defined by the outer surface 36 and the fifth surface 245. The fourth space 254 is a space tilted to extend in the radial direction about the optical axis AX, in the direction getting apart from the image plane of the projection optical system PL, and in the +Z direction. The fifth space 255 is a space to extend in the radial direction about the optical axis AX (in the direction perpendicular to the optical axis AX).

In this embodiment, the fourth surface 244 is opposed to the side surface 35 of the final optical element 22, but at least a part of the fourth surface 244 may be opposed to the outer surface of the holding member 21. In this embodiment, the fifth surface 245 is opposed to the outer surface 36 of the holding member 21, but at least a part of the fifth surface 245 may be opposed to the bottom surface of the final optical element 22 when the bottom surface of the final optical element 22 is exposed from the vicinity of the side surface 35 of the final optical element 22.

The fourth space 254 may be parallel to the optical axis AX. The fifth space 255 may not be perpendicular to the optical axis AX.

The first member 231 includes a sixth surface 246 disposed around the first surface 241 and a seventh surface 247 disposed around the sixth surface 246. The sixth surface 246 and the seventh surface 247 are disposed in the body portion 238. In this embodiment, the fourth surface 244 and the sixth surface 246 are substantially parallel to each other. The fifth surface 245 and the seventh surface 247 are substantially parallel to each other. The fourth surface 244 and the sixth surface 246 may not be parallel to each other. The fifth surface 245 and the seventh surface 247 may not be parallel to each other.

In this embodiment, the second member 232 includes a second surface 242 opposed to the surface of the substrate P, an eighth surface 248 opposed to the sixth surface 246, and a ninth surface 249 opposed to the seventh surface 247.

The eighth surface 248 is opposed to the sixth surface 246 with a sixth gap G6 interposed therebetween. The ninth surface 249 is opposed to the seventh surface 247 with a seventh gap G7 interposed therebetween. In this embodiment, the eighth surface 248 and the sixth surface 246 are substantially parallel to each other. The ninth surface 249 and the seventh surface 247 are substantially parallel to each other. The eighth surface 248 and the sixth surface 246 may not be parallel to each other. The ninth surface 249 and the seventh surface 247 may not be parallel to each other.

The space between the first member 231 and the second member 232 includes a sixth space 256 defined by the sixth surface 246 and the eighth surface 248 and a seventh space 257 defined by the seventh surface 247 and the ninth surface 249. The sixth space 256 is a space tilted to extend in the direction (in the +Z direction) getting apart from the image plane of the projection optical system PL. The seventh space 257 is a space extending in the radial direction about the optical axis AX (in the direction perpendicular to the optical axis AX). The sixth space 256 may be parallel to the optical axis AX. The seventh space 257 may not be perpendicular to the optical axis AX.

In this embodiment, the space portion 280 includes the sixth space 256. The bottom end of the space portion 280 (the sixth space 256) make a fluidic communication with the first space 251. The top end of the space portion 280 makes a fluidic communication with the seventh space 257. In this embodiment, a first aperture 233 is disposed at the bottom end of the space portion 280 and a second aperture 234 is disposed at the top end of the space portion 280. In this embodiment, the bottom end portion 248B of the eighth surface 248 defines the bottom end of the space portion 280. The top end portion 248T of the eighth surface 248 defines the top end of the space portion 280.

In at least a part of the exposure of the substrate P, the first aperture 233 is opposed to the surface of the substrate P. At least a part of the liquid LQ on the substrate P can be made to flow in the space portion 280 via the first aperture 233. In this embodiment, the first aperture 233 is substantially flush with the first surface 241. The first aperture 233 may not be directed to the downside (in the −Z direction). The first aperture 233 may be formed in an annular shape by an aperture or may be formed by plural apertures arranged in an annular shape with a predetermined gap. Similarly, the space portion 280 may be formed by plural space portions arranged in an annular shape with a predetermined gap around the optical axis AX.

The recovery portion 260 recovers the liquid LQ from the space portion 280. The recovery portion 260 recovers the liquid LQ overflowing from the space portion 280. At least a part of the recovery portion 260 is disposed outside the top end portion 248T in the radial direction about the optical axis AX.

In this embodiment, the recovery portion 260 includes a second recess portion 261 disposed to the upside (in the +Z direction) outside the space portion 280 in the radial direction about the optical axis AX. The second recess portion 261 includes an opening 261K directed to the upside. The recovery portion 260 recovers the liquid LQ flowing into the second recess portion 261 via the opening 261K.

The second recess portion 261 is disposed outside the top end portion 248T in the radial direction about the optical axis AX. In this embodiment, the second recess portion 261 is disposed around the ninth surface 249. In the XY plane, the second recess portion 261 has an annular shape. The second recess portion 261 may be formed by plural recess portions arranged in an annular shape with a predetermined gap. In this embodiment, the second member 232 includes a tenth surface 270 disposed around the second recess portion 261. The tenth surface 270 is substantially parallel to the XY plane. In this embodiment, the tenth surface 270 is flush with the ninth surface 249. The tenth surface 270 may be disposed higher than the ninth surface 249 (in the +Z direction).

The second recess portion 261 includes a first inner surface 2611 connected to the ninth surface 249, a second inner surface 2612 connected to the tenth surface 270 and opposed to the first inner surface 2611, and a bottom surface 2613 disposed between the first inner surface 2611 and the second inner surface 2612. The bottom surface 2613 is disposed lower than the top end portion 248T (in the −Z direction). In this embodiment, the bottom surface 2613 is substantially parallel to the XY plane. The bottom surface 2613 may not be parallel to the XY plane. For example, the bottom surface 2613 may be tilted about the XY plane. The bottom surface 2613 may include a curved surface.

The recovery portion 260 includes a liquid guide portion 281 guiding the liquid LQ from the space portion 280 to the second recess portion 261. In this embodiment, the liquid guide portion 281 includes the ninth surface 249. In this embodiment, the liquid guide portion 281 includes the seventh space 257. The liquid guide portion 281 extends in the radial direction about the optical axis AX from the top end portion 248T. In this embodiment, the liquid guide portion 281 is perpendicular to the optical axis AX (parallel to the XY plane), but may not be perpendicular to the optical axis AX. For example, the ninth surface 249 may be tilted to the downside from the top end portion 248T.

The second recess portion 261 is disposed outside the liquid guide portion 281 in the radial direction about the optical axis AX from the top end portion 248T. The liquid LQ overflowing from the top end of the space portion 280 is guided by the liquid guide portion 281 and flows in the second recess portion 261.

The second recess portion 261 can gather the liquid LQ from the space portion 280. The second recess portion 261 suppresses the liquid LQ from the space portion 280 from returning to the space portion 280, by collecting the flowing liquid LQ. That is, the second recess portion 261 at least serves as a part of a reservoir portion collecting the liquid LQ from the space portion 280 so as not to return to the space portion 280.

The recovery portion 260 includes a recovery port 262 recovering the liquid LQ flowing in the second recess portion 261. The recovery port 262 recovers the liquid LQ collected by the second recess portion 261.

In this embodiment, the recovery port 262 is opposed to the bottom surface 2613. In this embodiment, the recovery port 262 is disposed in the second recess portion 261. In other words, the recovery port 262 is disposed lower than the opening 261K of the second recess portion 261 (in the direction).

In this embodiment, the recovery port 262 has an annular shape in the XY plane. The recovery port 262 may be divided and disposed at plural position around the optical axis AX.

In this embodiment, the recovery port 262 is disposed in the first member 231. The first member 231 includes a convex portion 263 disposed around the seventh surface 247 to protrude downward. The recovery port 262 is disposed at the bottom end of the convex portion 263.

A porous member 264 is disposed in the recovery port 262. The porous member 264 is a plate-like member including plural openings or pores. The porous member 264 may be a mesh filter which is a porous member having plural small pores formed in meshes shapes.

In this embodiment, the outer surface of the convex portion 263 including the bottom surface of the porous member 264 and the inner surface of the second recess portion 261 including the bottom surface 2613, the first inner surface 2611, and the second inner surface 2612 are apart from each other. That is, an eighth space 258 is formed between the recess portion 263 and the second recess portion 261.

The first member 231 includes an eleventh surface 271 opposed to the tenth surface 270. A ninth space 259 between the tenth surface 270 and the eleventh surface 271 is opened to the atmosphere via the third aperture 272.

The space portion 280 is opened to the atmosphere via the second aperture 234. The second aperture 234 is connected to the third aperture 272 via the seventh space 257, the eighth space 258, and the ninth space 259. In this embodiment, the space portion 280 is opened to the atmosphere via the second aperture 234, the seventh, eighth, and ninth spaces 257, 258, and 259, and the third aperture 272. That is, the space portion 280 is opened to the space around the immersion member 4 via the second aperture 234 different from the first aperture 233. In other words, the space portion 280 is opened to the gas space coming in contact with the interface of the liquid LQ in the immersion space LS via the second aperture 234.

In this embodiment, the "atmosphere" is a gas surrounding the immersion member 4. In this embodiment, the gas surrounding the immersion member 4 is a gas in the inner space 8 formed by the chamber 5. In this embodiment, the chamber 5 fills the inner space 8 with a clean gas using the environment controller 5B. The chamber 5 adjusts the inner space 8 substantially to the atmospheric pressure using the environment controller 5B. The pressure of the inner space 8 may be set to be higher than the atmospheric pressure.

In this embodiment, the third space 253, the fourth space 254, and the fifth space 255 are also opened to the gas space (inner space 8) around the immersion member 4.

In this embodiment, the second surface 242 is lyophobic to the liquid LQ. In the second surface 242, a contact angle of the liquid LQ is equal to or greater than 90° and may be equal to or greater than 100°. In this embodiment, the second surface 242 is formed of a film 273 which is lyophobic to the liquid LQ. The film 273 is formed of, for example, a lyophobic material containing fluorine. Examples of the lyophobic material include PFA (Tetra Fluoro Ethyleneperfluoro alkylvinyl ether copolymer), PTFE (Poly Tetra Fluoro Ethylene), PEEK (PolyEtherEtherKetone), and Teflon (registered trademark).

In this embodiment, the second member 232 has a twelfth surface 279 disposed between the first aperture 233 and the first recess portion 290 to face the same direction as the first surface 241. The twelfth surface 279 is directed in the −Z direction so as to be opposed to the surface of the substrate P. In this embodiment, the twelfth surface 279 is a flat portion disposed substantially in the same plane as the first surface 241. The twelfth surface 279 may be disposed lower than the first surface 241. The twelfth surface 279 may be tilted about the XY plane or may include a curved surface.

The first recess portion 290 has an opening 290K directed to the downside. The inner surface 292 defining the first recess portion 290 includes a first inner surface 2921 connected to the twelfth surface 279, a second inner surface 2922 of which at least a part is opposed to the first inner surface 2921 and which is connected to the second surface 242, and a top surface 2923 disposed between the first inner surface 2921 and the second inner surface 2922. The top surface 2923 is directed to the downside (the −Z direction). The top surface 2923 is disposed higher than the bottom end portion 248B (in the +Z direction). In this embodiment, the top surface 2923 is substantially parallel to the XY plane. The top surface 2923 may not be parallel to the XY plane. For example, the top surface 2923 may be tilted about the XY plane. The top surface 2923 may include a curved surface.

The first gas supply port 291 is disposed in the second inner surface 2922. The first gas supply port 291 supplies a gas to the inside of the first recess portion 290. In this embodiment, the first gas supply port 291 plural apertures arranged in the second inner surface 2922 with a predetermined gap around the optical axis AX and supplies the gas from the plural apertures. The first gas supply port 291 supplies the gas to the inside of the first recess portion 290 to set the pressure of the first recess portion 290 to be higher than the pressure of the atmosphere (the atmospheric pressure in this embodiment).

In this embodiment, the immersion member 4 includes a second gas supply port 274 disposed in at least a part of a surrounding of the first recess portion 290. In this embodiment, the second gas supply port 274 is disposed in the second surface 242. The second gas supply port 274 supplies a gas to the surface of the object (substrate P) opposed to the second surface 242.

In this embodiment, the gas supply port 274 has an annular shape in the XY plane. The gas supply port 274 may be divided and arranged at plural positions around the optical axis AX.

In this embodiment, the immersion member 4 includes a supply port 275 supplying the liquid LQ to the optical path of the exposure light EL. The supply port 275 is disposed at a position opposed to a surface of the final optical element 22 through which the exposure light EL does not pass. In this embodiment, the supply port 275 is disposed at the position opposed to the side surface 35 of the final optical element 22. The supply port 275 may not be opposed to the surface of the final optical element 22. For example, the supply port 275 may be disposed in the first member 231 so as to face the third space 253 between the third surface 243 and the emission surface 23.

As shown in FIG. 16, in this embodiment, the supply ports 275 are disposed on the +Y side and −Y side about the optical axis AX, respectively. The supply ports 275 may be disposed on the +X side and −X side about the optical axis AX, respectively. The number of supply ports 275 may be equal to or greater than 3.

In this embodiment, the supply port 275 supplies the liquid LQ to the fourth space 254. The liquid LQ supplied to the fourth space 254 flows downward in the fourth space 254 and is supplied to the optical path of the exposure light EL emitted from the emission surface 23 via the third space 253. At least a part of the liquid LQ supplied from the supply port 275 to the third space 253 via the fourth space 254 is supplied to the first space 251 via the aperture 239.

As shown in FIG. 15, the supply port 275 is connected to a liquid supply device 276 via a supply flow channel. In this embodiment, the supply flow channel includes a flow channel formed in the first member 231 and a flow channel formed in the first support mechanism 28. The liquid supply device 276 can supply the clean liquid LQ adjusted in temperature to the supply port 275. A part of the supply flow channel may not be disposed in the first support mechanism 28 supporting the first member 231.

The recovery port 262 is connected to a liquid recovering device 277 via a recovery flow channel. In this embodiment, the recovery flow channel includes a flow channel formed in the first member 231 and a flow channel formed in the first support mechanism 28. The liquid recovering device 277 includes a vacuum system (such as a valve controlling a connection state between a vacuum source and the recovery port 262) and can suck and recover the liquid LQ from the recovery port 262. By connecting the recovery port 262 to the liquid recovering device 277 including a vacuum source, the liquid LQ is recovered from the recovery port 262. A part of the recovery flow channel may not be disposed in the first support mechanism 28 supporting the first member 231.

The first gas supply port 291 is connected to a gas supply device 278A via a gas supply channel. In this embodiment, the gas supply channel includes a flow channel formed in the second member 232 and a flow channel formed in the second support mechanism 29. The gas supply device 278A can supply a clean gas adjusted in temperature and humidity to the first gas supply port 291. The humidity of the gas supplied from the first gas supply port 291 is preferably higher than the humidity of the gas supplied to the inner space 8 by the environment controller 5B. Accordingly, it is possible to suppress the vaporization of the liquid LQ in the interface LG. A part of the gas supply channel may not be disposed in the second support mechanism 29 supporting the second member 232.

The second gas supply port 274 is connected to a gas supply device 278B via a gas supply channel. In this embodiment, the gas supply channel includes a flow channel formed in the second member 232 and a flow channel formed in the second support mechanism 29. The gas supply device 278B can supply a clean gas adjusted in temperature and humidity to the second gas supply port 274. The humidity of the gas supplied from the second gas supply port 274 is preferably higher than the humidity of the gas supplied to the inner space 8 by the environment controller 5B. A part of the gas supply channel may not be disposed in the second support mechanism 29 supporting the second member 232.

The humidity of the gas supplied from the first gas supply port 291 is preferably substantially equal to higher than the humidity of the gas supplied from the second supply port 292.

At least one of the humidity of the gas supplied from the first gas supply port 291 and the humidity of the gas supplied from the second supply port 292 may be substantially equal to the humidity of the gas supplied to the inner space 8 by the environment controller 5B.

The control apparatus 7 can control the liquid recovering device 277 to control a difference in pressure between at the bottom surface and at the top surface of the porous member 264 so that only the liquid LQ passes from the lower space (the eighth space 258) of the porous member 264 to the upper space (recovery flow channel). In this embodiment, the pressure of the eighth space 258 on the lower side is opened to the atmosphere and is controlled by the chamber 5. The control apparatus 7 controls the liquid recovering device 277 so that only the liquid LQ passes from the bottom surface of the porous member 264 to the top surface thereof and adjusts the pressure on the top surface side on the basis of the pressure on the bottom surface side. That is, the control apparatus 7 makes a control so as to recover only the liquid LQ from the eighth space 258 via the pores of the porous member 264 and so as for the gas not to pass through the pores of the porous member 264. The technique of adjusting the difference in pressure between at one side and at the other side of the porous member 264 so as to pass only the liquid LQ from one side of the porous member 264 to the other side is disclosed, for example, in the specification of U.S. Pat. No. 7,292,313.

A method of exposing the substrate P using the exposure apparatus EX having the above-mentioned configuration will be described now.

First, the control apparatus 7 moves the substrate stage 2 holding the substrate P so as to oppose the emission surface 23, the first surface 241, and the first recess portion 290, and the second surface 242 to the surface of the substrate P (or the top surface 26 of the substrate stage 2). The first surface 241 and the surface of the substrate P are opposed to each other with the first gap G1 interposed therebetween and the second surface 242 and the surface of the substrate P are opposed to each other with the second gap G2 interposed therebetween.

The control apparatus 7 sends out the liquid LQ from the liquid supply device 276 in the state where the first surface 241 and the second surface 242 are opposed to the surface of the substrate P. The control apparatus 7 activates the liquid recovering device 277. The control apparatus 7 activates the gas supply devices 278A and 278B.

The liquid LQ sent from the liquid supply device 276 is supplied to the fourth space 254 from the supply port 275. The liquid LQ supplied to the fourth space 254 flows downward in the fourth space 254 and is then supplied to the optical path of the exposure light EL emitted from the emission surface 23 via the third space 253. Accordingly, the optical path of the exposure light EL is filled with the liquid LQ.

At least a part of the liquid LQ supplied to the third space 253 from the supply port 275 via the fourth space 254 is supplied to the first space 251 via the aperture 239 and is held between the first surface 241 and the surface of the substrate P.

At least a part of the liquid LQ supplied to the first space 251 from the aperture 239 flows into the space portion 280 via the first aperture 231.

In this embodiment, the liquid LQ supplied to the first space 251 via the aperture 239 is suppressed from flowing into the space outside the twelfth surface 279 in the radial direction about the optical axis AX. That is, in this embodiment, the interface LG1 of the liquid LQ in the immersion space LS in the XY plane is suppressed from moving to the outside, thereby suppressing the extension of the immersion space LS.

In this embodiment, the gas is supplied to the first recess portion 290 disposed around the first surface 241 from the first gas supply port 291 and the pressure of the first recess portion 290 increases, whereby a high-pressure space is formed below the first recess portion 290. Since the high-pressure space is disposed around the interface LG1 of the liquid LQ held between the first surface 241 and the surface of the substrate P to form the immersion space LS, it is possible to suppress the extension of the immersion space LS. That is, the movement of the interface LG1 to the outside is restricted by the high-pressure space formed by the first recess portion 290. In this embodiment, the position of the interface LG1 is held between the twelfth surface 279 and the surface of the substrate P by the high-pressure space, as shown in FIG. 17 and the like. Accordingly, it is possible to suppress the leakage of the liquid LQ.

In this embodiment, the second inner surface 2922 connected to the inner edge of the second surface 242 and disposed to face the optical path is provided. The size of the second inner surface 2922 in the Z axis direction is greater than the size of the first inner surface 2911. That is, the lower end of the second inner surface 2922 is disposed on the −Z side (closer to the substrate P) of the first surface 241. Accordingly, it is possible to suppress the leakage of the gas from the lower space of the first recess portion 290 and to hold the high-pressure space outside the interface LG1 so as to suppress the leakage of the liquid LQ.

In this embodiment, the gas supply port 274 is disposed and the gas is supplied to the surface of the substrate P on the outside of the inner edge of the second surface 242 about the optical axis AX. Accordingly, the leakage of the gas from the space below the first recess portion 290 by the gas supplied from the gas supply port 274. That is, the gas supply port 274 forms a gas seal between the surface of the substrate P and the second surface 242. Accordingly, the high-pressure space can be held below the first recess portion 290 and thus the movement of the interface LG1 to the outside is restricted.

In this embodiment, the first surface 241 is opposed to the surface of the substrate P with the first gap G1 interposed therebetween and the second surface 242 disposed around the first surface 241 is opposed to the surface of the substrate P with the second gap G2 interposed therebetween. The second gap G2 is smaller than the first gap G1 and is, for example, about in the range of 0.1 to 0.3 mm. Accordingly, even when the liquid LQ leaks out of the space below the twelfth surface 279, the liquid LQ is suppressed from flowing out of the first recess portion 290.

In this embodiment, since the second surface 242 is lyophobic to the liquid LQ, the liquid LQ is suppressed from leaking.

In this embodiment, the shape of the first recess portion 290 in the XY plane is annular (in a ring shape) and the high-pressure space formed by the first recess portion 290 is also annular. Accordingly, the binding force acting to the center from all the sides of the interface LG1 of the immersion space LS almost uniformly acts. Accordingly, the extension of the immersion space LS is effectively suppressed.

By supplying the liquid LQ from the supply port 275 in the state where the extension of the immersion space LS formed by the liquid LQ flowing into the first space 251 via the aperture 239 is suppressed, the liquid LQ flows into the space portion 280 opened to the atmosphere and the position of the surface of the liquid LQ in the space portion 280 moves in the +Z direction (rises). When the space portion 280 is filled with the liquid LQ, at least a part of the liquid LQ in the space portion 280 overflows from the top end (the top end portion 248T) of the space portion 280. The liquid LQ overflowing from the space portion 280 is recovered by the recovery portion 260 disposed outside the top end of the space portion 280.

The liquid LQ overflowing from the space portion 280 is guided by the liquid guide portion 281 and then flows into the second recess portion 261. The liquid LQ flowing into the second recess portion 261 is collected in the second recess portion 261.

Figure 18A:
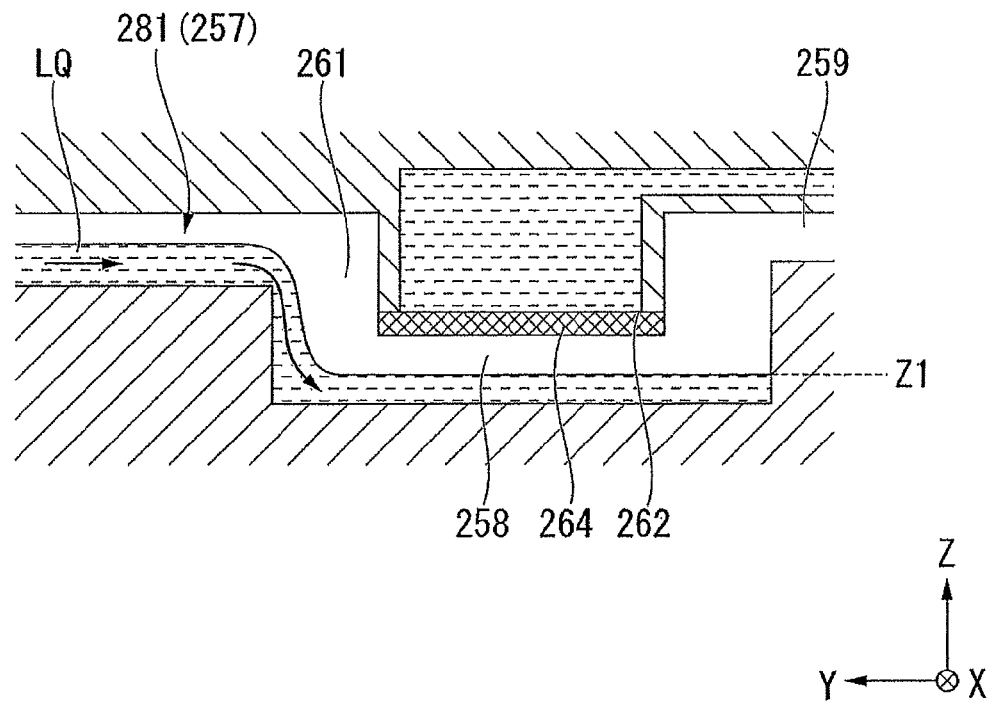
FIG. 18A is a diagram illustrating the vicinity of a recovery portion according to the tenth embodiment of the invention.
Figure 18B:
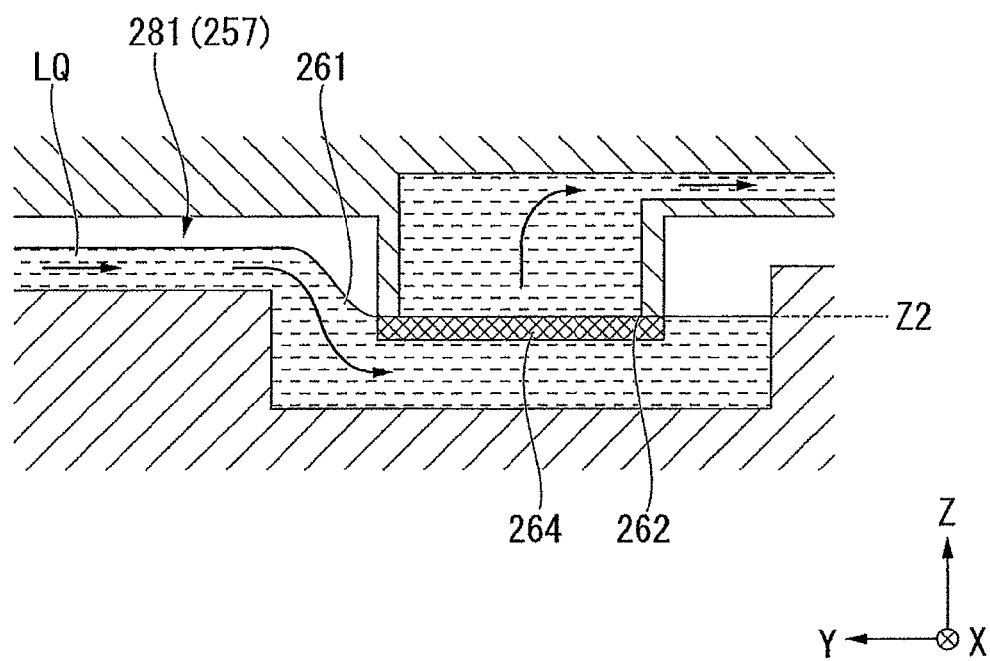
FIG. 18B is a diagram illustrating the vicinity of a recovery portion according to the tenth embodiment of the invention.

FIG. 18A shows a state where the surface of the liquid LQ in the second recess portion 261 is located at a first position Z1 and FIG. 18B shows a state where the surface of the liquid LQ is located at a second position Z2. As shown in FIG. 18A, for example, in the state where the surface of the liquid LQ is located at the first position Z1 and the liquid LQ does not come in contact with the recovery port 262 (the porous member 264), the second aperture 234 is opened to the atmosphere via the seventh, eighth, and ninth spaces 257, 258, and 259 and the third aperture 272. Accordingly, the liquid LQ in the first space 251 smoothly flows into the space portion 280 via the first aperture 233. The liquid LQ flowing into the space portion 280 and overflowing from the space portion 280 smoothly flows into the second recess portion 261. The amount of the liquid LQ collected in the second recess portion 261 slowly increases.

As shown in FIG. 18B, when the amount of the liquid LQ collected in the second recess portion 261 increases, the surface of the liquid LQ reaches the second position Z2, and the liquid LQ comes in contact with the recovery port 262 (the porous member 264), the liquid LQ collected in the second recess portion 261 is recovered from the recovery port 262 (the porous member 264). When the liquid LQ is recovered from the recovery port 262, the amount of the liquid LQ in the second recess portion 261 decreases and the position of the surface of the liquid LQ in the second recess portion 261 moves in the −Z direction (drops). When the liquid LQ flows into the second recess portion 261 from the space portion 280, the amount of the liquid LQ in the second recess portion 261 increases again, the liquid LQ comes in contact with the porous member 264, and the liquid LQ is recovered from the recovery port 262.

In this embodiment, since the difference in pressure between at the bottom surface side and at the top surface side of the porous member 264 is controlled so that only the liquid LQ passes from the bottom surface to the top surface of the porous member 264, the recovery portion 260 can recover the liquid LQ while suppressing the vibration and the vaporization heat from being generated.

In this embodiment, since the recovery portion 260 collects the liquid LQ on the substrate P recovered via the first aperture 233 and the space portion 280 into the second recess portion 261, it is possible to suppress the liquid LQ recovered via the space portion 280 from returning to the space portion 280. The recovery portion 260 recovers the liquid LQ collected greater than a predetermined amount in the second recess portion 261 by the use of the recovery port 262. Accordingly, it is possible to satisfactorily suppress the liquid LQ recovered via the space portion 280 from returning to the space portion 280. Since the liquid LQ from the space portion 280 is collected in the second recess portion 261 so that the liquid LQ recovered via the space portion 280 does not return to the space portion 280, the liquid LQ coming into contact with the porous member 264 is suppressed from returning to the first space 251 and the optical path of the exposure light EL via the space portion 280.

A method of exposing the substrate P will be described now. As described above, the control apparatus 7 supplies the liquid LQ from the supply port 275 and holds the liquid LQ between the first surface 241 and the surface of the substrate P so as to fill the optical path of the exposure light EL with the liquid LQ, thereby forming the immersion space LS. At least a part of the liquid LQ on the substrate P flows into the space portion 280 via the first aperture 233. The recovery portion 260 collects the liquid LQ from the space portion 280 in the second recess portion 261 and recovers the liquid LQ reaching a predetermined amount in the second recess portion 261 by the use of the recovery port 262. The control apparatus 7 performs a liquid recovering operation using the recovery portion 260 along with a liquid supply operation using the supply port 275 and forms the immersion space LS so as to fill the optical path of the exposure light EL with the liquid LQ. The control apparatus 7 forms a high-pressure space around the interface LG1 by supplying the gas from the first gas supply port 291 to enhance the pressure of the first recess portion 290. The control apparatus 7 continuously supplies the gas from the second gas supply port 274 to form the gas seal.

The control apparatus 7 collects at least a part of the liquid LQ on the substrate P into the second recess portion 261 via the space portion 280 from the first aperture 233 and starts the exposure of the substrate P while suppressing the liquid LQ recovered from the space portion 280 by the recovery portion 260 from returning to the space portion 280 and restricting the extension of the immersion space LS using the second gap G2 or the like.

The control apparatus 7 controls the illumination system IL to emit the exposure light EL and illuminates the mask M with the exposure light EL. The exposure light EL from the mask M is emitted from the emission surface 23 of the projection optical system PL. The control apparatus 7 illuminates the substrate P with the exposure light EL from the emission surface 23 via the liquid LQ between the emission surface 23 and the substrate P. Accordingly, the pattern image of the mask M is projected to the substrate P and the substrate P is exposed with the exposure light EL. During the exposure of the substrate P, the liquid LQ supplied from the supply port 275 flows via the first aperture 233 and is recovered by the recovery portion 260 via the space portion 280.

As described above, in this embodiment, the gas is supplied from the first gas supply port 291 disposed in the inner surface 292 defining the first recess portion 290 to form the high-pressure space around the immersion space LS. Accordingly, for example, even when the substrate P is moved in the state where the immersion space LS is formed, the space between the projection optical system PL and the substrate P can be reliably filled with the liquid LQ. It is possible to suppress the leakage or remaining of the liquid LQ. Accordingly, it is possible to prevent the occurrence of the exposure failure and the generation of a defective device.

As described above, in this embodiment, since the space portion 280 opened to the atmosphere is disposed and the liquid LQ flowing into the space portion 280 is recovered by the recovery portion 260, it is possible to simplify the structure of the bottom surface of the immersion member 4 opposed to the surface of the substrate P. Accordingly, it is possible to suppress foreign materials from being attached to the bottom surface of the immersion member 4 coming in contact with the liquid LQ or to suppress the bottom surface from being contaminated.

In this embodiment, the space portion 280 (the sixth space 256) and the liquid guide portion 281 (the seventh space 257) forming the flow channel through which the liquid LQ flowing through the first aperture 233 flows are formed between the first member 231 and the second member 232 which can be separated. Accordingly, it is possible to smoothly and reliably clean the sixth surface 246 of the first member 231 and the eighth surface 248 of the second member 232 forming the space portion 280 and the seventh surface 247 of the first member 231 and the ninth surface 249 of the second member 232 forming the liquid guide portion 281.

In this embodiment, the recovery portion 260 is constructed so that the liquid LQ recovered from the space portion 280 does not return to the space portion 280. That is, the liquid LQ from the space portion 280 is collected in the second recess portion 261. Accordingly, for example, when the porous member 264 of the recovery portion 260 is contaminated, it is possible to suppress the liquid LQ coming into contact with the porous member 264 (the liquid LQ which might be contaminated) from returning (reversely flowing) to the first space 251 and the optical path of the exposure light EL via the space portion 280. Accordingly, it is possible to prevent the generation of the exposure failure.

When the porous member 264 is contaminated, it is possible to prevent the contamination of the liquid LQ coming in contact with the porous member 264 by replacing the contaminated porous member 264 with a new porous member 264.

In the above-mentioned embodiment, the twelfth surface 279 is formed between the first aperture 233 and the first recess portion 290, but the first aperture 233 and the first recess portion 290 may be adjacent to each other without forming the twelfth surface 279. The twelfth surface 279 may be disposed lower than the first surface 241.

Eleventh Embodiment

An eleventh embodiment of the invention will be described below. In the following description, the elements equal or equivalent to those of the above-mentioned embodiment are referenced by like reference numerals and signs, and are described in brief or are not repeatedly described.

Figure 19:
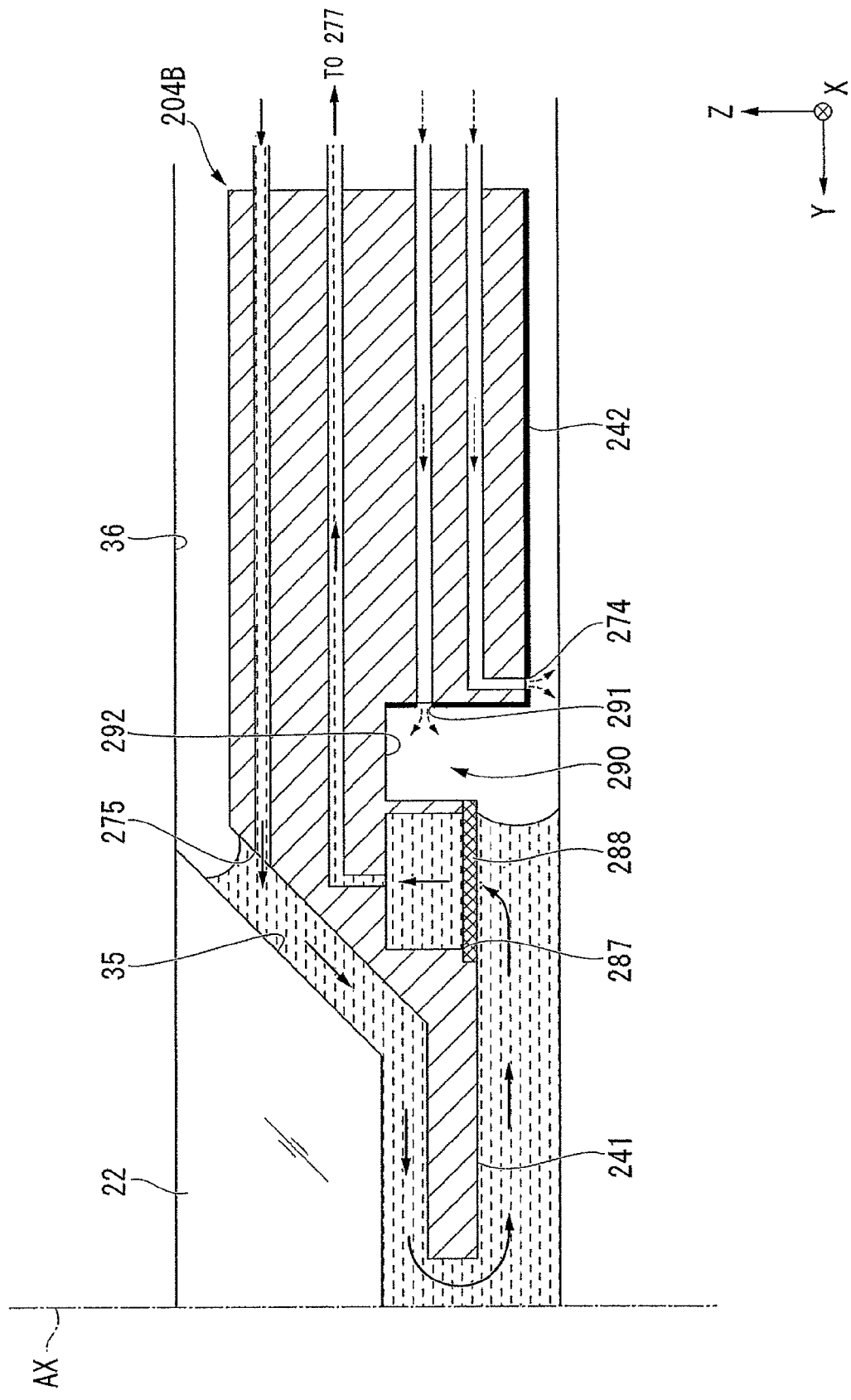
FIG. 19 is a diagram illustrating the vicinity of an immersion member according to an eleventh embodiment of the invention.

FIG. 19 is a diagram illustrating an example of an immersion member 204B according to the eleventh embodiment of the invention. In this embodiment, the immersion member 204B includes a first surface 241 disposed around the optical path of the exposure light EL emitted from the emission surface 23, a first recess portion 290 disposed around the first surface 241, a first gas supply port 291 which is disposed in the inner surface 292 defining the first recess portion 290 and which supplies the gas to raise the pressure of the first recess portion 290, and a recovery port 287 which is disposed between the first surface 241 and the first recess portion 290 in the radial direction about the optical axis AX and which recovers the liquid LQ. A porous member 288 is disposed in the recovery port 287.

The immersion member 204B includes a second surface 242 disposed around the first recess portion 290 and directed to the same side as the first surface 241, a second gas supply port 274 disposed in the second surface 242, and a supply port 275 disposed at the position opposed to the side surface 35.

In this embodiment, the first surface 241, the first recess portion 290, the first gas supply port 291, the recovery port 287, the second surface 242, the second gas supply port 274, and the supply port 275 are disposed in the same member.

In this embodiment, the recovery port 287 is directed in the −Z direction so as to be opposed to the surface of the substrate P. The recovery port 287 can recover the liquid LQ on the substrate P. The bottom surface of the porous member 288 can be opposed to the surface of the substrate P. The bottom surface of the porous member 288 is disposed in at least a part of a surrounding of the first surface 241. In this embodiment, the first surface 241 and the bottom surface of the porous member 288 are substantially flush with each other.

The recovery port 287 is connected to the liquid recovering device 277 via a recovery flow channel. By connecting the recovery port 287 to the liquid recovering device 277 including a vacuum source, the liquid LQ is recovered from the recovery port 287. In this embodiment, the control apparatus 7 controls the liquid recovering device 277 to adjust the difference in pressure between at the bottom surface side and at the top surface side of the porous member 288 so as to pass only the liquid LQ from the bottom surface side to the top surface side of the porous member 288.

In this embodiment, the first recess portion 290 is disposed outside the recovery port 287 in the radial direction about the optical axis AX, whereby the interface LG of the liquid LQ in the immersion space LS is suppressed from moving to the outside from the space below the recovery port 287. Accordingly, in this embodiment, it is possible to prevent the leakage and remaining of the liquid LQ.

Twelfth Embodiment

A twelfth embodiment of the invention will be described below. This embodiment is a modified example of the tenth embodiment. In the following description, the elements equal or equivalent to those of the above-mentioned embodiment are referenced by like reference numerals and signs, and are described in brief or are not repeatedly described.

Figure 20:
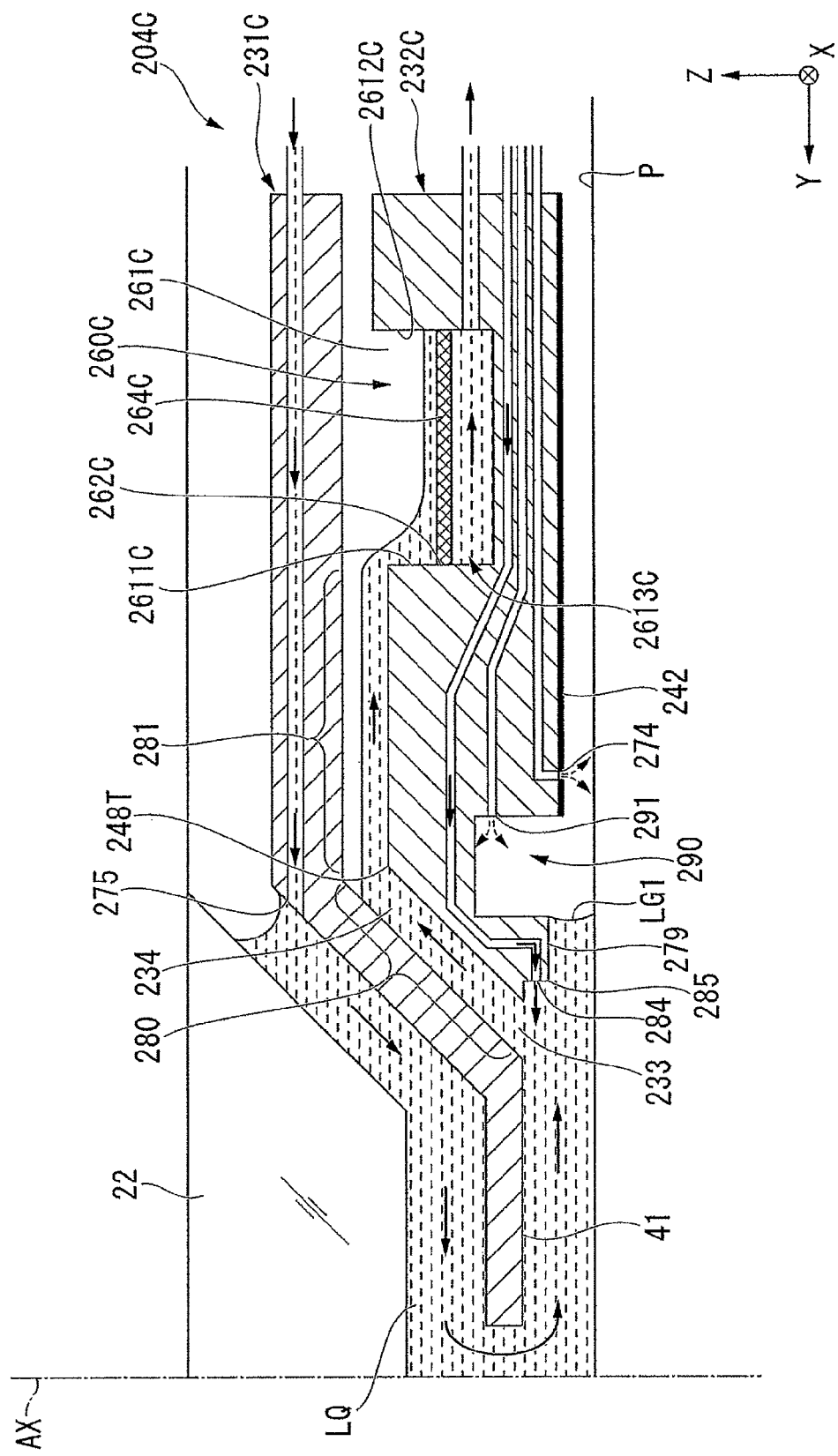
FIG. 20 is a diagram illustrating the vicinity of an immersion member according to a twelfth embodiment of the invention.

FIG. 20 is a diagram illustrating an example of an immersion member 204C according to the twelfth embodiment of the invention. In FIG. 20, the immersion member 204C includes a first member 231C having the first surface 241 and a second member 232C having the second surface 242.

The immersion member 204C includes a recovery portion 260C recovering at least a part of the liquid LQ flowing into the space portion 280. In this embodiment, the recovery portion 260C includes a second recess portion 261C disposed in the second member 232C and a recovery port 262C recovering the liquid LQ flowing into the second recess portion 261C. In this embodiment, the recovery port 262C is disposed in the second recess portion 261C. In this embodiment, the recovery port 262C is disposed in the bottom surface 2613C of the second recess portion 261C. A porous member 264C is disposed in the recovery port 262C. The top surface of the porous member 264C is disposed lower than the top end portion 248T (in the −Z direction). In this embodiment, it is possible to recover the liquid LQ reliably by the use of the recovery portion 260C.

In this embodiment, the immersion member 204C includes a supply port 284 disposed at a position facing the first space 251, which the first surface 241 faces, outside the first surface 241 in the radial direction about the optical axis AX. The supply port 284 supplies the liquid LQ to the optical path of the exposure light EL. In this embodiment, the supply port 284 is disposed in the second member 232C. The supply port 284 is disposed outside the first aperture 233 in the radial direction about the optical axis AX. The supply port 284 is disposed in a thirteenth surface 285 connected to the inner edge of the twelfth surface 279 to face the first space 251.

Similarly to the tenth and eleventh embodiments, the immersion member 204C includes the first recess portion 290 disposed around the first surface 241, the first gas supply port 291 disposed in the inner surface 292 defining the first recess portion 290, and the second gas supply port 274 disposed in the second surface 242. In this embodiment, the supply port 284 is disposed between the first aperture 233 and the first recess portion 290.

In this embodiment, it is possible to form the immersion space LS reliably, thereby suppressing the leakage and remaining of the liquid LQ.

In this embodiment, the supply port 275 and the supply port 284 are both provided, but the supply port 275 may not be provided.

In this embodiment, the recovery port 262C may be disposed in at least one of the first inner surface 2611C and the second inner surface 2612C of the second recess portion 261C.

In the tenth and twelfth embodiments, the first member 231 having the first surface 241 and the second member 232 having the second surface 242 may be relatively movable in the direction parallel to the optical axis AX and/or perpendicular to the optical axis AX. That is, at least one of the first member 231 and the second member 232 may be movably supported. For example, an actuator may be disposed in the second support mechanism 29 and the position of the second member 232 may be made to move with the driving force of the actuator. The second gap G2 can be adjusted by shifting the position of the second member 232 in the Z direction.

In the tenth and twelfth embodiments, the first surface 241, the second surface 242, and the space portion 280 may be formed in the same member.

In the tenth and twelfth embodiments, the space portion 280 may be disposed to oppose the second aperture 234 to the outer surface 36 of the holding member 21. In this case, since the fifth space 255 below the outer surface 36 is opened to the atmosphere (the gas space around the immersion member 4), it is possible to smoothly recover the liquid LQ from the space portion 280 by disposing the recovery portion 260 outside the space portion 280 in the radial direction about the optical axis AX.

In the above-mentioned embodiments, at least a part of the second surface 242 may not be lyophobic to the liquid LQ.

In the tenth to twelfth embodiments, the porous member is disposed in the recovery ports 262, 287, and 262C so as to pass only the liquid LQ from one side to the other side of the porous member, but the recovery port may recover the liquid LQ along with the gas. The porous member may not be disposed in the recovery port.

In the above-mentioned embodiments, the gas supply port 274 may not be provided.

In the above-mentioned embodiments, when the high-pressure space can be held below the first recess portion 290 by the gas from the gas supply port 274, the second surface 242 may not be disposed lower than the first surface 241.

In the above-mentioned embodiments, the first surface 241 may be disposed in a part of a surrounding of the optical path of the exposure light EL. The second surface 242 may be disposed in a part of a surrounding of the first recess portion 290.

In the above-mentioned embodiments, the first surface 241 may not be disposed between the emission surface 23 and the substrate P. In this case, the first surface 241 may be flush with the emission surface 23, or may be disposed higher than the emission surface 23.

In the above-mentioned embodiments, the surface of the final optical element 22 through which the exposure light EL does not pass may not include the surface (side surface 35) extending upward (in the +Z direction) from the edge of the emission surface 23. For example, the surface of the final optical element 22 through which the exposure light EL does not pass may extend in a direction substantially parallel to the emission surface 23 (in a direction perpendicular to the optical axis AX).

Thirteenth Embodiment

Figure 21:
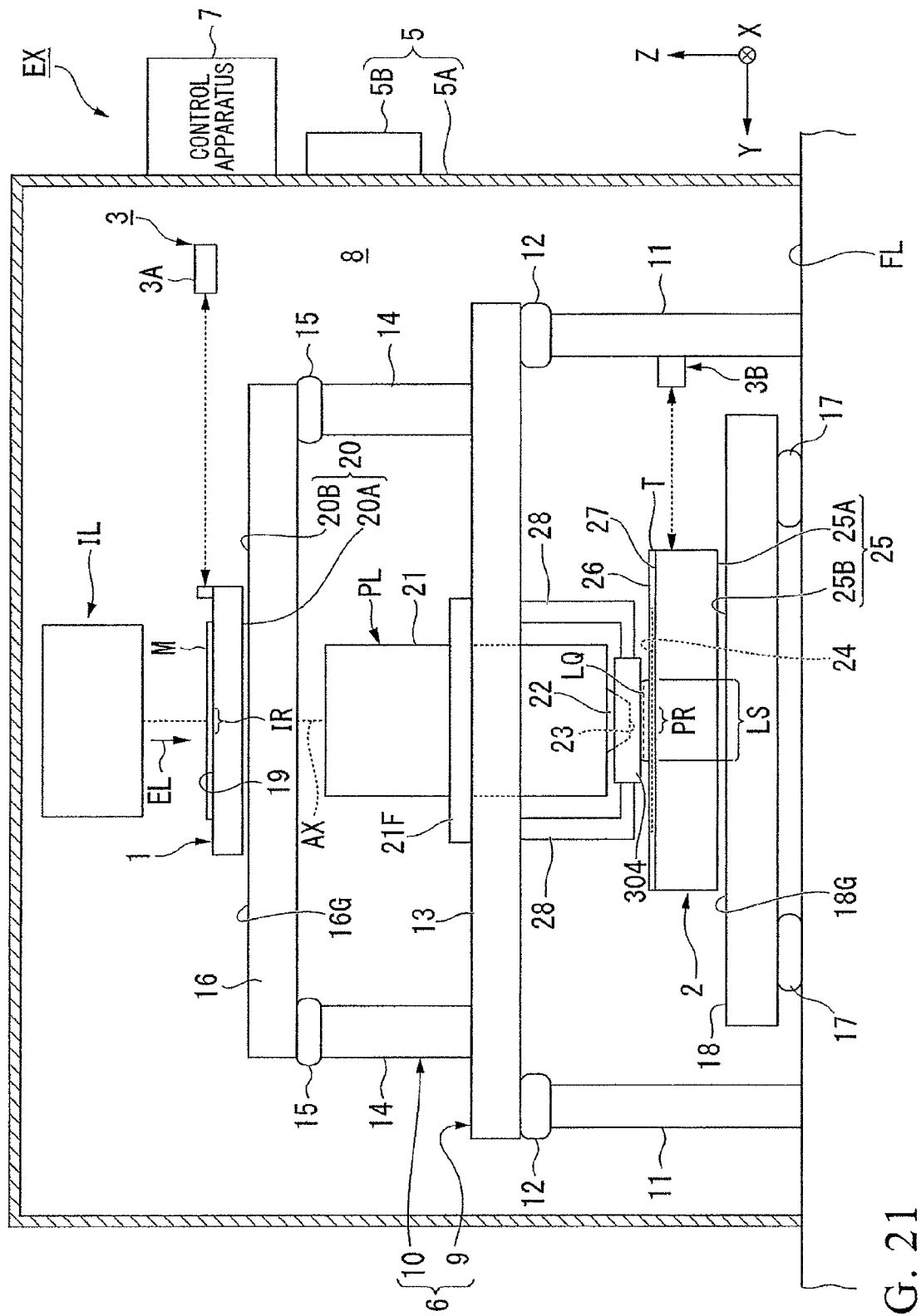
FIG. 21 is a diagram schematically illustrating a configuration of an exposure apparatus according to a thirteenth embodiment of the invention.

A thirteenth embodiment of the invention will be described below. FIG. 21 is a diagram schematically illustrating the configuration of an exposure apparatus EX according to the thirteenth embodiment of the invention. In the following description, the elements equal or equivalent to those of the above-mentioned embodiment are referenced by like reference numerals and signs, and are described in brief or are not repeatedly described.

As shown in FIG. 21, in this embodiment, the exposure apparatus EX includes an immersion member 304 which can form an immersion space LS so as to fill at least a part of the optical path of the exposure light EL with the liquid LQ.

The immersion member 304 is disposed in at least a part of a surrounding of the optical path of the exposure light EL so as to fill the optical path of the exposure light EL emitted from the emission surface 23 with the liquid LQ. The immersion member 304 forms the immersion space LS so that the optical path of the exposure light EL between the emission surface 23 and an object disposed at the position opposed to the emission surface 23 is filled with the liquid LQ. The immersion space LS is a portion (space or region) filled with the liquid LQ. In this embodiment, the object includes at least one of the substrate stage 2 (plate member T) and the substrate P held on the substrate stage. During the exposure of the substrate P, the immersion member 304 forms the immersion space LS so that the optical path of the exposure light EL between the final optical element 22 and the substrate P is filled with the liquid LQ.

The immersion member 304 is disposed in the vicinity of the final optical element 22. In this embodiment, the immersion member 304 is supported by a support mechanism 28. In this embodiment, the support mechanism 28 is supported by the first plate 13. In this embodiment, the immersion member 304 is suspended from the first plate 13 with the support mechanism 28 interposed therebetween.

Figure 22:
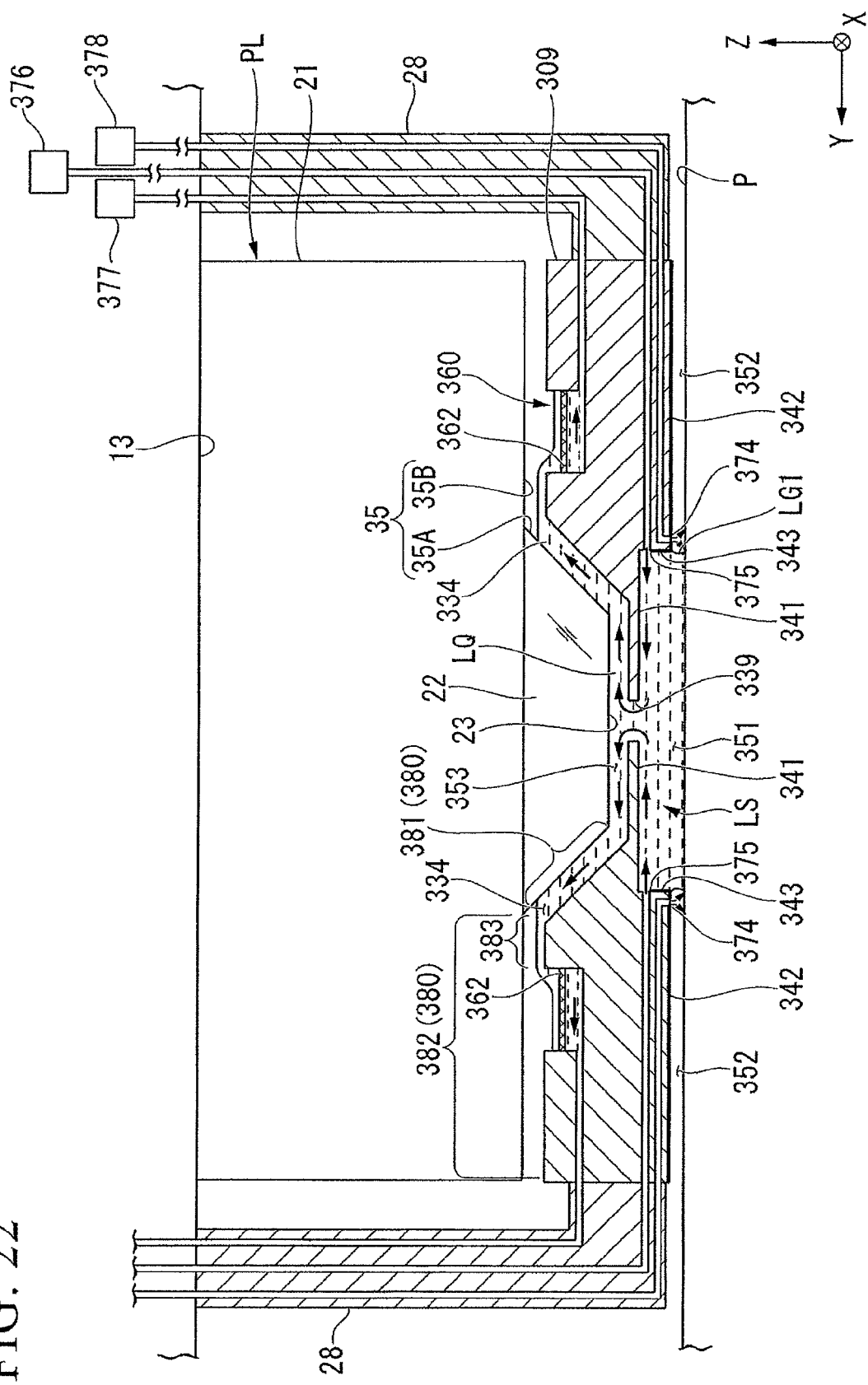
FIG. 22 is a partially enlarged view of the exposure apparatus according to the thirteenth embodiment of the invention.
Figure 23:
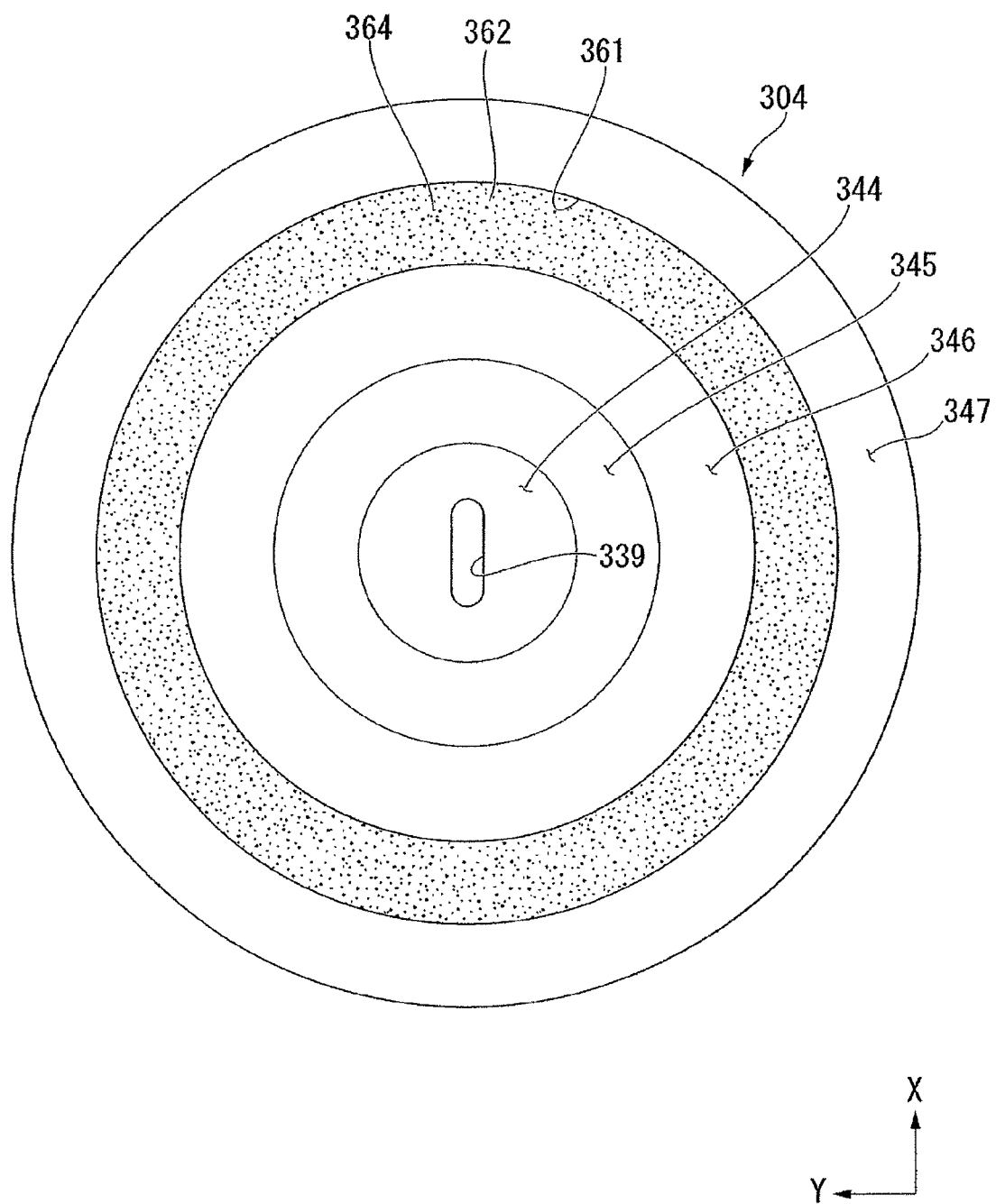
FIG. 23 is a top view of an immersion member according to the thirteenth embodiment as viewed from the upside.
Figure 24:
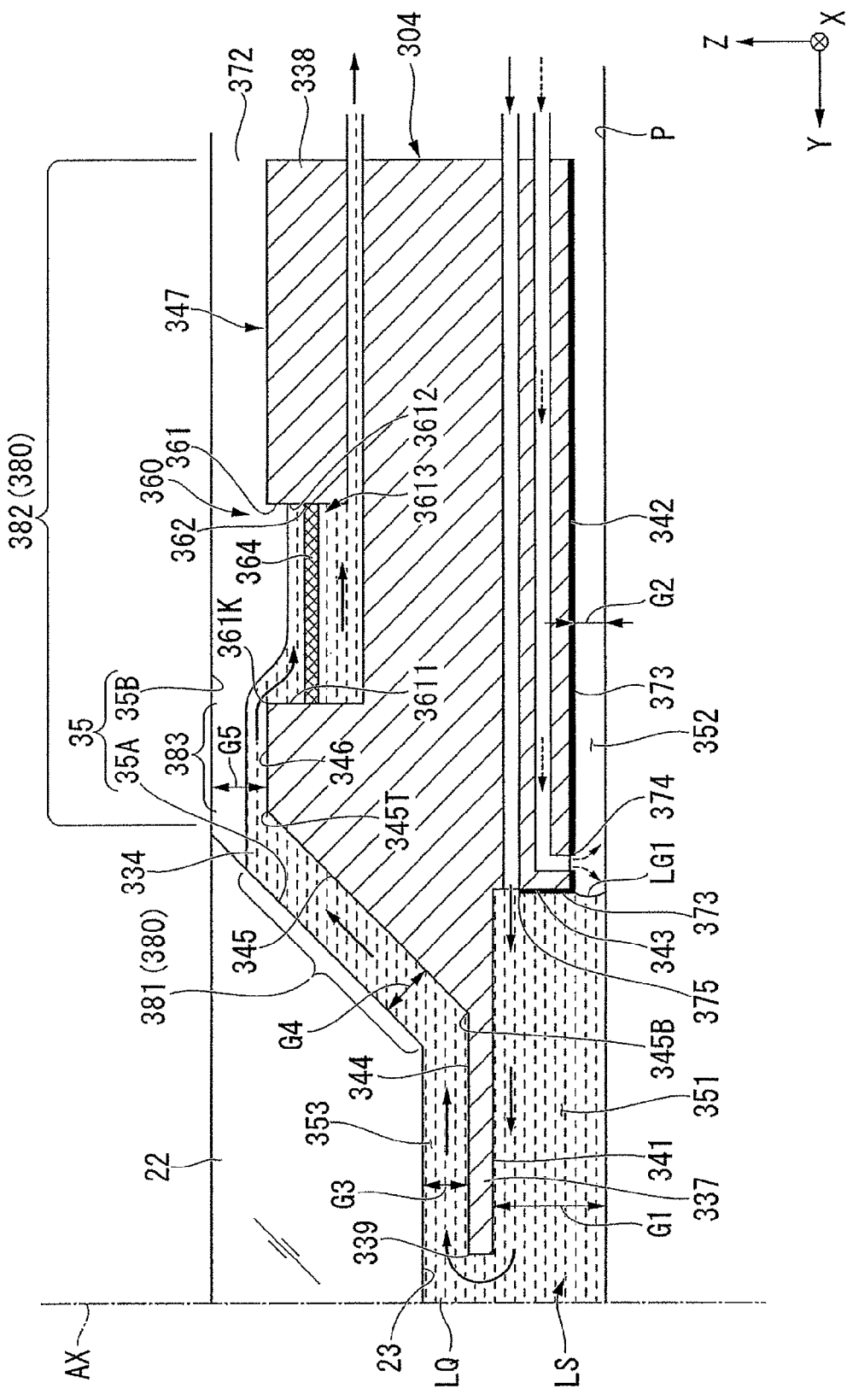
FIG. 24 is a diagram illustrating the vicinity of the immersion member according to the thirteenth embodiment of the invention.

FIG. 22 is a side sectional view of the vicinity of the immersion member 304, FIG. 23 is a top view of the immersion member 304, and FIG. 24 is a partially enlarged view of FIG. 22.

As shown in FIGS. 22, 23, and 24, in this embodiment, the immersion member 304 is an annular member. At least a part of the immersion member 304 is disposed in the vicinity of a partial optical path of the exposure light EL and the final optical element 22. As shown in FIG. 23, in this embodiment, the outer shape of the immersion member 304 in the XY plane is circular. The outer shape of the immersion member 304 may be other shapes (for example, rectangular).

The immersion member 304 includes a first surface 341 disposed in at least a part of a surrounding of the optical path of the exposure light EL emitted from the emission surface 23, a supply port 375 which is disposed in at least a part of a surrounding of the first surface 341 so as to face a first space 351 which the first surface 341 faces and which supplies the liquid LQ to the first space 351 to fill the optical path of the exposure light EL emitted from the emission surface 23 with the liquid LQ, and a recovery portion 360 recovering at least a part of the liquid LQ, which is supplied from the supply port 375 and which flows into a space portion 380 which the side surface 35 of the projection optical system PL extending upward from the edge of the emission surface 23 and in the radial direction about the optical axis AX of the projection optical system PL, via a first aperture 339.

In this embodiment, the immersion member 304 includes a second surface 342 disposed in at least a part of a surrounding of the first surface 341 and disposed lower than the first surface 341 (in the −Z direction). The first surface 341 and the second surface 342 can be opposed to the surface (top surface) of the object disposed below the immersion member 304. In this embodiment, the outer shapes of the first surface 341 and the second surface 342 in the XY plane are circular. The inner edge of the second surface 342 in the XY plane has a circular shape.

In this embodiment, the first surface 341 and the second surface 342 cannot recover the liquid LQ. That is, in this embodiment, the first surface 341 and the second surface 342 are not provided with a liquid recovery port. That is, in this embodiment, the bottom surface of the immersion member 304 opposed to the surface of the substrate P during the exposure is not provided with the liquid recovering port, except for the first aperture 339 through which the exposure light EL passes. In this embodiment, the first surface 341 and the second surface 342 are flat. A first space 351 between the first surface 341 and the surface (top surface) of the object can hold the liquid LQ. In this embodiment, the first surface 341 and the second surface 342 are parallel to the XY plane (horizontal plane), but at least a part of the first surface 341 and/or the second surface 342 may be tilted about the XY plane or at least one of the first surface 341 and the second surface 342 may not be parallel to each other. In this embodiment, the first surface 341 and the second surface 342 may include a curved surface.

In at least a part of the exposure of the substrate P, the emission surface 23, the first surface 341, and the second surface 342 are opposed to the surface of the substrate P disposed below the emission surface 23. In at least a part of the exposure of the substrate P, the liquid LQ is filled in the space between the emission surface 23 and the surface of the substrate P. In at least a part of the exposure of the substrate P, the liquid LQ is held in the first space 351 between the first surface 341 and the surface of the substrate P. The substrate P is exposed with the exposure light EL from the emission surface 23 through the liquid LQ between the emission surface 23 and the surface of the substrate P.

In this embodiment, a part of the immersion space LS is formed by the liquid LQ held between the first surface 341 and the object. In this embodiment, the immersion space LS is formed so that a partial region of the surface of the substrate P including the projection region PR is covered with the liquid LQ when the substrate P is being illuminated with the exposure light EL. A gas-liquid interface (meniscus, edge) LG1 of the liquid LQ in the immersion space LS can be formed between at least one of the first surface 341 and the second surface 342 and the surface of the substrate P, but is preferably formed between the inner edge of the second surface 342 and the substrate P. The exposure apparatus EX according to this embodiment employs a local immersion method.

For the purpose of convenient explanation, it is assumed that the substrate P is disposed at a position opposed to the emission surface 23, the first surface 341, and the second surface 342 and the liquid LQ is held between the immersion member 304 and the substrate P to form the immersion space LS. As described above, the immersion space LS can be formed between the emission surface 23 and the immersion member 304 and another member (such as the plate member T of the substrate stage 2).

As described above, in this embodiment, the first surface 341 and the second surface 342 are substantially parallel to the XY plane. As shown in FIG. 24, the first surface 341 is opposed to the surface of the substrate P with a first gap G1 interposed therebetween and the second surface 342 is opposed thereto with a second gap G2 interposed therebetween. The second gap G2 is smaller than the first gap G1.

In this embodiment, the supply port 375 is disposed lower than the first surface 341. In this embodiment, the supply port 375 is disposed between the first surface 341 and the second surface 342. In this embodiment, the immersion member 304 includes a third surface 343 which is disposed between the first surface 341 and the second surface 342 to face the first space 351. The top end of the third surface 343 is connected to the outer edge of the first surface 341. The bottom end of the third surface 343 is connected to the inner edge of the second surface 342. The supply port 375 is disposed in the third surface 343.

In this embodiment, the supply ports 375 are disposed on the +Y side and −Y side about the optical axis AX, respectively. The supply ports 375 may be disposed on the +X side and −X side about the optical axis AX, respectively. The number of supply ports 375 may be equal to or greater than 3.

The third surface 343 is disposed around the exposure light EL. The first space 351 is defined by the first surface 341 and the third surface 343. In this embodiment, the third surface 343 is substantially parallel to the optical axis AX. The third surface 343 may not be parallel to the optical axis AX. For example, the angle formed by the first surface 341 and the third surface 343 may be smaller than 90 degrees or may be greater than 90 degrees.

In this embodiment, the side surface 35 of the projection optical system PL includes at least one of the side surface 35A of the final optical element 22 and the outer surface 35B of the holding member 21. The side surface 35A of the final optical element 22 is a surface different from the emission surface 23 and a surface through which the exposure light EL does not pass. The side surface 35A is disposed around the emission surface 23. The side surface 35A extends upward from the edge of the emission surface 23 and in the radial direction (in the direction perpendicular to the optical axis AX) about the optical axis AX. That is, the side surface 35A is tilted to extend upward (in the +Z direction) from the edge of the emission surface 23.

The holding member 21 holds the final optical element 22. The outer surface 35B of the holding member 21 is disposed around the side surface 35A. The outer surface 35B is a surface through which the exposure light EL does not pass. The outer surface 35B extends in the radial direction about the optical axis AX.

In this embodiment, the immersion member 304 includes fourth surface 344 opposed to at least a part of the emission surface 23 in the opposite direction of the first surface 341, a fifth surface 345 disposed around the fourth surface 344 and opposed to the side surface 35A of the final optical element 22, and a sixth surface 346 disposed around the fifth surface 345 and opposed to the outer surface 35B of the holding member 21. In this embodiment, the final optical element 22 is held by the holding member 21 so as to expose the side surface 35, but the final optical element 22 may be held by the hold member 21 so that the fifth surface 345 faces the holding member 21 or so that the sixth surface 346 faces the final optical element 22.

The immersion member 304 includes a plate portion 337 of which at least a part is opposed to the emission surface 23 and a body portion 338 of which at least a part is disposed around the final optical element 22. The first surface 341 and the fourth surface 344 are disposed in the plate portion 337. The fifth surface 345 and the sixth surface 346 are disposed in the body portion 338.

The first aperture 339 is disposed in the plate portion 337. The exposure light EL emitted from the emission surface 23 can pass through the first aperture 339. During the exposure of the substrate P, the exposure light EL emitted from the emission surface 23 is applied to the surface of the substrate P via the first aperture 339. As shown in FIG. 23, in this embodiment, the first aperture 339 is longitudinal in the X axis direction intersecting the scanning direction (the Y axis direction) of the substrate P.

The fourth surface 344 is opposed to the emission surface 23 with a third gap G3 interposed therebetween. The fifth surface 345 is opposed to the side surface 35A with a fourth gap G4 interposed therebetween. The sixth surface 346 is opposed to the outer surface 35B with a fifth gap G5 interposed therebetween.

In this embodiment, the fourth surface 344 and the emission surface 23 are substantially parallel to each other. The fifth surface 345 and the side surface 35A are substantially parallel to each other. The sixth surface 346 and the outer surface 35B are substantially parallel to each other. The fourth surface 344 and the emission surface 23 may not be parallel to each other. The fifth surface 345 and the side surface 35A may not be parallel to each other. The sixth surface 346 and the outer surface 35B may not be parallel to each other.

The space portion 380 includes a first space portion 381 and a second space portion 382. The first space portion 381 includes a space between the side surface 35A and the fifth surface 345. The first space portion 381 extends in the radial direction about the optical axis AX and to the upside (in the +Z direction). In this embodiment, the bottom end portion 345B of the fifth surface 345 defines the bottom end of the first space portion 381. The top end portion 345T of the fifth surface 345 defines the top end of the first space portion 381.

The second space portion 382 includes a space between the outer surface 35B and the sixth surface 346. The second space portion 382 makes a fluidic communication with the top end of the first space portion 381. The second space portion 382 extends in the radial direction about the optical axis AX.

The first space portion 381 may be parallel to the optical axis AX. The second space portion 382 may not be perpendicular to the optical axis AX.

The recovery portion 360 recovers at least a part of the liquid LQ flowing into the space portion 380 (the first space portion 381) via the first aperture 339. The first aperture 339 faces the first space 351. At least a part of the liquid LQ supplied to the first space 351 from the supply port 375 can flow into the first space portion 381 via the first aperture 339. In at least a part of the exposure of the substrate P, the first aperture 339 is opposed to the surface of the substrate P. Accordingly, at least a part of the liquid LQ on the substrate P can flow into the first space portion 381 via the first aperture 339.

In this embodiment, the first space portion 381 is opened to the atmosphere via a second aperture 334 different from the first aperture 339. In this embodiment, the second aperture 334 is disposed at the top end of the first space portion 381.

The recovery portion 360 recovers at least a part of the liquid LQ, which flows into the first space portion 381 via the first aperture 339, via the second aperture 334. The recovery portion 360 recovers the liquid LQ overflowing from the first space portion 381. At least a part of the recovery portion 360 is disposed outside the top end portion 345T in the radial direction about the optical axis AX. At least a part of the recovery portion 360 is opposed to the outer surface 35B in the second space portion 382.

In this embodiment, the recovery portion 360 includes a recess portion 361 disposed upward (in the +Z direction) outside the first space portion 381 in the radial direction about the optical axis AX. The recess portion 361 is disposed in the immersion member 304. The recess portion 361 includes an opening 361K directed to the upside. The recovery portion 360 recovers the liquid LQ flowing into the recess portion 361 via the opening 361K.

The recess portion 361 is disposed outside the top end portion 345T in the radial direction about the optical axis AX. In this embodiment, the recess portion 361 is disposed around the sixth surface 346. In the XY plane, the recess portion 361 has an annular shape. The recess portion 361 may be formed by plural recess portions arranged in an annular shape with a predetermined gap. In this embodiment, the immersion member 304 includes a seventh surface 347 disposed around the recess portion 361. The seventh surface 347 is substantially parallel to the XY plane. In this embodiment, the seventh surface 347 is flush with the sixth surface 346. The seventh surface 347 may be disposed higher than the sixth surface 346 (in the +Z direction).

The recess portion 361 includes a first inner surface 3611 connected to the sixth surface 346, a second inner surface 3612 connected to the seventh surface 347 and opposed to the first inner surface 3611, and a bottom surface 3613 disposed between the first inner surface 3611 and the second inner surface 3612. The bottom surface 3613 is directed to the upside (in the +Z direction). The bottom surface 3613 is disposed lower than the top end portion 345T (in the −Z direction). In this embodiment, the bottom surface 3613 is substantially parallel to the XY plane. The bottom surface 3613 may not be parallel to the XY plane. For example, the bottom surface 3613 may be tilted about the XY plane. The bottom surface 3613 may include a curved surface.

The recovery portion 360 includes a liquid guide portion 383 guiding the liquid LQ from the first space portion 381 to the recess portion 361. In this embodiment, the liquid guide portion 383 includes the sixth surface 346. In this embodiment, the liquid guide portion 383 includes the space between the outer surface 35B and the sixth surface 346. That is, the liquid guide portion 383 is disposed in a part of the second space portion 382. The liquid guide portion 383 extends in the radial direction about the optical axis AX from the top end portion 345T.

In this embodiment, the liquid guide portion 383 is perpendicular to the optical axis AX (parallel to the XY plane), but may not be perpendicular to the optical axis AX. For example, the sixth surface 346 may be tilted to the downside from the top end portion 345T.

The recess portion 361 is disposed outside the liquid guide portion 383 in the radial direction about the optical axis AX from the top end portion 345T. The liquid LQ overflowing from the top end of the first space portion 381 is guided by the liquid guide portion 383 and flows in the recess portion 361.

The recess portion 361 can gather the liquid LQ from the first space portion 381. The recess portion 361 suppresses the liquid LQ from the first space portion 381 from returning to the first space portion 381, by collecting the flowing liquid LQ. That is, the recess portion 361 at least serves as a part of a reservoir portion collecting the liquid LQ from the first space portion 381 so as not to return to the first space portion 381.

The recovery portion 360 includes a recovery port 362 recovering the liquid LQ flowing in the recess portion 361. The recovery port 362 recovers the liquid LQ collected by the recess portion 361.

In this embodiment, the recovery port 362 is disposed in the recess portion 361. In other words, the recovery port 362 is disposed lower than the opening 361K of the recess portion 361 (in the −Z direction). In this embodiment, the recovery port 362 is disposed in the bottom surface 3613 of the recess portion 361. That is, the bottom surface 3613 of the recess portion 361 includes at least a part of the recovery port 362.

In this embodiment, the recovery port 362 has an annular shape in the XY plane. The recovery port 362 may be divided and disposed at plural position around the optical axis AX.

A porous member 364 is disposed in the recovery port 362. The porous member 364 is a plate-like member including plural openings or pores. The porous member 364 may be a mesh filter which is a porous member having plural small pores formed in meshes shapes.

As described above, in this embodiment, the first space portion 381 is opened to the atmosphere via the second aperture 334. In this embodiment, the first space portion 381 is opened to the atmosphere via the second aperture 334 and the second space portion 382.

As described above, the second space portion 382 includes the space between the outer surface 35B and the sixth surface 346. In this embodiment, the second space portion 382 includes the space between the outer surface 35B and the recess portion 361 and the space between the outer surface 35B and the seventh surface 347. The space between the outer surface 35B and the seventh surface 347 is opened to the atmosphere via the third aperture 372.

That is, the first space portion 381 is opened to the space around the immersion member 304 via the second aperture 334 and the second space portion 382. In other words, the first space portion 381 is opened to the gas space coming in contact with the interface of the liquid LQ in the immersion space LS via the second aperture 334.

In this embodiment, the "atmosphere" is a gas surrounding the immersion member 304. In this embodiment, the gas surrounding the immersion member 304 is a gas in the inner space 8 formed by the chamber 5. In this embodiment, the chamber 5 fills the inner space 8 with a clean gas using the environment controller 5B. The chamber 5 adjusts the inner space 8 substantially to the atmospheric pressure using the environment controller 5B. The pressure of the inner space 8 may be set to be higher than the atmospheric pressure.

In this embodiment, the second surface 342 is lyophobic to the liquid LQ. In the second surface 342, a contact angle of the liquid LQ is equal to or greater than 90° and may be equal to or greater than 100°. In this embodiment, the second surface 342 is formed of a film 373 which is lyophobic to the liquid LQ. The film 373 is formed of, for example, a lyophobic material containing fluorine. Examples of the lyophobic material include PFA (Tetra Fluoro Ethylene-perfluoro alkylvinyl ether copolymer), PTFE (Poly Tetra Fluoro Ethylene), PEEK (PolyEtherEtherKetone), and Teflon (registered trademark).

In this embodiment, the third surface 343 is also lyophobic to the liquid LQ. The third surface 343 is also formed of the film 373. At least one of the second surface 342 and the third surface 343 may not be a surface of a lyophobic film 373. For example, the immersion member 304 may be formed of a lyophobic material.

In this embodiment, the immersion member 304 includes a gas supply port 374 disposed in at least a part of a surrounding of the supply port 375. In this embodiment, the gas supply port 374 is disposed in the second surface 342. The gas supply port 374 can supply the gas to the second space 352 between the second surface 342 and the surface of the substrate P. The gas supply port 374 supplies a gas to the surface of the object (substrate P) opposed to the second surface 342.

In this embodiment, the gas supply port 374 has an annular shape in the XY plane. The gas supply port 374 may be divided and arranged at plural positions around the optical axis AX.

As shown in FIG. 22, the supply port 375 is connected to a liquid supply device 376 via a supply flow channel. In this embodiment, the supply flow channel includes a flow channel formed in the immersion member 304 and a flow channel formed in the support mechanism 28. The liquid supply device 376 can supply the clean liquid LQ adjusted in temperature to the supply port 375. A part of the supply flow channel may not be disposed in the support mechanism 28 supporting the immersion member 304.

The recovery port 362 is connected to a liquid recovering device 377 via a recovery flow channel. In this embodiment, the recovery flow channel includes a flow channel formed in the immersion member 304 and a flow channel formed in the support mechanism 28. The liquid recovering device 377 includes a vacuum system (such as a valve controlling a connection state between a vacuum source and the recovery port 362) and can suck and recover the liquid LQ from the recovery port 362. A part of the recovery flow channel may not be disposed in the support mechanism 28 supporting the immersion member 304.

The gas supply port 374 is connected to the gas supply device 378 via a gas supply channel. In this embodiment, the gas supply channel includes a flow channel formed in the immersion member 304 and a flow channel formed in the support mechanism 28. The gas supply device 378 can supply a clean gas adjusted in temperature and humidity to the gas supply port 374. The humidity of the gas supplied from the gas supply port 374 is preferably equal to or higher than the humidity of the gas supplied to the inner space 8 by the environment controller 5B. A part of the gas supply channel may not be disposed in the support mechanism 28 supporting the immersion member 304.

The liquid LQ supplied to the first space 351 from the supply port 375 is supplied to the optical path of the exposure light EL emitted from the emission surface 23. At least a part of the liquid LQ in the first space 351 flows into the third space 353 between the emission surface 23 and the fourth surface 344 via the first aperture 339 and then flows into the first space portion 381 via the third space 353. At least a part of the liquid LQ flowing into the first space portion 381 is recovered by the recovery portion 360.

In this embodiment, the different in pressure between at the top surface side and at the bottom surface side of the porous member 364 is controlled so that only the liquid LQ passes from the top side space (the second space portion 382) of the porous member 364 to the bottom side space (the recovery flow channel). In this embodiment, the pressure of the second space portion 382 which is the top side space is opened to the atmosphere and is controlled by the chamber 5. The control apparatus 7 controls the liquid recovering device 377 so that only the liquid LQ from the first space portion 381 passes from the top side to the bottom side of the porous member 364, and adjusts the pressure of the bottom side on the basis of the pressure of the top side. That is, the control apparatus 7 makes a control so as to recover only the liquid LQ from the first space portion 381 via the pores of the porous member 364 and so as for the gas not to pass through the pores of the porous member 364. The technique of adjusting the difference in pressure between at one side and at the other side of the porous member 364 so as to pass only the liquid LQ from one side of the porous member 364 to the other side is disclosed, for example, in the specification of U.S. Pat. No. 7,292,313.

A method of exposing the substrate P using the exposure apparatus EX having the above-mentioned configuration will be described now.

First, the control apparatus 7 moves the substrate stage 2 holding the substrate P so that the emission surface 23 and the first surface 341 opposed to the surface of the substrate P (or the top surface 26 of the substrate stage 2). The first surface 341 and the surface of the substrate P are opposed to each other with the first gap G1 interposed therebetween and the second surface 342 and the surface of the substrate P are opposed to each other with the second gap G2 interposed therebetween.

The control apparatus 7 sends out the liquid LQ from the liquid supply device 376 in the state where the first surface 341 and the second surface 342 are opposed to the surface of the substrate P. The control apparatus 7 activates the liquid recovering device 377. The control apparatus 7 activates the gas supply device 378.

The liquid LQ sent from the liquid supply device 376 is supplied to the first space 351 from the supply port 375 and is held between the first surface 341 and the surface of the substrate P. The liquid LQ supplied to the first space 351 is supplied to the optical path of the exposure light EL emitted from the emission surface 23. Accordingly, the optical path of the exposure light EL between the emission surface 23 and the substrate P is filled with the liquid LQ.

In this embodiment, the immersion space LS is formed so that the first space 351 surrounded with the surface of the substrate P, the first surface 341, and the third surface 343 is almost filled with the liquid LQ. The interface LG1 of the liquid LQ (the immersion space LS) is framed between the inner edge (the bottom end of the third surface 343) of the second surface 42 and the surface of the substrate P.

In this embodiment, the liquid LQ supplied to the first space 351 from the supply port 375 is suppressed from flowing into the second space 352. That is, in this embodiment, the interface LG1 of the liquid LQ in the immersion space LS in the XY plane is suppressed from moving to the outside from the third surface 343, thereby suppressing the extension of the immersion space LS.

In this embodiment, the first surface 341 is opposed to the surface of the substrate P with the first gap G1 interposed therebetween and the second surface 342 disposed around the first surface 341 is opposed to the surface of the substrate P with the second gap G2 interposed therebetween. The second gap G2 is smaller than the first gap G1 and is, for example, about in the range of 0.1 to 0.3 mm. Accordingly, the interface LG1 is suppressed from moving to the outside of the third surface 343 in the radial direction about the optical axis AX. That is, since the second gap G2 is small, the position of the interface LG1 is held between the inner edge of the second surface 342 and the surface of the substrate P due to the surface tension of the liquid LQ, as shown in FIG. 24 and the like. Accordingly, the liquid LQ in the immersion space LS is suppressed from flowing into the second space 352.

In this embodiment, since the second surface 342 is lyophobic to the liquid LQ, the liquid LQ is more effectively suppressed from flowing into the second space 352. In this embodiment, since the third surface 343 is disposed so as to extend upward from the inner edge of the second surface 342 and to face the optical path, the extension of the immersion space LS is suppressed. Since the third surface 343 is lyophobic to the liquid LQ, the extension of the immersion space LS is also suppressed.

In this embodiment, the gas supply port 374 is disposed and the gas is supplied to the surface of the substrate P on the outside of the inner edge of the second surface 342 about the optical axis AX. Accordingly, the extension of the immersion space LS is suppressed by the force of the gas supplied from the gas supply port 374. That is, the gas supply port 374 forms a gas seal between the surface of the substrate P and the second surface 342. Accordingly, the leakage of the liquid LQ is suppressed and thus the movement of the interface LG1 is restricted.

In this embodiment, the outer shape of the first surface 341 and the inner edge of the second surface 342 are circular and the outer shape of the immersion space LS in the XY plane is almost circular. Accordingly, the binding force acting to the center from all the sides of the interface LG1 of the immersion space LS almost uniformly acts. Accordingly, the extension of the immersion space LS is effectively suppressed.

By supplying the liquid LQ from the supply port 375 to the first space 351 in the state where the extension of the immersion space LS is suppressed, at least a part of the liquid LQ in the first space 351 flows into the first space portion 381 opened to the atmosphere via the first aperture 339 through which the exposure light EL passes and the third space 353. When the liquid LQ flows into the first space portion 381, the position of the surface of the liquid LQ in the first space portion 381 moves in the +Z direction (rises). That is, the liquid LQ flows upward in the first space portion 381 extending to the upside. When the liquid LQ is continuously supplied from the supply port 375, at least a part of the liquid LQ in the first space portion 381 overflows from the top end (the top end portion 345T) of the first space portion 381. The liquid LQ overflowing from the first space portion 381 is recovered by the recovery portion 360 disposed outside the top end of the first space portion 381. That is, the liquid LQ overflowing from the first space portion 381 is guided by the liquid guide portion 383 and then flows into the recess portion 361. The liquid LQ flowing into the recess portion 361 is recovered from the recovery port 362 (the porous member 364).

In this embodiment, since the difference in pressure between at the top surface side and at the bottom surface side of the porous member 364 is controlled so that only the liquid LQ passes from the top surface to the bottom surface of the porous member 364, the recovery portion 360 can recover the liquid LQ while suppressing the vibration and the vaporization heat from being generated.

In this embodiment, since the recovery portion 360 collects the liquid LQ on the substrate P recovered via the first aperture 339 and the first space portion 381 into the recess portion 361, it is possible to suppress the liquid LQ recovered via the first space portion 381 from returning to the first space portion 381. Since the liquid LQ from the first space portion 381 is collected in the recess portion 361 so that the liquid LQ recovered via the first space portion 381 does not return to the first space portion 381, the liquid LQ coming into contact with the porous member 364 is suppressed from returning to the first space 351 and the optical path of the exposure light EL via the first space portion 381.

A method of exposing the substrate P will be described now. As described above, the control apparatus 7 supplies the liquid LQ from the supply port 375 and holds the liquid LQ between the first surface 341 and the surface of the substrate P so as to fill the optical path of the exposure light EL with the liquid LQ, thereby forming the immersion space LS. At least a part of the liquid LQ on the substrate P flows into the first space portion 381 via the first aperture 339. The recovery portion 360 recovers the liquid LQ from the first space portion 381. The control apparatus 7 performs a liquid recovering operation using the recovery portion 360 along with a liquid supply operation using the supply port 375 and forms the immersion space LS so as to fill the optical path of the exposure light EL with the liquid LQ. The control apparatus 7 continuously supplies the gas from the gas supply port 374 to form the gas seal.

The control apparatus 7 starts the exposure of the substrate P while suppressing the liquid recovered from the first space portion 381 to the recovery portion 360 from returning to the first space 351 (the optical path of the exposure light EL) via the first space portion 381 and restricting the extension of the immersion space LS using the second gap G2 or the like.

The control apparatus 7 controls the illumination system IL to emit the exposure light EL and illuminates the mask M with the exposure light EL. The exposure light EL from the mask M is emitted from the emission surface 23 of the projection optical system PL. The control apparatus 7 illuminates the substrate P with the exposure light EL from the emission surface 23 via the liquid LQ between the emission surface 23 and the substrate P. Accordingly, the pattern image of the mask M is projected to the substrate P and the substrate P is exposed with the exposure light EL. During the exposure of the substrate P, the liquid LQ supplied from the supply port 375 flows via the first aperture 339 and is recovered by the recovery portion 360 via the first space portion 381.

As described above, in this embodiment, since the supply port 375 is provided to face the first space 351 and the liquid LQ flowing into the first space portion 381 via the first aperture 339 is recovered by the recovery portion 360, it is possible to simplify the structure of the bottom surface of the immersion member 304 opposed to the surface of the substrate P. Accordingly, it is possible to suppress foreign materials from being attached to the bottom surface of the immersion member 304 coming in contact with the liquid LQ or to suppress the bottom surface from being contaminated.

For example, when the structure (shape) is complicated by disposing the recovery port recovering the liquid LQ in the bottom surface of the immersion member 304 opposed to the surface of the substrate P or disposing the porous member in the recovery port, foreign materials may be easily attached to the bottom surface. For example, when the porous member is disposed at a position opposed to the surface of the substrate P, the foreign materials (for example, the photosensitive film forming the surface of the substrate P or a part of an overcoat film) generated from the substrate P may be attached to the porous member. When the attached foreign materials are emitted to the optical path of the exposure light EL or are mixed into the liquid LQ in the immersion space LS during the exposure of the substrate P, the exposure failure such as a pattern defect caused in the substrate P may be caused. When the structure (shape) of the bottom surface is complicated, for example, when plural recess and convex portions exist, the foreign materials generated from the substrate P may be easily attached to the bottom surface.

According to this embodiment, the first space portion 381 is provided, the liquid LQ flowing into the first space portion 381 via the first aperture 339 through which the exposure light EL passes is recovered by the recovery portion 360 disposed at the position not opposed to the surface of the substrate P, and the bottom surface of the immersion member 304 opposed to the surface of the substrate P has a simple structure. Accordingly, it is possible to suppress the foreign materials from being attached to the bottom surface of the immersion member 304. Since the structure of the bottom surface of the immersion member 304 is simple, it is possible to smoothly and reliably clean the bottom surface of the immersion member 304 even when the foreign materials are attached to the bottom surface of the immersion member 304.

In this embodiment, the first space portion 381 is opened to the atmosphere via the second aperture 334. The third space 353 fluidically connected to the first space portion 381 is also opened to the atmosphere. Accordingly, the liquid LQ in the first space 351 can smoothly flow into the third space 353 and the first space portion 381 via the first aperture 339. As a result, it is possible to suppress the extension of the immersion space LS.

In this embodiment, the recovery portion 360 is constructed so that the liquid LQ recovered from the first space portion 381 does not return to the first space portion 381. That is, the liquid LQ from the first space portion 381 is collected in the recess portion 361. Accordingly, for example, when the porous member 364 of the recovery portion 360 is contaminated, it is possible to suppress the liquid LQ coming into contact with the porous member 364 (the liquid LQ which might be contaminated) from returning (reversely flowing) to the first space 351 and the optical path of the exposure light EL via the first space portion 381. Accordingly, it is possible to prevent the generation of the exposure failure.

When the porous member 364 is contaminated, it is possible to prevent the contamination of the liquid LQ coming in contact with the porous member 364 by replacing the contaminated porous member 364 with a new porous member 364.

The liquid guide portion 383 (the sixth surface 346) disposed between the top end portion 345T and the recess portion 361 may not be disposed. That is, the recess portion 361 may be disposed adjacent to the top end portion 345T.

In the above-mentioned embodiment, the supply port 375 is disposed in the third surface 343, but may be disposed in the first surface 341. That is, the supply port 375 may be disposed in the first surface 341 to be directed to the downside.

In the above-mentioned embodiment, the porous member 364 is disposed in the recovery port 362 of the recovery portion 360 so as to pass only the liquid LQ from one side to the other side of the porous member 364, but the recovery port 362 may recover the liquid LQ along with the gas. The porous member may not be disposed in the recovery port 362.

In the above-mentioned embodiment, the liquid LQ in the first space 351 flows into the first space portion 381 via the first aperture 339 through which the exposure light EL passes, but an aperture different from the first aperture 339 through the exposure light EL passes may be disposed in at least a part of the first surface 341 opposed to the surface of the substrate P and the liquid LQ in the first space 351 may be made to flow into the first space portion 381 via the aperture.

In the above-mentioned embodiments, the gas supply port 374 may not be provided.

In the above-mentioned embodiment, when the movement of the interface LG1 of the liquid LQ can be suppressed by the gas from the gas supply port 374, the second surface 342 may not be disposed lower than the first surface 341.

In the above-mentioned embodiment, at least a part of the second surface 342 may not be lyophobic to the liquid LQ.

In the above-mentioned embodiment, the member having the first surface 341 and the member having the second surface 342 may not be the same as each other. The member having the third surface 343 may be a member different from at least one of the member having the first surface 341 and the member having the second surface 342.

In the above-mentioned embodiments, the first surface 341 may not be disposed between the emission surface 23 and the substrate P. In this case, the first surface 341 may be flush with the emission surface 23, or may be disposed higher than the emission surface 23.

In the above-mentioned embodiments, the surface of the final optical element 22 through which the exposure light EL does not pass may not include the surface (side surface 35A) extending upward (in the +Z direction) from the edge of the emission surface 23. For example, the surface of the final optical element 22 through which the exposure light EL does not pass may extend in a direction substantially parallel to the emission surface 23 (in a direction perpendicular to the optical axis AX).

The side surface 35 of the projection optical system PL through which the exposure light EL does not pass may be disposed at the same height as (may be flush with) the emission surface 23 in at least a part of the surrounding of the emission surface 23. That is, the side surface 35 may not extend upward from the edge of the emission surface 23 but may extend in the radial direction about the optical axis AX. The side surface 35 may be substantially parallel to the optical axis AX. That is, the side surface 35 may not extend in the radial direction about the optical axis AX, but may extend upward from the edge of the emission surface 23.

In the above-mentioned embodiment, the first space portion 381 into which the liquid LQ flows via the first aperture 339 is opened to the atmosphere via the second space portion 382 and the liquid LQ overflowing from the first space portion 381 is recovered by the recovery portion 360. However, the first space portion 381 and the second space portion 382 may be set to form a substantially closed space and thus the fluid (the liquid LQ and/or the gas) in the first space portion 381 and/or the second space portion 382 may be recovered by the recovery portion 360.

In the above-mentioned embodiment, the liquid LQ flowing into the second space portion 382 is recovered by the recovery portion 360, but a recovery portion recovering the liquid LQ in the first space portion 381 may be provided instead of the recovery portion 360 or in addition to the recovery portion 360.

Fourteenth Embodiment

Figure 25:
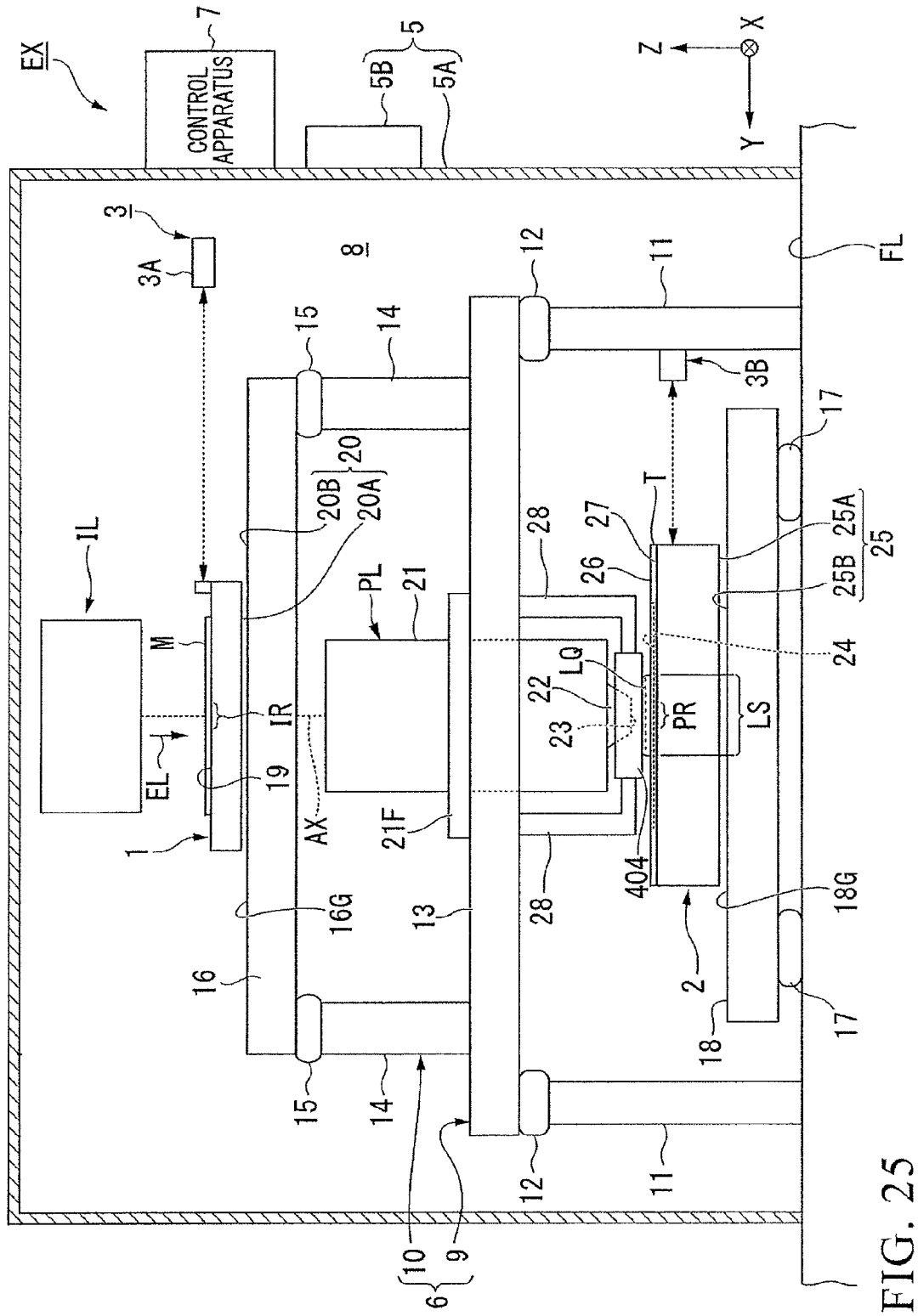
FIG. 25 is a diagram schematically illustrating a configuration of an exposure apparatus according to a fourteenth embodiment of the invention.

A fourteenth embodiment of the invention will be described below. FIG. 25 is a diagram schematically illustrating the configuration of an exposure apparatus EX according to the fourteenth embodiment of the invention. In the following description, the elements equal or equivalent to those of the above-mentioned embodiment are referenced by like reference numerals and signs, and are described in brief or are not repeatedly described.

As shown in FIG. 25, in this embodiment, the exposure apparatus EX includes an immersion member 404 which can form an immersion space LS so as to fill at least a part of the optical path of the exposure light EL with the liquid LQ.

The immersion member 404 is disposed in at least a part of a surrounding of the optical path of the exposure light EL so as to fill the optical path of the exposure light EL emitted from the emission surface 23 with the liquid LQ. The immersion member 404 forms the immersion space LS so that the optical path of the exposure light EL between the emission surface 23 and an object disposed at the position opposed to the emission surface 23 is filled with the liquid LQ. The immersion space LS is a portion (space or region) filled with the liquid LQ. In this embodiment, the object includes at least one of the substrate stage 2 (plate member T) and the substrate P held on the substrate stage 2. During the exposure of the substrate P, the immersion member 404 forms the immersion space LS so that the optical path of the exposure light EL between the final optical element 22 and the substrate P is filled with the liquid LQ.

The immersion member 404 is disposed in the vicinity of the final optical element 22. In this embodiment, the immersion member 404 is supported by a support mechanism 28. In this embodiment, the support mechanism 28 is supported by the first plate 13. In this embodiment, the immersion member 404 is suspended from the first plate 13 with the support member 28 interposed therebetween.

Figure 26:
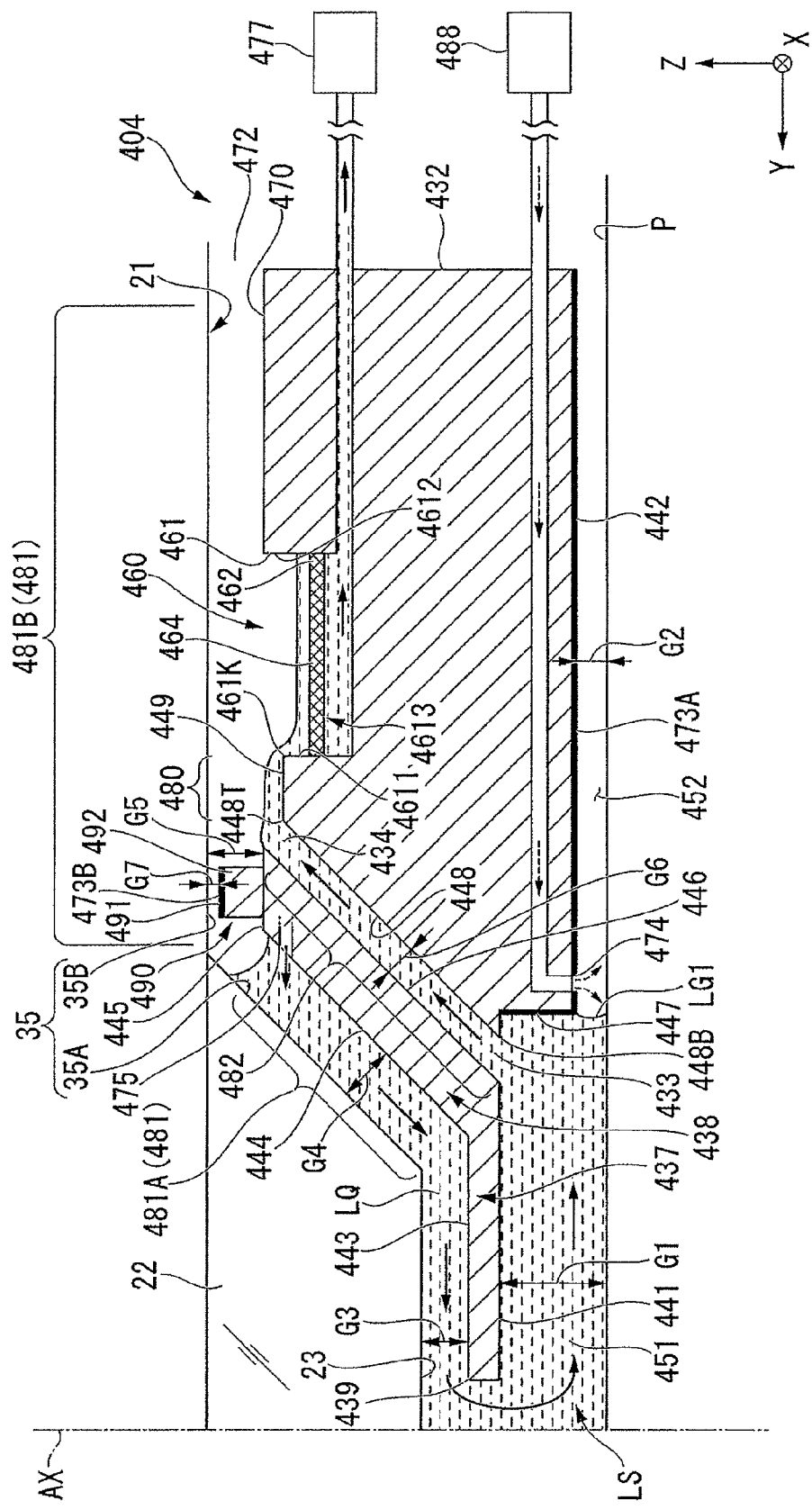
FIG. 26 is a diagram illustrating the vicinity of an immersion member according to a fourteenth embodiment of the invention.

FIG. 26 is a partially enlarged view of the immersion member 404. As shown in FIG. 26, the immersion member 404 includes a first member 431 and a second member 432. In this embodiment, the first member 431 and the second member 432 are annular members. At least a part of the first member 431 is disposed in the vicinity of a partial optical path of the exposure light EL and the final optical element 22. At least a part of the second member 432 is disposed in the vicinity of the first member 431. In this embodiment, the outer shapes of the first member 431 and the second member 432 in the XY plane are circular. The outer shapes of the first member 431 and the second member 432 may be other shapes (for example, rectangular).

In this embodiment, the second member 432 is connected to a part of the first member 431 via a connection member (not shown). By supporting the second member 432 by the use of the support mechanism 28 and fixing the position of the second member 432, the position of the first member 431 is also fixed.

The immersion member 404 includes a first surface 441 disposed in at least a part of a surrounding of the optical path of the exposure light EL emitted from the emission surface 23, a second surface 442 disposed in at least a part of a surrounding of the first surface 441, a first space portion 481 which the side surface 35 of the projection optical system PL extending upward from the edge of the emission surface 23 and in the radial direction about the optical axis AX of the projection optical system PL (in the direction perpendicular to the optical axis AX) faces and which is opened to the atmosphere, a second space portion 482 into which the liquid LQ can flow from the first aperture 433 disposed between the first surface 441 and the second surface 442 and which is opened to the atmosphere via the second aperture 434 different from the first aperture 433, and a recovery portion 460 of which at least a part is disposed at a position opposed to the side surface 35 of the projection optical system PL and which recovers at least a part of the liquid LQ, which has flown into the second space portion 482 from the first aperture 433, via the second aperture 434.

In this embodiment, the first surface 441 is disposed in the first member 431. The second surface 442 is disposed in the second member 432. The first surface 441 and the second surface 442 can be opposed to the surface (top surface) of the object disposed below the immersion member 404. In this embodiment, the outer shapes of the first surface 441 and the second surface 442 in the XY plane are circular. The inner edge of the second surface 442 in the XY plane has a circular shape.

In this embodiment, the first surface 441 and the second surface 442 cannot recover the liquid LQ. That is, in this embodiment, the first surface 441 and the second surface 442 are not provided with a liquid recovery port. In this embodiment, the first surface 441 and the second surface 442 are flat. A first space 451 between the first surface 441 and the surface (top surface) of the object can hold the liquid LQ. In this embodiment, the first surface 441 and the second surface 442 are parallel to the XY plane (horizontal plane), but at least a part of the first surface 441 and/or the second surface 442 may be tilted about the XY plane or at least one of the first surface 441 and the second surface 442 may not be parallel to each other. In this embodiment, the first surface 441 and the second surface 442 may include a curved surface.

In at least a part of the exposure of the substrate P, the emission surface 23, the first surface 441, and the second surface 442 are opposed to the surface of the substrate P. In at least a part of the exposure of the substrate P, the liquid LQ is filled in the space between the emission surface 23 and the surface of the substrate P. In at least a part of the exposure of the substrate P, the liquid LQ is held in the first space 451 between the first surface 441 and the surface of the substrate P. The substrate P is exposed with the exposure light EL from the emission surface 23 through the liquid LQ between the emission surface 23 and the surface of the substrate P.

In this embodiment, a part of the immersion space LS is formed by the liquid LQ held between the first surface 441 and the object. In this embodiment, the immersion space LS is formed so that a partial region of the surface of the substrate P including the projection region PR is covered with the liquid LQ when the substrate P is being illuminated with the exposure light EL. A gas-liquid interface (meniscus, edge) LG1 of the liquid LQ in the immersion space LS can be formed between at least one of the first surface 441 and the second surface 442 and the surface of the substrate P, but is preferably formed between the inner edge of the second surface 442 and the substrate P. The exposure apparatus EX according to this embodiment employs a local immersion method.

For the purpose of convenient explanation, it is assumed that the substrate P is disposed at a position opposed to the emission surface 23, the first surface 441, and the second surface 442 and the liquid LQ is held between the immersion member 404 and the substrate P to form the immersion space LS. As described above, the immersion space LS can be formed between the emission surface 23 and the immersion member 404 and another member (such as the plate member T of the substrate stage 2).

In this embodiment, the side surface 35 of the projection optical system PL includes at least one of the side surface 35A of the final optical element 22 and the outer surface 35B of the holding member 21. The side surface 35A of the final optical element 22 is a surface different from the emission surface 23 and a surface through which the exposure light EL does not pass. The side surface 35A is disposed around the emission surface 23. The side surface 35A extends upward from the edge of the emission surface 23 and in the radial direction (in the direction perpendicular to the optical axis AX) about the optical axis AX. That is, the side surface 35A is tilted to extend upward (in the +Z direction) from the edge of the emission surface 23.

The holding member 21 holds the final optical element 22. The outer surface 35B of the holding member 21 is disposed around the side surface 35A. The outer surface 35B is a surface through which the exposure light EL does not pass. The outer surface 35B extends in the radial direction about the optical axis AX.

In this embodiment, the second surface 442 is disposed lower than the first surface 441 (in the −Z direction). In this embodiment, the first surface 441 and the second surface 442 are substantially parallel to the XY plane. As shown in FIG. 26, the first surface 441 is opposed to the surface of the substrate P with a first gap G1 interposed therebetween and the second surface 442 is opposed thereto with a second gap G2 interposed therebetween. The second gap G2 is smaller than the first gap G1.

In this embodiment, the first member 431 includes a first surface 441 opposed to the surface of the substrate P, a third surface 443 opposed to at least a part of the emission surface 23 and directed in the opposite direction of the first surface 441, a fourth surface 444 disposed around the third surface 443 and opposed to the side surface 35A of the final optical element 22, and a fifth surface 445 disposed around the fourth surface 444 and opposed to the outer surface 35B of the holding member 21. In this embodiment, the final optical element 22 is held by the holding member 21 so as to expose the side surface 35, the end optical terminal 22 may be held by the holding member 21 so that the fifth surface 445 faces the holding member 21 or so that the sixth surface 446 faces the final optical element 22.

The first member 431 includes a plate portion 437 of which at least a part is opposed to the emission surface 23 and a body portion 438 of which at least a part is disposed around the final optical element 22. The first surface 441 and the third surface 443 are disposed in the plate portion 437. The fourth surface 444 and the fifth surface 445 are disposed in the body portion 438. The plate portion 437 has an aperture 439 through which the exposure light EL emitted from the emission surface 23 can pass. During the exposure of the substrate P, the exposure light EL emitted from the emission surface 23 is applied to the surface of the substrate P via the aperture 439. In this embodiment, the aperture 439 is longitudinal in the X axis direction intersecting the scanning direction (the Y axis direction) of the substrate P.

The third surface 443 is opposed to the emission surface 23 with a third gap G3 interposed therebetween. The fourth surface 444 is opposed to the side surface 35A with a fourth gap G4 interposed therebetween. The fifth surface 445 is opposed to the outer surface 35B with a fifth gap G5 interposed therebetween.

In this embodiment, the third surface 443 and the emission surface 23 are substantially parallel to each other. The fourth surface 444 and the side surface 35A are substantially parallel to each other. The fifth surface 445 and the outer surface 35B are substantially parallel to each other. The third surface 443 and the emission surface 23 may not be parallel to each other. The fourth surface 444 and the side surface 35A may not be parallel to each other. The fifth surface 445 and the outer surface 35B may not be parallel to each other.

The first member 431 includes a sixth surface 446 disposed around the first surface 441. The sixth surface 446 are disposed in the body portion 438. In this embodiment, the fourth surface 444 and the sixth surface 446 are substantially parallel to each other. The fourth surface 444 and the sixth surface 446 may not be parallel to each other.

In this embodiment, the second member 432 includes a second surface 442 opposed to the surface of the substrate P, a seventh surface 447 connected to the inner edge of the second surface 442 and disposed to face the optical path of the exposure light EL, an eighth surface 448 opposed to the sixth surface 446, and a ninth surface 449 disposed around the eighth surface 448.

The eighth surface 448 is opposed to the sixth surface 446 with a sixth gap G6 interposed therebetween. In this embodiment, the eighth surface 448 and the sixth surface 446 are substantially parallel to each other. The eighth surface 448 and the sixth surface 446 may not be parallel to each other.

The first space portion 481 includes a first portion 481A and a second portion 481B. The first portion 481A includes the space between the side surface 35A and the fourth surface 444. The first portion 481A extends in the radial direction about the optical axis AX and to the upside (in the +Z direction). The second portion 481B includes the space between the outer surface 35B and the fifth surface 445 and the ninth surface 449. The second portion 481B fluidically communicates with the top end of the first portion 481A. The second portion 481B extends in the radial direction about the optical axis AX.

The first portion 481A may be parallel to the optical axis AX. The second portion 481B may not be perpendicular to the optical axis AX.

The second space portion 482 includes the space between the sixth surface 446 and the eighth surface 448. The second space portion 482 extends in the radial direction about the optical axis AX and to the upside (in the +Z direction). In this embodiment, the bottom end portion 448B of the eighth surface 448 defines the bottom end of the second space portion 482. The top end portion 448T of the eighth surface 448 defines the top end of the second space portion 482. The space between the sixth surface 446 and the eighth surface 448 may be parallel to the optical axis AX.

The first aperture 433 is disposed at the bottom end of the second space portion 482. In this embodiment, the first aperture 433 faces the first space 451. The second aperture 434 is disposed at the top end of the second space portion 482. The second aperture 434 faces the first space portion 481. In this embodiment, the second aperture 434 faces the second portion 481B.

In at least a part of the exposure of the substrate P, the first aperture 433 is opposed to the surface of the substrate P. At least a part of the liquid LQ on the substrate P can be made to flow in the second space portion 482 via the first aperture 433. In this embodiment, the first aperture 433 is substantially flush with the first surface 441. The first aperture 433 may not be directed to the downside (in the −Z direction). For example, the first aperture 433 may be disposed in a seventh surface 447 to be described later. The first aperture 433 may be formed in an annular shape by an aperture or may be formed by plural apertures arranged in an annular shape with a predetermined gap. Similarly, the second space portion 482 may be formed by plural space portions arranged in an annular shape with a predetermined gap around the optical axis AX.

The recovery portion 460 recovers at least a part of the liquid LQ, which flows into the second space portion 482 via the first aperture 433, via the second aperture 434. The recovery portion 460 recovers the liquid LQ overflowing from the second space portion 482. At least a part of the recovery portion 460 is disposed outside the top end portion 448T in the radial direction about the optical axis AX. At least a part of the recovery portion 460 is opposed to the outer surface 35B in the second portion 481B.

In this embodiment, the recovery portion 460 includes a recess portion 461 disposed upward (in the +Z direction) outside the second space portion 482 in the radial direction about the optical axis AX. The recess portion 461 is disposed in the second member 432. The recess portion 461 includes an opening 461K directed to the upside. The recovery portion 460 recovers the liquid LQ flowing into the recess portion 461 via the opening 461K.

The recess portion 461 is disposed outside the top end portion 448T in the radial direction about the optical axis AX. In this embodiment, the recess portion 461 is disposed around the ninth surface 449. In the XY plane, the recess portion 461 has an annular shape. The recess portion 461 may be formed by plural recess portions arranged in an annular shape with a predetermined gap. In this embodiment, the second member 432 includes a tenth surface 470 disposed around the recess portion 461. The tenth surface 470 is substantially parallel to the XY plane. In this embodiment, the tenth surface 470 is flush with the ninth surface 449. The tenth surface 470 may be disposed higher than the ninth surface 449 (in the +Z direction).

The recess portion 461 includes a first inner surface 4611 connected to the ninth surface 449, a second inner surface 4612 connected to the tenth surface 470 and opposed to the first inner surface 4611, and a bottom surface 4613 disposed between the first inner surface 4611 and the second inner surface 4612. The bottom surface 4613 is directed to the upside (in the +Z direction). The bottom surface 4613 is disposed lower than the top end portion 448T (in the −Z direction). In this embodiment, the bottom surface 4613 is substantially parallel to the XY plane. The bottom surface 4613 may not be parallel to the XY plane. For example, the bottom surface 4613 may be tilted about the XY plane. The bottom surface 4613 may include a curved surface.

The recovery portion 460 includes a liquid guide portion 480 guiding the liquid LQ from the second space portion 482 to the recess portion 461. In this embodiment, the liquid guide portion 480 includes the ninth surface 449. In this embodiment, the liquid guide portion 480 includes the space between the outer surface 35B and the ninth surface 449. The liquid guide portion 480 extends in the radial direction about the optical axis AX from the top end portion 448T. In this embodiment, the liquid guide portion 480 is perpendicular to the optical axis AX (parallel to the XY plane), but may not be perpendicular to the optical axis AX. For example, the ninth surface 449 may be tilted to the downside from the top end portion 448T.

The recess portion 461 is disposed outside the liquid guide portion 480 in the radial direction about the optical axis AX from the top end portion 448T. The liquid LQ overflowing from the top end of the second space portion 482 is guided by the liquid guide portion 480 and flows in the recess portion 461.

The recess portion 461 can gather the liquid LQ from the second space portion 482. The recess portion 461 suppresses the liquid LQ from the second space portion 482 from returning to the second space portion 482, by collecting the flowing liquid LQ. That is, the recess portion 461 at least serves as a part of a reservoir portion collecting the liquid LQ from the second space portion 482 so as not to return to the second space portion 482.

The recovery portion 460 includes a recovery port 462 recovering the liquid LQ flowing in the recess portion 461. The recovery port 462 recovers the liquid LQ collected by the recess portion 461.

In this embodiment, the recovery port 462 is disposed in the recess portion 461. In other words, the recovery port 462 is disposed lower than the opening 461K of the recess portion 461 (in the −Z direction). In this embodiment, the recovery port 462 is disposed in the bottom surface 4613 of the recess portion 461. That is, the bottom surface 4613 of the recess portion 461 includes at least a part of the recovery port 462.

In this embodiment, the recovery port 462 has an annular shape in the XY plane. The recovery port 462 may be divided and disposed at plural position around the optical axis AX.

A porous member 464 is disposed in the recovery port 462. The porous member 464 is a plate-like member including plural openings or pores. The porous member 464 may be a mesh filter which is a porous member having plural small pores formed in meshes shapes.

The first space portion 481 is opened to the atmosphere. As described above, the second portion 481B includes the space between the outer surface 435B and the fifth surface 445 and the ninth surface 449. In this embodiment, the second portion 481B includes the space between the outer surface 35B and the recess portion 461 and the space between the outer surface 35B and the tenth surface 470. The space between the outer surface 35B and the tenth surface 470 is opened to the atmosphere via the third aperture 472.

The second space portion 482 is opened to the atmosphere via the second aperture 434. The second aperture 434 faces the first space portion 481 (the second portion 481B). In this embodiment, the second space portion 482 is opened to the atmosphere via the second aperture 434, the second portion 481B, and the third aperture 472. That is, the second space portion 482 is opened to the space around the immersion member 404 via the second aperture 434 different from the first aperture 433. In other words, the second space portion 482 is opened to the gas space coming in contact with the interface of the liquid LQ in the immersion space LS via the second aperture 434. Similarly, the first space portion 481 is opened to the gas space (the inner space 8) around the immersion member 404.

In this embodiment, the "atmosphere" is a gas surrounding the immersion member 404. In this embodiment, the gas surrounding the immersion member 404 is a gas in the inner space 8 formed by the chamber 5. In this embodiment, the chamber 5 fills the inner space 8 with a clean gas using the environment controller 5B. The chamber 5 adjusts the inner space 8 substantially to the atmospheric pressure using the environment controller 5B. The pressure of the inner space 8 may be set to be higher than the atmospheric pressure.

In this embodiment, the immersion member 404 includes a preventer 490 preventing at least a part of the liquid LQ flowing into the second space portion 482 from flowing into the first portion 481A from the second portion 481B.

In this embodiment, the preventer 490 includes a wall portion (protruding portion) 492 formed in the fifth surface 445. The wall portion 490 includes an opposing surface (top surface) 491 opposed to the outer surface 35B. In this embodiment, the opposing surface 491 and the outer surface 35B are substantially parallel to each other. The opposing surface 491 is opposed to the outer surface 35B with a seventh gap G7 interposed therebetween. The seventh gap G7 between the opposing surface 491 and the outer surface 35B is smaller than the fifth gap G5 between the fifth surface 445 and the outer surface 35B formed in the wall portion 492 close to the second portion 481B. The seventh gap G7 is smaller than the gap between the ninth surface 449 and the outer surface 35B formed in the wall portion 492 close to the second portion 481B.

In this embodiment, the second surface 442 is lyophobic to the liquid LQ. In the second surface 442, a contact angle of the liquid LQ is equal to or greater than 90° and may be equal to or greater than 100°. In this embodiment, the second surface 442 is formed of a film 473A which is lyophobic to the liquid LQ. The film 473A is formed of, for example, a lyophobic material containing fluorine. Examples of the lyophobic material include PFA (Tetra Fluoro Ethyleneperfluoro alkylvinyl ether copolymer), PTFE (Poly Tetra Fluoro Ethylene), PEEK (PolyEtherEtherKetone), and Teflon (registered trademark).

In this embodiment, the seventh surface 447 is also lyophobic to the liquid LQ. The seventh surface 447 is also formed of the film 473A. At least one of the second surface 442 and the seventh surface 447 may not be a surface of a lyophobic film. For example, the second member 432 may be formed of a lyophobic material.

In this embodiment, the opposing surface 491 of the wall portion 492 is lyophobic to the liquid LQ. In the opposing surface 491, the contact angle of the liquid LQ is equal to or greater than 90° and may be equal to or greater than 100°. In this embodiment, the opposing surface 491 is formed of a film 473B which is lyophobic to the liquid LQ. The film 473B may be formed of a material equal to or different from the film 473A. The opposing surface 491 may not be the surface of a lyophobic film. For example, the wall portion 492 may be formed of a lyophobic material.

The outer surface 35B opposed to the opposing surface 91 may be lyophobic to the liquid LQ. Both the opposing surface 91 and the outer surface 35B may be lyophobic to the liquid LQ.

In this embodiment, the immersion member 404 includes an gas supply port 474 disposed in at least a part of a surrounding of the first aperture 433. In this embodiment, the gas supply port 474 is disposed in the second surface 442. The gas supply port 474 supplies a gas to the surface of the object (substrate P) opposed to the second surface 442.

In this embodiment, the gas supply port 474 has an annular shape in the XY plane. The gas supply port 474 may be divided and arranged at plural positions around the optical axis AX.

In this embodiment, the immersion member 404 includes a supply port 475 supplying the liquid LQ to the optical path of the exposure light EL. The supply port 475 is disposed at a position opposed to a surface of the final optical element 22 through which the exposure light EL does not pass. In this embodiment, the supply port 475 is disposed at the position opposed to the side surface 35A of the final optical element 22. That is, the supply port 475 is disposed to face the first portion 481A of the first space portion 481. The supply port 475 may not be opposed to the side surface 35A of the final optical element 22. For example, the supply port 475 may be disposed in the first member 431 so as to face the space between the third surface 443 and the emission surface 23.

In this embodiment, the supply ports 475 are disposed on the +Y side and −Y side about the optical axis AX, respectively. The supply ports 475 may be disposed on the +X side and −X side about the optical axis AX, respectively. The number of supply ports 475 may be equal to or greater than 3.

In this embodiment, the supply port 475 supplies the liquid LQ to the first portion 481A. The liquid LQ supplied to the first portion 481A flows downward in the first portion 481A and is supplied to the optical path of the exposure light EL emitted from the emission surface 23 via the space between the emission surface 23 and the third surface 443. At least a part of the liquid LQ supplied from the supply port 475 is supplied to the first space 451 between the first surface 441 and the surface of the substrate P via the aperture 439.

The supply port 475 is connected to a liquid supply device (not shown) via a supply flow channel. At least a part of the supply flow channel is formed in the immersion member 404. The liquid supply device can supply the clean liquid LQ adjusted in temperature to the supply port 475.

The recovery port 462 is connected to a liquid recovering device 477 via a recovery flow channel. At least a part of the recovery flow channel is formed in the immersion member 404 (the second member 32). The liquid recovering device 477 includes a vacuum system (such as a valve controlling a connection state between a vacuum source and the recovery port 462) and can suct and recover the liquid LQ from the recovery port 462.

The gas supply port 474 is connected to a gas supply device 478 via a gas supply channel. At least a part of the gas supply channel is formed in the immersion member 404 (the second member 32). The gas supply device 478 can supply a clean gas adjusted in temperature and humidity to the gas supply port 474. The humidity of the gas supplied from the gas supply port 474 is preferably equal to or higher than the humidity of the gas supplied to the inner space 8 by the environment controller 5B.

The control apparatus 7 can control the liquid recovering device 477 to control a difference in pressure between at the bottom surface and at the top surface of the porous member 464 so that only the liquid LQ passes from the top surface side (the first space portion 481) of the porous member 464 to the bottom surface side (recovery flow channel). In this embodiment, the pressure of the top-surface space is opened to the atmosphere and is controlled by the chamber 5. The control apparatus 7 controls the liquid recovering device 477 so that only the liquid LQ passes from the top surface side of the porous member 464 to the bottom surface side thereof and adjusts the pressure of the bottom surface side on the basis of the pressure of the top surface side. That is, the control apparatus 7 makes a control so as to recover only the liquid LQ via the pores of the porous member 464 and so as for the gas not to pass through the pores of the porous member 464. The technique of adjusting the difference in pressure between at one side and at the other side of the porous member 464 so as to pass only the liquid LQ from one side of the porous member 464 to the other side is disclosed, for example, in the specification of U.S. Pat. No. 7,292,313.

A method of exposing the substrate P using the exposure apparatus EX having the above-mentioned configuration will be described below.

First, the control apparatus 7 moves the substrate stage 2 holding the substrate P so that the emission surface 23 and the first surface 441 opposed to the surface of the substrate P (or the top surface 426 of the substrate stage 2). The first surface 441 and the surface of the substrate P are opposed to each other with the first gap G1 interposed therebetween and the second surface 442 and the surface of the substrate P are opposed to each other with the second gap G2 interposed therebetween.

The control apparatus 7 sends out the liquid LQ from the liquid supply device in the state where the first surface 441 and the second surface 442 are opposed to the surface of the substrate P. The control apparatus 7 activates the liquid recovering device 477. The control apparatus 7 activates the gas supply device 478.

The liquid LQ sent from the liquid supply device is supplied to the first portion 481A from the supply port 475. The liquid LQ supplied to the first portion 481A flows downward in the first portion 481A and is then supplied to the optical path of the exposure light EL emitted from the emission surface 23. Accordingly, the optical path of the exposure light EL is filled with the liquid LQ.

At least a part of the liquid LQ supplied to the first portion 481A from the supply port 475 is supplied to the first space 451 via the aperture 439 and is held between the first surface 441 and the surface of the substrate P. In this embodiment, the immersion space LS is formed so that the space surrounded with the surface of the substrate P, the first surface 441, and the seventh surface 447 is almost filled with the liquid LQ. The interface LG1 of the liquid LQ (the immersion space LS) is formed between the inner edge (the bottom end of the seventh surface 447) of the second surface 442 and the surface of the substrate P.

At least a part of the liquid LQ supplied to the first space 451 from the aperture 439 flows into the second space portion 482 via the first aperture 433.

In this embodiment, the liquid LQ supplied to the first space 451 via the aperture 439 is suppressed from flowing into the second space 452 between the second surface 442 and the surface of the substrate P. That is, in this embodiment, the interface LG1 of the liquid LQ in the immersion space LS in the XY plane is suppressed from moving to the outside from the seventh surface 447, thereby suppressing the extension of the immersion space LS.

In this embodiment, the first surface 441 is opposed to the surface of the substrate P with the first gap G1 interposed therebetween and the second surface 442 disposed around the first surface 441 is opposed to the surface of the substrate P with the second gap G2 interposed therebetween. The second gap G2 is smaller than the first gap G1 and is, for example, about in the range of 0.1 to 0.3 mm. Accordingly, the interface LG1 is suppressed from moving to the outside of the first aperture 33 in the radial direction about the optical axis AX. That is, since the second gap G2 is small, the position of the interface LG1 is held between the inner edge of the second surface 442 and the surface of the substrate P due to the surface tension of the liquid LQ, as shown in FIG. 26 and the like. Accordingly, the liquid LQ in the immersion space LS is suppressed from flowing into the second space 452.

In this embodiment, since the second surface 442 is lyophobic to the liquid LQ, the liquid LQ is more effectively suppressed from flowing into the second space 452. In this embodiment, since the seventh surface 447 is disposed so as to extend upward from the inner edge of the second surface 442 and to face the optical path, the extension of the immersion space LS is suppressed. Since the seventh surface 447 is lyophobic to the liquid LQ, the extension of the immersion space LS is also suppressed.

In this embodiment, the gas supply port 474 is disposed and the gas is supplied to the surface of the substrate P on the outside of the inner edge of the second surface 442 about the optical axis. Accordingly, the extension of the immersion space LS is suppressed by the force of the gas supplied from the gas supply port 474. That is, the gas supply port 474 forms a gas seal between the surface of the substrate P and the second surface 442. Accordingly, the leakage of the liquid LQ is suppressed and thus the movement of the interface LG1 is restricted.

In this embodiment, the outer shape of the first surface 441 and the inner edge of the second surface 442 are circular and the outer shape of the immersion space LS in the XY plane is almost circular. Accordingly, the binding force acting to the center from all the sides of the interface LG1 of the immersion space LS almost uniformly acts. Accordingly, the extension of the immersion space LS is effectively suppressed.

By supplying the liquid LQ from the supply port 475 in the state where the extension of the immersion space LS is suppressed, the liquid LQ flows into the second space portion 482 opened to the atmosphere and the position of the surface of the liquid LQ in the second space portion 482 moves in the +Z direction (rises). In this embodiment, since the second aperture 434 is opened to the atmosphere, the liquid LQ in the first space 451 smoothly flows into the second space portion 482 via the first aperture 433.

When the second space portion 482 is filled with the liquid LQ, at least a part of the liquid LQ in the second space portion 482 overflows from the top end (the top end portion 448T) of the second space portion 482. The liquid LQ overflowing from the second space portion 482 is recovered by the recovery portion 460 disposed outside the top end of the second space portion 482. That is, the liquid LQ overflowing from the second space portion 482 is guided by the liquid guide portion 480 and then flows into the recess portion 461. The liquid LQ flowing into the recess portion 461 is recovered from the recovery port 462 (the porous member 464).

In this embodiment, since the difference in pressure between at the top surface side and at the bottom surface side of the porous member 464 is controlled so that only the liquid LQ passes from the top surface to the bottom surface of the porous member 464, the recovery portion 460 can recover the liquid LQ while suppressing the vibration and the vaporization heat from being generated.

In this embodiment, since the recovery portion 460 collects the liquid LQ on the substrate P recovered via the first aperture 433 and the second space portion 482 into the recess portion 461, it is possible to suppress the liquid LQ recovered via the second space portion 482 from returning to the second space portion 482. Since the liquid LQ from the second space portion 482 is collected in the recess portion 461 so that the liquid LQ recovered via the second space portion 482 does not return to the second space portion 482, the liquid LQ coming into contact with the porous member 464 is suppressed from returning to the first space 451 and the optical path of the exposure light EL via the second space portion 482.

In this embodiment, the preventer 490 having the wall portion 492 prevents the liquid LQ in the second portion 481B from flowing into the first portion 481A. Accordingly, for example, the liquid LQ coming in contact with the porous member 464 is prevented from returning to the first space 451 and the optical path of the exposure light EL via the first space portion 481 (the first portion 481A).

The leakage of the liquid LQ from the first portion 481A to the second portion 481B is suppressed by the wall portion 492. However, even when the liquid LQ leaks from the first portion 481A to the second portion 481B, the liquid LQ leaking via the seventh gap G7 from the first portion 481A can be recovered by the recovery portion 460.

A method of exposing the substrate P will be described now. As described above, the control apparatus 7 supplies the liquid LQ from the supply port 475 and holds the liquid LQ between the first surface 441 and the surface of the substrate P so as to fill the optical path of the exposure light EL with the liquid LQ, thereby forming the immersion space LS. At least a part of the liquid LQ on the substrate P flows into the second space portion 482 via the first aperture 433. The recovery portion 460 recovers the liquid LQ from the second space portion 482. The control apparatus 7 performs a liquid recovering operation using the recovery portion 460 along with a liquid supply operation using the supply port 475 and forms the immersion space LS so as to fill the optical path of the exposure light EL with the liquid LQ. The control apparatus 7 continuously supplies the gas from the gas supply port 474 to form the gas seal.

The control apparatus 7 starts the exposure of the substrate P while suppressing the liquid recovered from the second space portion 482 to the recovery portion 460 from returning to the first space 451 (the optical path of the exposure light EL) via the second space portion 482 and the first space portion 481 and restricting the extension of the immersion space LS using the second gap G2 or the like.

The control apparatus 7 controls the illumination system IL to emit the exposure light EL and illuminates the mask M with the exposure light EL. The exposure light EL from the mask M is emitted from the emission surface 23 of the projection optical system PL. The control apparatus 7 illuminates the substrate P with the exposure light EL from the emission surface 23 via the liquid LQ between the emission surface 23 and the substrate P. Accordingly, the pattern image of the mask M is projected to the substrate P and the substrate P is exposed with the exposure light EL. During the exposure of the substrate P, the liquid LQ supplied from the supply port 475 flows via the first aperture 433 and is recovered by the recovery portion 460 via the second space portion 482.

As described above, in this embodiment, since the first space portion 481 and the second space portion 482 opened to the atmosphere are provided and the liquid LQ flowing into the second space portion 482 is recovered by the recovery portion 460, it is possible to simplify the structure of the bottom surface of the immersion member 404 opposed to the surface of the substrate P. Accordingly, it is possible to suppress foreign materials from being attached to the bottom surface of the immersion member 404 coming in contact with the liquid LQ or to suppress the bottom surface from being contaminated.

For example, when the structure (shape) is complicated by disposing the recovery port recovering the liquid LQ in the bottom surface of the immersion member 404 opposed to the surface of the substrate P or disposing the porous member in the recovery port, foreign materials may be easily attached to the bottom surface. For example, when the porous member is disposed at a position opposed to the surface of the substrate P, the foreign materials (for example, the photosensitive film forming the surface of the substrate P or a part of an overcoat film) generated from the substrate P may be attached to the porous member. When the attached foreign materials are emitted to the optical path of the exposure light EL or are mixed into the liquid LQ in the immersion space LS during the exposure of the substrate P, the exposure failure such as a pattern defect caused in the substrate P may be caused. When the structure (shape) of the bottom surface is complicated, for example, when plural recess and convex portions exist, the foreign materials generated from the substrate P may be easily attached to the bottom surface.

According to this embodiment, the second space portion 482 opened to the atmosphere is provided, the liquid LQ flowing into the second space portion 482 via the first aperture 433 through which the exposure light EL passes is recovered by the recovery portion 460 disposed at the position not opposed to the surface of the substrate P, and the bottom surface of the immersion member 404 opposed to the surface of the substrate P has a simple structure. Accordingly, it is possible to suppress the foreign materials from being attached to the bottom surface of the immersion member 404. Since the structure of the bottom surface of the immersion member 404 is simple, it is possible to smoothly and reliably clean the bottom surface of the immersion member 404 even when the foreign materials are attached to the bottom surface of the immersion member 404.

In this embodiment, the recovery portion 460 is constructed so that the liquid LQ recovered from the second space portion 482 does not return to the second space portion 482. That is, the liquid LQ from the second space portion 482 is collected in the recess portion 461. Accordingly, for example, when the porous member 464 of the recovery portion 460 is contaminated, it is possible to suppress the liquid LQ coming in contact with the porous member 464 (the liquid LQ which might be contaminated) from returning (reversely flowing) to the first space 451 and the optical path of the exposure light EL via the second space portion 482. Accordingly, it is possible to prevent the generation of the exposure failure.

In this embodiment, the liquid LQ recovered from the second space portion 482 and collected in the second portion 481B does not return to the first portion 481A by the preventer 490. Accordingly, for example, when the porous member 464 of the recovery portion 460 is contaminated, it is possible to suppress the liquid LQ coming in contact with the porous member 464 (the liquid LQ which might be contaminated) from returning (reversely flowing) to the first space 451 and the optical path of the exposure light EL via the first portion 481A. Accordingly, it is possible to prevent the generation of the exposure failure.

Fifteenth Embodiment

A fifteenth embodiment of the invention will be described below. In the following description, the elements equal or equivalent to those of the above-mentioned embodiment are referenced by like reference numerals and signs, and are described in brief or are not repeatedly described.

Figure 27:
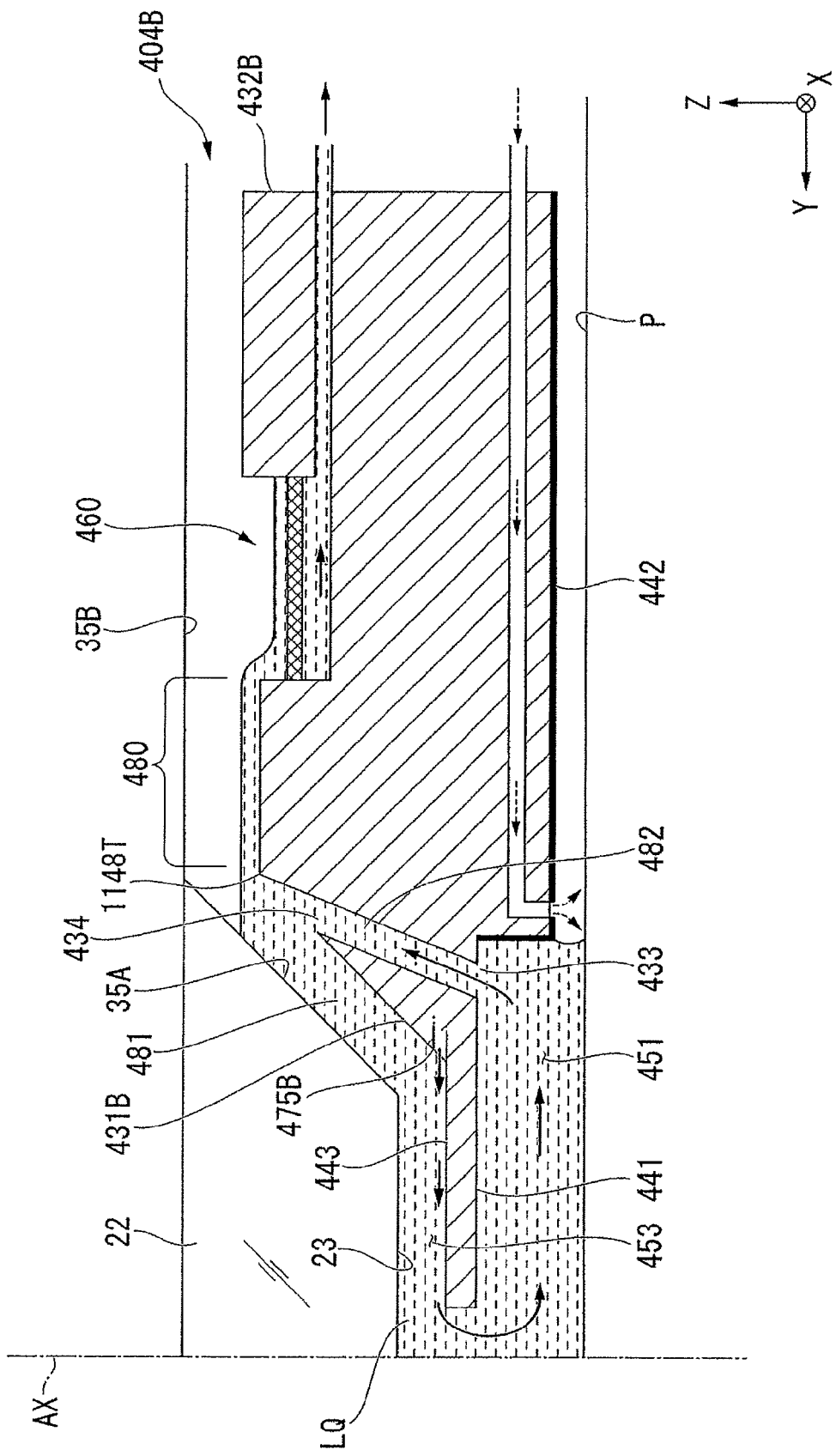
FIG. 27 is a diagram illustrating the vicinity of an immersion member according to a fifteenth embodiment of the invention.

FIG. 27 is a diagram illustrating an example of an immersion member 404B according to the fifteenth embodiment of the invention. In FIG. 27, the immersion member 404B includes a first member 431B having the first surface 441 and a second member 432B having the second surface 442.

The immersion member 404B according to this embodiment is a modified example of the immersion member 404 according to the fourteenth embodiment. Accordingly, the explanation described in the fourteenth embodiment is not repeated. As shown in FIG. 27, the fifteenth embodiment is different from the fourteenth embodiment, in that the second aperture 434 is disposed to face the side surface 35A and the supply port 475B supplying the liquid LQ faces to the third space 453 between the emission surface 23 and the third surface 443.

In this embodiment, the liquid LQ overflowing from the second space portion 482 (the top end portion 1148T) is recovered by the recovery portion 460 via the liquid guide portion 480. In this embodiment, it is possible to for the immersion space LS reliably.

In the above-mentioned embodiments, the porous member 464 is disposed in the recovery port 462 of the recovery portion 460 so as to pass only the liquid LQ from one side to the other side of the porous member 464, but the recovery port 462 may recover the liquid LQ along with the gas. The porous member 464 may not be disposed in the recovery port 462.

In the above-mentioned embodiments, the gas supply port 474 may not be provided.

In the above-mentioned embodiments, when the movement of the interface LG of the liquid LQ can be suppressed by the use of the gas from the gas supply port 474, the second surface 442 may not be disposed lower than the first surface 441.

In the above-mentioned embodiments, the first member 431 having the first surface 441 and the second member 432 having the second surface 442 may be relatively movable in the direction parallel to the optical axis AX and/or perpendicular to the optical axis AX. That is, at least one of the first member 431 and the second member 432 may be movably supported. For example, the position of the second member 432 may be made to move with the driving force of the actuator. The second gap G2 can be adjusted by shifting the position of the second member in the Z direction.

In the above-mentioned embodiments, the first surface 441, the second surface 442, and the second space portion 482 may be formed in a single member.

In the above-mentioned embodiments, the preventer 490 may have a gas seal mechanism. For example, by supplying the gas to the outer surface 35B from the gas supply port disposed in the fifth surface 445 to form a gas seal between the fifth surface 445 and the outer surface 35B, it is possible to prevent the liquid LQ from flowing into the first portion 481A from the second portion 481B. The gas supply port of the prevent 490 may be disposed in the opposing surface 491 or in the outer surface 35B. As the preventer 490, a liquid supply port supplying the liquid LQ to the second portion 481B which the second aperture 434 faces may be provided to prevent the liquid LQ from flowing into the first portion 481A to the second portion 481B. On the other hand, the preventer 490 and the like (such as the wall portion 492) may not be provided. In this case, it is preferable that the fifth surface 445 be disposed higher than the ninth surface 449 (in the +Z direction), but the fifth surface 445 and the ninth surface 449 have substantially the same height (are substantially flush with each other).

In the above-mentioned embodiments, the first surface 441 may not be disposed between the emission surface 23 and the substrate P. In this case, the first surface 441 may be flush with the emission surface 23, or may be disposed higher than the emission surface 23.

In the above-mentioned embodiments, the surface of the final optical element 22 through which the exposure light EL does not pass may not include the surface (side surface 35) extending upward (in the +Z direction) from the edge of the emission surface 23. For example, the surface of the final optical element 22 through which the exposure light EL does not pass may extend in a direction substantially parallel to the emission surface 23 (in a direction perpendicular to the optical axis AX). That is, the side surface 35 of the projection optical system PL may be substantially flush with the emission surface.

The side surface 35 of the projection optical system PL through which the exposure light EL does not pass may have the same height as (may be flush with) the emission surface 23 in at least a part of the surrounding of the emission surface 23. That is, the side surface 35 may not extend upward from the edge of the emission surface 23 but may extend in the radial direction about the optical axis AX. The side surface 35 may be substantially parallel to the optical axis AX. That is, the side surface 35 may not extend in the radial direction about the optical axis AX, but may extend upward from the edge of the emission surface 23.

In the above-mentioned embodiments, the side surface 35A defining the first portion 481A may be a part of the holding member 21. The outer surface 35B defining the second portion 481B may be a part of the final optical element 22.

In the above-mentioned embodiments, a suction port may be disposed in the second surface 442. For example, the suction port may not be used during the exposure of the substrate P but the suction port may be used only when all the liquid LQ is recovered from the space below the first surface 441.

In the above-mentioned embodiments, a supply port supplying the liquid LQ may be disposed in the first space 451 which the first surface 441 faces. In this case, the supply port supplying the liquid LQ may be disposed in the first surface 441.

In the above-mentioned embodiments, for example, a temperature adjusting mechanism disclosed in the specification US Patent Application Laid-Open Publication No. 2008/0106707 may be disposed in the immersion members 4, 304, and 404. For example, by causing a temperature adjusting liquid to flow to the flow channel formed in the immersion member, it is possible to adjust the temperature of the immersion member.

In the above-mentioned embodiments, the emission-side (top-side) optical path of the final optical element 22 of the projection optical system PL is filled with the liquid LQ, but for example, as described in PCT Publication No. 2004/019128, a projection optical system in which the incidence-side (object-side) optical path of the final optical element 22 is filled with the liquid LQ.

In the above-mentioned embodiments, the liquid LQ is water, but may be a liquid other than the water. For example, hydrofluoro ethyl (HFE), perfluoro polyether (PFPE), or Fomblin oil may be used as the liquid LQ. Various fluids such as a supercritical fluid may be used as the liquid LQ.

In the above-mentioned embodiments, a glass substrate for a display device, a ceramic wafer for a thin-film magnetic head, or an original plate (synthetic quartz, silicon wafer) of a mask or a reticle used in an exposure apparatus in addition to a semiconductor wafer used to manufacture a semiconductor device can be used as the substrate P.

A step-and-repeat type projection exposure apparatus (stepper) in which patterns of a mask M are exposed at a time in a state where the mask M and the substrate P are stopped and the substrate P is sequentially moved step by step can be employed as the exposure apparatus EX, in addition to the step-and-scan type scanning exposure apparatus (scanning stepper) in which the patterns of the mask M are scanned and exposed in synchronization of the mask M and the substrate P with each other.

In the step-and-repeat type exposure, the reduced image of a first pattern may be transferred onto the substrate P by one shot using the projection optical system in a state where the first pattern and the substrate P are substantially stopped, and the reduced image of a second pattern may then be exposed onto the substrate P by one shot using the projection optical system to partially overlap with the first pattern in a state where the second pattern and the substrate P are substantially stopped (stitch type one-shot exposure). A step-and-stitch type exposure apparatus in which at least two patterns are transferred to the substrate P to partially overlap with each other and the substrate P is sequentially moved can be employed as the stitch type exposure apparatus.

For example, the invention can be applied to an exposure apparatus in which the patterns of two masks are combined on a substrate using a projection optical system and one shot region on the substrate is double-exposed at the same time by one scanning exposure operation, as disclosed in the specification of U.S. Pat. No. 6,611,316. The invention may be applied to a proximity-type exposure apparatus or a mirror-projection aligner.

The invention may be applied to a twin-stage type exposure apparatus having plural substrate stages as disclosed in the specifications of U.S. Pat. Nos. 6,341,007, 6,208,407, and 6,262,796.

The invention may be applied to an exposure apparatus including a substrate stage holding a substrate and a measurement stage on which a substrate to be exposed is not held and which is provided with a reference member having a reference mark and/or various photoelectric sensors, for example, as disclosed in the specification of U.S. Pat. No. 6,897,963 and the specification of US Patent Application Laid-Open Publication No. 2007/0127006. The invention may be applied to an exposure apparatus having plural substrate stages and a measurement stage.

The type of the exposure apparatus EX is not limited to the exposure apparatus used to manufacture a semiconductor device in which the substrate P is exposed with a pattern of the semiconductor device, but exposure apparatuses for manufacturing a liquid crystal display device or a display device, a thin-film magnetic head, an imaging device (CCD), a micro machine, an MEMS, a DNA chip, or a reticle or mask may be employed.

In the above-mentioned embodiments, the ArF excimer laser is used as a light source generating an ArF excimer laser beam as the exposure light EL, but a harmonic generator including a solid laser source such as a DFB semiconductor laser or a fiber laser, a light amplifier having a fiber amplifier, and a wavelength converter and outputting a pulse beam with a wavelength of 193 nm may be used, for example, as disclosed in the specification of U.S. Pat. No. 7,023,610. In the above-mentioned embodiments, the illumination region and the projection region are rectangular, but may have other shapes such as an arc shape.

In the above-mentioned embodiments, a light-transmitting mask in which a predetermined light-shielding pattern (or a phase pattern or a photosensitive pattern) is formed on a light-transmitting substrate is used, but a variable shaped mask (also referred to as an electronic mask, an active mask, or an image generator) in which a transmissive pattern or a reflective pattern or a light-emitting pattern is formed on the basis of electronic data of the pattern to be exposed may be used instead of the above-mentioned mask, for example, as disclosed in the specification of U.S. Pat. No. 6,778,257. The variable shaped mask includes a DMD (Digital Micromirror Device) which a type of non-emission image display device (spatial light modulator). Instead of the variable shaped mask including the non-emission image display device, a pattern forming device including a self-emission image display device may be used. Examples of the self-emission image display device include a CRT (Cathode Ray Tube), an inorganic EL display, an organic EL display (OLED: Organic Light Emitting Diode), an LED display, an LD display, a field emission display (FED), and a plasma display panel (PDP).

In the above-mentioned embodiments, the exposure apparatus including the projection optical system PL is exemplified, but the invention may be applied to an exposure apparatus and an exposure method not employing the projection optical system PL. When the projection optical system PL is not used, the exposure light is applied to a substrate through an optical member such as a lens and an immersion space is formed in a predetermined space between the optical member and the substrate.

For example, as disclosed in the specification of PCT Publication No. 2001/035168, the invention can be applied to an exposure apparatus (lithography system) exposing a substrate P with a line-and-space pattern by forming an interference fringe on the substrate P.

As described above, the exposure apparatuses EX according to the embodiments are manufactured by combining various sub systems including the elements described in the appended claims so as to maintain predetermined mechanical precision, electrical precision, and optical precision. To guarantee such a variety of precision, the adjustment for accomplishing the optical precision is carried out on various optical systems, the adjustment for accomplishing the mechanical precision is carried out on various mechanical systems, and the adjustment for accomplishing the electrical precision is carried out on various electrical systems, before or after the combination. The combination of various sub systems into the exposure apparatus includes the mechanical connection of various sub systems, the wiring connection of various electrical circuits, and piping connections of various pressure pipes. Before the combination of various sub systems into the exposure apparatus, individual combinations of the sub systems should be carried out, of course. When the combination of various sub systems into the exposure apparatus is finished, the general adjustment is carried out to guarantee a variety of precision of the exposure apparatus as a whole. It is preferable that the exposure apparatus be manufactured in a clean room of which the temperature and the cleanness are managed.

Figure 28:
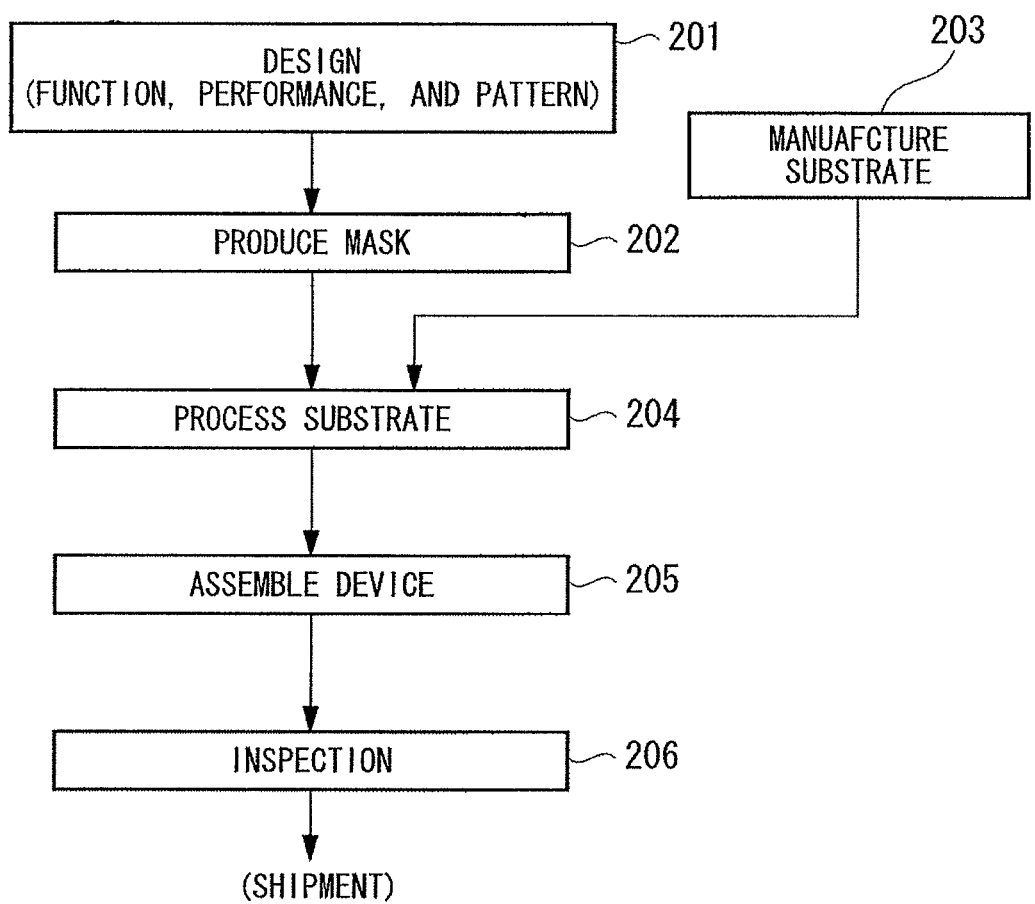
FIG. 28 is a flowchart illustrating an example of a process of manufacturing a micro device.

A micro device such as a semiconductor device is manufactured, as shown in FIG. 28, by a step 201 of designing functions and performance of the micro device, a step 202 of producing a mask (reticle) based on the step of design, a step 203 of manufacturing a substrate which is a base member of the device, a substrate processing step 204 including exposing the substrate with the exposure light using the pattern of the mask according to the above-mentioned embodiments and developing the exposed substrate, a device assembling step (including processing processes such as a dicing process, a bonding process, and a package process) 205, and an inspection step 206.

The requirements of the above-mentioned embodiments can be suitably combined. Some elements may not be employed. All the publications and US patents on the exposure apparatuses cited in the above-mentioned embodiments and modified examples are cited herein by reference.

What is claimed is:

1. An exposure apparatus that exposes a substrate, comprising:
    an optical system that includes an emission surface from which an exposure light is emitted;
    a first immersion member having a first liquid supply port, an opening through which the exposure light passes, and a first surface that is disposed in a surrounding of the opening, the opening being configured to allow liquid to pass therethrough;
    a second immersion member having a second liquid supply port and a second surface that is disposed in at least a part of a surrounding of the first surface, the second immersion member being movable relative to the first immersion member; and
    a first recovery portion that recovers at least a part of liquid in a space between the first immersion member and the second immersion member, the first recovery portion being disposed above a lower end of the space, the liquid in the space including liquid flowed from the lower end of the space,
    wherein the emission surface, the first surface, and the second surface are opposed to the surface of the substrate in at least a part of the exposure of the substrate, and
    the substrate is exposed with the exposure light from the emission surface via the liquid between the emission surface and the surface of the substrate.

2. The exposure apparatus according to claim 1, wherein the first recovery portion recovers the liquid overflowing from the space.

3. The exposure apparatus according to claim 1, wherein the first recovery portion includes a first recess portion.

4. The exposure apparatus according to claim 3, wherein the first recovery portion includes a recovery port that recovers the liquid flowing into the first recess portion.

5. The exposure apparatus according to claim 3, wherein the second immersion member includes the first recess portion.

6. The exposure apparatus according to claim 1, wherein the first surface and the second surface are non-liquid recovery surfaces, respectively.

7. The exposure apparatus according to claim 1, wherein the second surface is lyophobic to the liquid.

8. The exposure apparatus according to claim 1, further comprising a movable stage on which the substrate is held, wherein the space between the first and second immersion members is configured to receive the liquid from the surface of the substrate, an upper surface of the substrate stage, or both of the surface of the substrate and the upper surface of the substrate stage.

9. The exposure apparatus according to claim 1, wherein the second immersion member has a gas supply port.

10. The exposure apparatus according to claim 9, further comprising a movable stage on which the substrate is held, wherein the gas supply port supplies a gas to a gap between the second immersion member and the substrate, or between the second immersion member and the substrate stage, or between the second immersion member and both of the substrate and the substrate stage.

11. The exposure apparatus according to claim 10, wherein the gas supply port is disposed in the second surface.

12. The exposure apparatus according to claim 10, further comprising a suction port that is disposed outside the gas supply port in the radial direction about the optical axis of the optical system.

13. The exposure apparatus according to claim 12, wherein the second immersion member has the suction port.

14. The exposure apparatus according to claim 1, further comprising a movable stage on which the substrate is held, wherein the second immersion member has a suction port configured to oppose the surface of the substrate, an upper surface of the substrate stage, or both of the surface of the substrate and the upper surface of the substrate stage.

15. The exposure apparatus according to claim 14, wherein the suction port removes the liquid from the surface of the substrate, the upper surface of the substrate stage, or both of the surface of the substrate and the upper surface of the substrate stage.

16. The exposure apparatus according to claim 1, wherein the first liquid supply port supplies the liquid to an optical path.

17. The exposure apparatus according to claim 1, wherein the optical system includes an optical member that has the emission surface, and
    wherein the first liquid supply port is disposed at a position opposed to a surface of the optical member through which the exposure light does not pass.

18. The exposure apparatus according to claim 17, wherein the surface of the optical member through which the exposure light does not pass includes a side surface of the optical member extending to the upside from the edge of the emission surface.

19. The exposure apparatus according to claim 1, further comprising a movable stage on which the substrate is held, wherein the second liquid supply port supplies liquid to a gap between the second immersion member and the substrate, or between the second immersion member and the substrate stage, or between the second immersion member and both of the substrate and the substrate stage.

20. The exposure apparatus according to claim 19, wherein the second liquid supply port faces toward the optical path.

21. The exposure apparatus according to claim 1, wherein the optical system includes an optical member that has the emission surface, and
    wherein the exposure apparatus further comprises a second recovery portion that recovers liquid from a gap between the optical member and the first immersion member.

22. A device manufacturing method comprising:
    exposing a substrate using the exposure apparatus according to claim 1; and
    developing the exposed substrate.

23. An exposure method comprising:
    providing a first immersion member having a first liquid supply port, an opening through which an exposure light emitted from an emission surface of an optical system passes, and a first surface that is disposed in a surrounding of the opening, the opening being configured to allow liquid to pass therethrough, the first surface being opposing to a substrate with a first gap;
    opposing a second surface of a second immersion member disposed in at least a part of a surrounding of the first surface to the substrate with a second gap that is different from the first gap, the second immersion member being movable relative to the first immersion member and having a second liquid supply port;

recovering at least a part of the liquid in a space between the first immersion member and the second immersion member from a first recovery portion, the first recovery portion being disposed above a lower end of the space, the liquid in the space including liquid flowed from the lower end of the space; and exposing the substrate with the exposure light from the emission surface via the liquid between the emission surface and the substrate.

24. The exposure method according to claim 23, further comprising recovering, from the first recovery portion, the liquid overflowing from the space.

25. The exposure method according to claim 23, wherein the first recovery portion includes a first recess portion.

26. The exposure method according to claim 25, wherein the first recovery portion includes a recovery port that recovers the liquid flowing into the first recess portion.

27. The exposure method according to claim 25, wherein the second immersion member includes the first recess portion.

28. The exposure method according to claim 23, wherein the first surface and the second surface are non-liquid recovery surfaces, respectively.

29. The exposure method according to claim 23, wherein the second surface is lyophobic to the liquid.

30. The exposure method according to claim 23, further comprising:
providing a movable stage on which the substrate is held, and
receiving, from the space between the first and second immersion members, the liquid from the surface of the substrate, an upper surface of the substrate stage, or both of the surface of the substrate and the upper surface of the substrate stage.

31. The exposure method according to claim 23, wherein the second immersion member has a gas supply port.

32. The exposure method according to claim 31, further comprising:
providing a movable stage on which the substrate is held, and
supplying, from the gas supply port, a gas to a gap between the second immersion member and the substrate, or between the second immersion member and the substrate stage, or between the second immersion member and both of the substrate and the substrate stage.

33. The exposure method according to claim 32, wherein the gas supply port is disposed in the second surface.

34. The exposure method according to claim 32, further comprising providing a suction port that is disposed outside the gas supply port in the radial direction about the optical axis of the optical system.

35. The exposure method according to claim 34, wherein the suction port is provided to the second immersion member.

36. The exposure method according to claim 23, further comprising:
providing a movable stage on which the substrate is held, and
opposing a suction port of the second immersion member to the surface of the substrate, an upper surface of the substrate stage, or both of the surface of the substrate and the upper surface of the substrate stage.

37. The exposure method according to claim 36, further comprising removing, from the suction port, the liquid from the surface of the substrate, the upper surface of the substrate stage, or both of the surface of the substrate and the upper surface of the substrate stage.

38. The exposure method according to claim 23, further comprising supplying, from the first liquid supply port, the liquid to the optical path.

39. The exposure method according to claim 23, wherein the optical system includes an optical member that has the emission surface, and
wherein the first liquid supply port is disposed at a position opposed to a surface of the optical member through which the exposure light does not pass.

40. The exposure method according to claim 39, wherein the surface of the optical member through which the exposure light does not pass includes a side surface of the optical member extending to the upside from the edge of the emission surface.

41. The exposure method according to claim 23, further comprising:
providing a movable stage on which the substrate is held, and
supplying, from the second liquid supply port, the liquid to a gap between the second immersion member and the substrate, or between the second immersion member and the substrate stage, or between the second immersion member and both of the substrate and the substrate stage.

42. The exposure method according to claim 41, wherein the second liquid supply port faces toward the optical path.

43. The exposure method to claim 23, wherein the optical system includes an optical member that has the emission surface, and
further comprising recovering, from a second recovery portion, the liquid from a gap between the optical member and the first immersion member.

* * * * *